US012740476B2

(12) United States Patent
Suthram et al.

(10) Patent No.: US 12,740,476 B2
(45) **Date of Patent: *Sep. 15, 2026**

(54) PACKAGE ARCHITECTURE WITH VERTICAL STACKING OF INTEGRATED CIRCUIT DIES HAVING PLANARIZED EDGES AND MULTI-SIDE ROUTING

(71) Applicant: Intel Corporation, Santa Clara, CA (US)

(72) Inventors: Sagar Suthram, Portland, OR (US); Ravindranath Vithal Mahajan, Chandler, AZ (US); Debendra Mallik, Chandler, AZ (US); Omkar G. Karhade, Chandler, AZ (US); Wilfred Gomes, Portland, OR (US); Pushkar Sharad Ranade, San Jose, CA (US); Abhishek A. Sharma, Hillsboro, OR (US); Tahir Ghani, Portland, OR (US); Anand S. Murthy, Portland, OR (US); Nitin A. Deshpande, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 120 days.

This patent is subject to a terminal disclaimer.

(21) Appl. No.: 17/846,109

(22) Filed: Jun. 22, 2022

(65) Prior Publication Data

US 2023/0420436 A1 Dec. 28, 2023

(51) Int. Cl.

| | |
|---|---|
| ***H10W 90/00*** | (2026.01) |
| ***H10W 20/20*** | (2026.01) |
| ***H10W 20/42*** | (2026.01) |

(52) U.S. Cl.

CPC .......... *H10W 90/00* (2026.01); *H10W 20/20* (2026.01); *H10W 20/42* (2026.01); *H10W 90/792* (2026.01)

(58) Field of Classification Search

CPC ... H01L 25/18; H01L 23/481; H01L 23/5226; H01L 24/08; H01L 25/50;

(Continued)

(56) References Cited

U.S. PATENT DOCUMENTS

| | | | |
|---|---|---|---|
| 11,569,198 | B2 | 1/2023 | Burton et al. |
| 11,929,348 | B2 | 3/2024 | Chang |

(Continued)

FOREIGN PATENT DOCUMENTS

| | | | |
|---|---|---|---|
| CN | 110867387 | A | 3/2020 |

*Primary Examiner* — Thanh Y. Tran

(74) *Attorney, Agent, or Firm* — Akona IP PC

(57) ABSTRACT

Embodiments of an integrated circuit (IC) die comprise: a first region having a first surface; a second region attached to the first region along a first planar interface that is orthogonal to the first surface; and a third region attached to the second region along a second planar interface that is parallel to the first planar interface, the third region having a second surface, the second surface being coplanar with the first surface. The first region and the third region comprise a plurality of layers of conductive traces in a dielectric material, the conductive traces being orthogonal to the first and second surfaces; and bond-pads on the first and second surfaces, the bond-pads comprising portions of the respective conductive traces exposed on the first and second surfaces.

19 Claims, 20 Drawing Sheets

(58) Field of Classification Search
CPC . H01L 2224/08145; H01L 2225/06527; H01L 2225/06548; H01L 2225/06551; H01L 2225/06572; H01L 24/06; H01L 24/09; H01L 25/0655; H01L 25/0657; H10W 90/00; H10W 20/20; H10W 20/42; H10W 90/792; H10W 20/0245; H10W 20/212; H10W 80/00; H10W 72/823; H10W 72/834; H10W 90/22; H10W 72/90
See application file for complete search history.

(56) References Cited

U.S. PATENT DOCUMENTS

| | | | | |
|---|---|---|---|---|
| 12,015,010 | B2 | 6/2024 | Chang et al. | |
| 12,027,512 | B2 | 7/2024 | Gu et al. | |
| 12,033,959 | B2 | 7/2024 | Chang | |
| 12,068,262 | B2 | 8/2024 | Chang et al. | |
| 12,237,303 | B2 | 2/2025 | Chang | |
| 12,266,634 | B2 | 4/2025 | Chang | |
| 12,347,792 | B2 | 7/2025 | Chang | |
| 2009/0045444 | A1 | 2/2009 | Huebner | |
| 2011/0155435 | A1 | 6/2011 | Mohammed et al. | |
| 2013/0341803 | A1 | 12/2013 | Cheah et al. | |
| 2017/0018530 | A1 | 1/2017 | Cheah et al. | |
| 2019/0088636 | A1 | 3/2019 | Gamini | |
| 2019/0259702 | A1 | 8/2019 | Jain | |
| 2020/0219843 | A1 | 7/2020 | Burton et al. | |
| 2021/0225813 | A1 | 7/2021 | Chen et al. | |
| 2022/0320047 | A1 | 10/2022 | Chang et al. | |
| 2022/0352092 | A1 | 11/2022 | Chang | |
| 2022/0359461 | A1 | 11/2022 | Chang | |
| 2022/0406751 | A1 | 12/2022 | Elsherbini et al. | |
| 2023/0420409 | A1* | 12/2023 | Suthram | H01L 23/481 |
| 2023/0420410 | A1 | 12/2023 | Suthram et al. | |
| 2023/0420411 | A1 | 12/2023 | Suthram et al. | |
| 2023/0420432 | A1 | 12/2023 | Suthram et al. | |
| 2023/0420436 | A1 | 12/2023 | Suthram et al. | |
| 2024/0014172 | A1 | 1/2024 | Chang | |
| 2024/0047380 | A1 | 2/2024 | Chang | |
| 2024/0194644 | A1 | 6/2024 | Chang | |
| 2025/0323180 | A1 | 10/2025 | Chang | |

* cited by examiner 1460
1464
1440
1442
1440
1442
1440
1442
1440
1442
1462
1452
1404
1402

1470
124
1464
124
124
124
124
124
124

PACKAGE ARCHITECTURE WITH VERTICAL STACKING OF INTEGRATED CIRCUIT DIES HAVING PLANARIZED EDGES AND MULTI-SIDE ROUTING

TECHNICAL FIELD

The present disclosure relates to techniques, methods, and apparatus directed to a package architecture with vertical stacking of integrated circuit dies having planarized edges and multi-side routing.

BACKGROUND

Electronic circuits when commonly fabricated on a wafer of semiconductor material, such as silicon, are called integrated circuits (ICs). The wafer with such ICs is typically cut into numerous individual dies. The dies may be packaged into an IC package containing one or more dies along with other electronic components such as resistors, capacitors, and inductors. The IC package may be integrated onto an electronic system, such as a consumer electronic system, or servers, such as mainframes.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figure 1A:
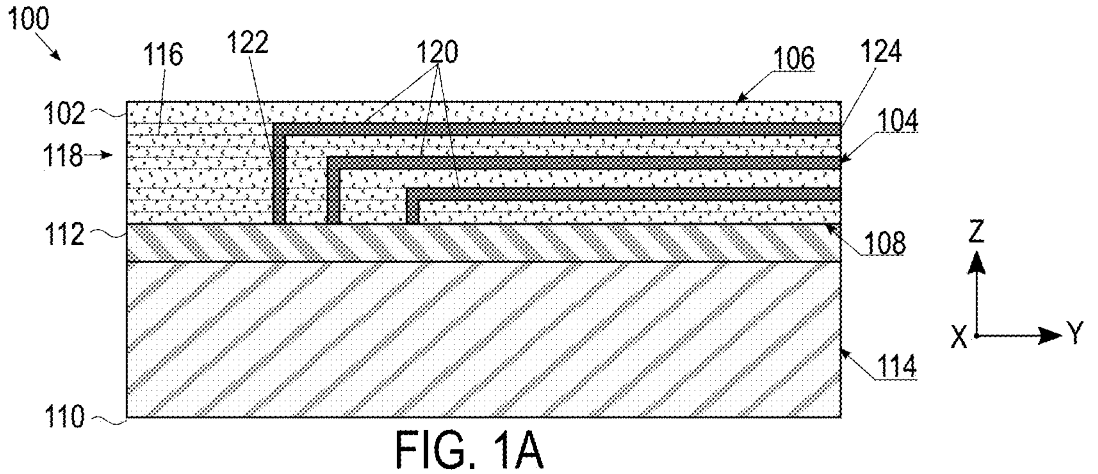
FIG. 1A is a schematic cross-sectional view of an example IC die according to some embodiments of the present disclosure.

For purposes of illustrating IC packages described herein, it is important to understand phenomena that may come into play during assembly and packaging of ICs. The following foundational information may be viewed as a basis from which the present disclosure may be properly explained. Such information is offered for purposes of explanation only and, accordingly, should not be construed in any way to limit the broad scope of the present disclosure and its potential applications.

The trend in the computer industry is to utilize multiple processors in large servers, the multiple processors being coupled together in a single package, such as a Multi-Chip Module (MCM). The multiple processors along with other IC dies containing memory circuits (e.g., cache memory circuits, high-bandwidth memory circuits, etc.) are interconnected by high-speed data buses in the package substrate of the MCM, for example, to enable the totality of processors to operate together. However, current technology in such MCMs is inherently limited in its ability to scale to the bandwidth/distance requirements of next generation servers that could have signal speeds greater than 10 GHz and/or data speeds of 3-10 Terabytes per second. The limitations are primarily associated with bandwidth reduction, signal delay, signal loss, and signal distortion due to various reasons, one of which is the configuration in which the multiple processors are coupled together inside the package.

Current packaging architecture, whether 2D, 2.5D or 3D, utilizes multiple IC dies that are oriented parallel to each other and interconnected by various kinds of interconnects, such as copper microbumps, solder balls, etc. In a general sense, any typical IC die consists of a substrate, an active region in the substrate comprising transistors and other active circuitry, and a metallization stack over the substrate, sharing a contact area with the active region. The metallization stack is the region of the IC die in which the individual devices (e.g., transistors, capacitors, resistors, etc.) are interconnected with conductive traces and conductive vias. Common metals used for the conductive traces and conductive vias are copper and aluminum. The metallization stack typically includes contact pads, insulating layers (e.g., interlayer dielectric (ILD) materials such as silicon oxide), conductive layers comprising the conductive traces, and bonding sites for chip-to-chip or chip-to-package connections. Modern IC dies may include more than 10 conductive layers in the metallization stack.

Conventionally, various such IC dies may be stacked within a package in various ways: (1) back-to-back, in which the substrate of one IC die is in direct contact with the substrate of another IC die; (2) back-to-front, in which the substrate of one IC die is in direct contact with the metallization stack of the other IC die; and (3) front-to-front, in which the metallization stacks of the two IC dies are in direct contact. In all these configurations, the IC dies are mutually parallel to each other, with the active circuitry disposed in planes parallel to the contacting areas of adjacent IC dies. Such architecture suffers from certain inherent limitations. For example, compute IC dies comprising high-performance compute circuitry that generates a lot of heat have to be placed on the top of any such stack so that heat can be dissipated properly. Such placement limits the number of high-power compute IC dies that can be placed in a package having a limited (or constrained) footprint.

Accordingly, embodiments of a microelectronic assembly disclosed herein comprise a first IC die coupled to a second IC die by interconnects on a first surface of the first IC die and a second surface of the second IC die such that the first surface is in contact with the second surface, and the first IC die comprises a substrate attached to a metallization stack along a planar interface that is orthogonal to the first surface. The interconnects comprise oxide-oxide bonds and metal-metal bonds, the metal-metal bonds including first bond-pads in the first IC die and second bond-pads in the second IC die. The metallization stack of the first IC die comprises a plurality of layers of conductive traces in a dielectric material, and the first bond-pads comprise portions of the conductive traces exposed on the first surface.

Embodiments described herein disclose an IC die comprising: a first region having a first surface and a second surface, the first surface being orthogonal to the second surface; and a second region attached to the first region along a planar interface that is orthogonal to the first surface and parallel to the second surface, the second region having a third surface coplanar with the first surface. The first region comprises: a dielectric material; layers of conductive traces in the dielectric material, each layer of the conductive traces being parallel to the second surface such that the conductive traces are orthogonal to the first surface; conductive vias through the dielectric material; and bond-pads on the first surface, the bond-pads comprising portions of the conductive traces exposed on the first surface, and the second region comprises a material different from the dielectric material.

Each of the structures, assemblies, packages, methods, devices, and systems of the present disclosure may have several innovative aspects, no single one of which is solely responsible for all the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art.

The terms "circuit" and "circuitry" mean one or more passive and/or active electrical and/or electronic components that are arranged to cooperate with one another to provide a desired function. The terms also refer to analog circuitry, digital circuitry, hard wired circuitry, programmable circuitry, microcontroller circuitry and/or any other type of physical hardware electrical and/or electronic component.

The term "integrated circuit" means a circuit that is integrated into a monolithic semiconductor or analogous material.

In some embodiments, the IC dies disclosed herein may comprise substantially monocrystalline semiconductors, such as silicon or germanium, as a base material (e.g., substrate, body) on which integrated circuits are fabricated with traditional semiconductor processing methods. The semiconductor base material may include, for example, N-type or P-type materials. Dies may include, for example, a crystalline base material formed using a bulk silicon (or other bulk semiconductor material) or a silicon-on-insulator (SOI) structure. In some other embodiments, the base material of one or more of the IC dies may comprise alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-N, group III-V, group II-VI, or group IV materials. In yet other embodiments, the base material may comprise compound semiconductors, for example, with a first sub-lattice of at least one element from group III of the periodic table (e.g., Al, Ga, In), and a second sub-lattice of at least one element of group V of the periodic table (e.g., P, As, Sb). In yet other embodiments, the base material may comprise an intrinsic IV or III-V semiconductor material or alloy, not intentionally doped with any electrically active impurity; in alternate embodiments, nominal impurity dopant levels may be present. In still other embodiments, dies may comprise a non-crystalline material, such as polymers; for example, the base material may comprise silica-filled epoxy. In other embodiments, the base material may comprise high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the base material may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphide, and black phosphorus, each of which may possibly be doped with one or more of gallium, indium, aluminum, fluorine, boron, phosphorus, arsenic, nitrogen, tantalum, tungsten, and magnesium, etc. Although a few examples of the material for dies are described here, any material or structure that may serve as a foundation (e.g., base material) upon which IC circuits and structures as described herein may be built falls within the spirit and scope of the present disclosure.

Unless described otherwise, IC dies described herein include one or more IC structures (or, simply, "ICs") implementing (i.e., configured to perform) certain functionality. In one such example, the term "memory die" may be used to describe a die that includes one or more ICs implementing memory circuitry (e.g., ICs implementing one or more of memory devices, memory arrays, control logic configured to control the memory devices and arrays, etc.). In another such example, the term "compute die" may be used to describe a die that includes one or more ICs implementing logic/compute circuitry (e.g., ICs implementing one or more of I/O functions, arithmetic operations, pipelining of data, etc.).

In another example, the terms "package" and "IC package" are synonymous, as are the terms "die" and "IC die." Note that the terms "chip," "die," and "IC die" are used interchangeably herein.

The term "insulating" means "electrically insulating," the term "conducting" means "electrically conducting," unless otherwise specified. With reference to optical signals and/or devices, components and elements that operate on or using optical signals, the term "conducting" can also mean "optically conducting."

The terms "oxide," "carbide," "nitride," etc. refer to compounds containing, respectively, oxygen, carbon, nitrogen, etc.

The term "high-k dielectric" refers to a material having a higher dielectric constant than silicon oxide, while the term "low-k dielectric" refers to a material having a lower dielectric constant than silicon oxide.

The term "insulating material" or "insulator" (also called herein as "dielectric material" or "dielectric") refers to solid materials (and/or liquid materials that solidify after processing as described herein) that are substantially electrically nonconducting. They may include, as examples and not as limitations, organic polymers and plastics, and inorganic materials such as ionic crystals, porcelain, glass, silicon, silicon oxide, silicon carbide, silicon carbonitride, silicon nitride, and alumina or a combination thereof. They may include dielectric materials, high polarizability materials, and/or piezoelectric materials. They may be transparent or opaque without departing from the scope of the present disclosure. Further examples of insulating materials are underfills and molds or mold-like materials used in packaging applications, including for example, materials used in organic interposers, package supports and other such components.

In various embodiments, elements associated with an IC may include, for example, transistors, diodes, power sources, resistors, capacitors, inductors, sensors, transceivers, receivers, antennas, etc. In various embodiments, elements associated with an IC may include those that are monolithically integrated within an IC, mounted on an IC, or those connected to an IC. The ICs described herein may be either analog or digital and may be used in a number of applications, such as microprocessors, optoelectronics, logic blocks, audio amplifiers, etc., depending on the components associated with the IC. The ICs described herein may be employed in a single IC die or as part of a chipset for executing one or more related functions in a computer.

In various embodiments of the present disclosure, transistors described herein may be field-effect transistors (FETs), e.g., MOSFETs. In many embodiments, an FET is a four-terminal device. In silicon-on-insulator, or nanoribbon, or gate all-around (GAA) FET, the FET is a three-terminal device that includes source, drain, and gate terminals and uses electric field to control current flowing through the device. A FET typically includes a channel material, a source region and a drain regions provided in and/or over the channel material, and a gate stack that includes a gate electrode material, alternatively referred to as a "work function" material, provided over a portion of the channel material (the "channel portion") between the source and the drain regions, and optionally, also includes a gate dielectric material between the gate electrode material and the channel material.

In a general sense, an "interconnect" refers to any element that provides a physical connection between two other elements. For example, an electrical interconnect provides electrical connectivity between two electrical components, facilitating communication of electrical signals between them; an optical interconnect provides optical connectivity between two optical components, facilitating communication of optical signals between them. As used herein, both electrical interconnects and optical interconnects are comprised in the term "interconnect." The nature of the interconnect being described is to be understood herein with reference to the signal medium associated therewith. Thus, when used with reference to an electronic device, such as an IC that operates using electrical signals, the term "interconnect" describes any element formed of an electrically conductive material for providing electrical connectivity to one or more elements associated with the IC or/and between various such elements. In such cases, the term "interconnect" may refer to both conductive traces (also sometimes referred to as "lines," "wires," "metal lines" or "trenches") and conductive vias (also sometimes referred to as "vias" or "metal vias"). Sometimes, electrically conductive traces and vias may be referred to as "conductive traces" and "conductive vias", respectively, to highlight the fact that these elements include electrically conductive materials such as metals. Likewise, when used with reference to a device that operates on optical signals as well, such as a photonic IC (PIC), "interconnect" may also describe any element formed of a material that is optically conductive for providing optical connectivity to one or more elements associated with the PCI. In such cases, the term "interconnect" may refer to optical waveguides, including optical fiber, optical splitters, optical combiners, optical couplers, and optical vias.

The term "waveguide" refers to any structure that acts to guide the propagation of light from one location to another location typically through a substrate material such as silicon or glass. In various examples, waveguides can be formed from silicon, doped silicon, silicon nitride, glasses such as silica (e.g., silicon dioxide or $SiO_2$), borosilicate (e.g., 70-80 wt % $SiO_2$, 7-13 wt % of $B_2O_3$, 4-8 wt % $Na_2O$ or $K_2$ O, and 2-8 wt % of $Al_2O_3$) and so forth. Waveguides may be formed using various techniques including but not limited to forming waveguides in situ. For example, in some embodiments, waveguides may be formed in situ in glass using low temperature glass-to-glass bonding or by laser direct writing. Waveguides formed in situ may have lower loss characteristics.

The term "conductive trace" may be used to describe an electrically conductive element isolated by an insulating material. Within IC dies, such insulating material comprises interlayer low-k dielectric that is provided within the IC die. Within package substrates, and printed circuit boards (PCBs) such insulating material comprises organic materials such as Ajinomoto Buildup Film (ABF), polyimides, or epoxy resin. Such conductive lines are typically arranged in several levels, or several layers, of metallization stacks.

The term "conductive via" may be used to describe an electrically conductive element that interconnects two or more conductive lines of different levels of a metallization stack. To that end, a via may be provided substantially perpendicularly to the plane of an IC die/chip or a support structure over which an IC structure is provided and may interconnect two conductive lines in adjacent levels or two conductive lines in non-adjacent levels.

The term "package substrate" may be used to describe any substrate material that facilitates the packaging together of any collection of semiconductor dies and/or other electrical components such as passive electrical components. As used herein, a package substrate may be formed of any material including, but not limited to, insulating materials such as resin impregnated glass fibers (e.g., PCB or Printed Wiring Boards (PWB)), glass, ceramic, silicon, silicon carbide, etc. In addition, as used herein, a package substrate may refer to a substrate that includes buildup layers (e.g., ABF layers).

The term "metallization stack" may be used to refer to a stack of one or more interconnects for providing connectivity to different circuit components of an IC die/chip and/or a package substrate.

As used herein, the term "pitch" of interconnects refers to a center-to-center distance between adjacent interconnects.

In context of a stack of dies coupled to one another or in context of a die coupled to a package substrate, the term "interconnect" may also refer to, respectively, die-to-die (DTD) interconnects and die-to-package substrate (DTPS) interconnects. DTD interconnects may also be referred to as first-level interconnects (FLI). DTPS interconnects may also be referred to as Second-Level Interconnects (SLI).

Although not specifically shown in all of the present illustrations in order to not clutter the drawings, when DTD or DTPS interconnects are described, a surface of a first die may include a first set of conductive contacts, and a surface of a second die or a package substrate may include a second set of conductive contacts. One or more conductive contacts of the first set may then be electrically and mechanically coupled to some of the conductive contacts of the second set by the DTD or DTPS interconnects.

In some embodiments, the pitch of the DTD interconnects may be different from the pitch of the DTPS interconnects, although, in other embodiments, these pitches may be substantially the same.

The DTPS interconnects disclosed herein may take any suitable form. In some embodiments, a set of DTPS interconnects may include solder (e.g., solder bumps or balls that are subject to a thermal reflow to form the DTPS interconnects). DTPS interconnects that include solder may include any appropriate solder material, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, a set of DTPS interconnects may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression.

The DTD interconnects disclosed herein may take any suitable form. In some embodiments, some or all of the DTD interconnects in a microelectronic assembly or an IC package as described herein may be metal-to-metal interconnects (e.g., copper-to-copper interconnects, or plated interconnects). In such embodiments, the conductive contacts on either side of the DTD interconnect may be bonded together (e.g., under elevated pressure and/or temperature) without the use of intervening solder or an anisotropic conductive material. In some metal-to-metal interconnects, a dielectric material (e.g., silicon oxide, silicon nitride, silicon carbide) may be present between the metals bonded together (e.g., between copper pads or posts that provide the associated conductive contacts). In some embodiments, one side of a DTD interconnect may include a metal pillar (e.g., a copper pillar), and the other side of the DTD interconnect may include a metal contact (e.g., a copper contact) recessed in a dielectric. In some embodiments, a metal-to-metal interconnect (e.g., a copper-to-copper interconnect) may include a noble metal (e.g., gold) or a metal whose oxides are conductive (e.g., silver). In some embodiments, a metal-to-metal interconnect may include metal nanostructures (e.g., nanorods) that may have a reduced melting point. Metal-to-metal interconnects may be capable of reliably conducting a higher current than other types of interconnects; for example, some solder interconnects may form brittle intermetallic compounds when current flows, and the maximum current provided through such interconnects may be constrained to mitigate mechanical failure.

In some embodiments, the dies on either side of a set of DTD interconnects may be bare (e.g., unpackaged) dies.

In some embodiments, the DTD interconnects may include solder. For example, the DTD interconnects may include conductive bumps or pillars (e.g., copper bumps or pillars) attached to the respective conductive contacts by solder. In some embodiments, a thin cap of solder may be used in a metal-to-metal interconnect to accommodate planarity, and this solder may become an intermetallic compound during processing. In some embodiments, the solder used in some or all of the DTD interconnects may have a higher melting point than the solder included in some or all of the DTPS interconnects. For example, when the DTD interconnects in an IC package are formed before the DTPS interconnects are formed, solder-based DTD interconnects may use a higher-temperature solder (e.g., with a melting point above 200 degrees Celsius), while the DTPS interconnects may use a lower-temperature solder (e.g., with a melting point below 200 degrees Celsius). In some embodiments, a higher-temperature solder may include tin; tin and gold; or tin, silver, and copper (e.g., 96.5% tin, 3% silver, and 0.5% copper). In some embodiments, a lower-temperature solder may include tin and bismuth (e.g., eutectic tin bismuth), tin, silver, bismuth, indium, indium and tin, or gallium.

In some embodiments, a set of DTD interconnects may include an anisotropic conductive material, such as any of the materials discussed above for the DTPS interconnects. In some embodiments, the DTD interconnects may be used as data transfer lanes, while the DTPS interconnects may be used for power and ground lines, among others.

In microelectronic assemblies or IC packages as described herein, some or all of the DTD interconnects may have a finer pitch than the DTPS interconnects. In some embodiments, the DTPS interconnects disclosed herein may have a pitch between about 80 microns and 300 microns, while the DTD interconnects disclosed herein may have a pitch between about 0.5 microns and 100 microns, depending on the type of the DTD interconnects. An example of silicon-level interconnect density is provided by the density of some DTD interconnects. In some embodiments, the DTD interconnects may have too fine a pitch to couple to the package substrate directly (e.g., too fine to serve as DTPS interconnects). The DTD interconnects may have a smaller pitch than the DTPS interconnects due to the greater similarity of materials in the different dies on either side of a set of DTD interconnects than between a die and a package substrate on either side of a set of DTPS interconnects. In particular, the differences in the material composition of dies and package substrates may result in differential expansion and contraction of the die dies and package substrates due to heat generated during operation (as well as the heat applied during various manufacturing operations). To mitigate damage caused by this differential expansion and contraction (e.g., cracking, solder bridging, etc.), the DTPS interconnects in any of the microelectronic assemblies or IC packages as described herein may be formed larger and farther apart than DTD interconnects, which may experience less thermal stress due to the greater material similarity of the pair of dies on either side of the DTD interconnects.

It will be recognized that one more levels of underfill (e.g., organic polymer material such as benzotriazole, imidazole, polyimide, or epoxy) may be provided in an IC package described herein and may not be labeled in order to avoid cluttering the drawings. In various embodiments, the levels of underfill may comprise the same or different insulating materials. In some embodiments, the levels of underfill may comprise thermoset epoxies with silicon oxide particles; in some embodiments, the levels of underfill may comprise any suitable material that can perform underfill functions such as supporting the dies and reducing thermal stress on interconnects. In some embodiments, the choice of underfill material may be based on design considerations, such as form factor, size, stress, operating conditions, etc.; in other embodiments, the choice of underfill material may be based on material properties and processing conditions, such as cure temperature, glass transition temperature, viscosity and chemical resistance, among other factors; in some embodiments, the choice of underfill material may be based on both design and processing considerations.

In some embodiments, one or more levels of solder resist (e.g., epoxy liquid, liquid photoimageable polymers, dry film photoimageable polymers, acrylics, solvents) may be provided in an IC package described herein and may not be labeled or shown to avoid cluttering the drawings. Solder resist may be a liquid or dry film material including photoimageable polymers. In some embodiments, solder resist may be non-photoimageable.

The terms "substantially," "close," "approximately," "near," and "about," generally refer to being within +/−20% of a target value (e.g., within +/−5% or 10% of a target value) based on the context of a particular value as described herein or as known in the art.

Terms indicating orientation of various elements, e.g., "coplanar," "perpendicular," "orthogonal," "parallel," or any other angle between the elements, generally refer to being within +/−5%-20% of a target value based on the context of a particular value as described herein or as known in the art.

The term "connected" means a direct connection (which may be one or more of a mechanical, electrical, and/or thermal connection) between the things that are connected, without any intermediary devices, while the term "coupled" means either a direct connection between the things that are connected, or an indirect connection through one or more passive or active intermediary devices.

The description uses the phrases "in an embodiment" or "in embodiments," which may each refer to one or more of the same or different embodiments.

Furthermore, the terms "comprising," "including," "having," and the like, as used with respect to embodiments of the present disclosure, are synonymous.

The disclosure may use perspective-based descriptions such as "above," "below," "top," "bottom," and "side"; such descriptions are used to facilitate the discussion and are not intended to restrict the application of disclosed embodiments.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

The term "dispose" as used herein refers to position, location, placement, and/or arrangement rather than to any particular method of formation.

The term "between," when used with reference to measurement ranges, is inclusive of the ends of the measurement ranges.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). When used herein, the notation "A/B/C" means (A), (B), and/or (C).

Although certain elements may be referred to in the singular herein, such elements may include multiple sub-elements. For example, "an electrically conductive material" may include one or more electrically conductive materials. In another example, "a dielectric material" may include one or more dielectric materials.

Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

The accompanying drawings are not necessarily drawn to scale.

In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated. Further, the singular and plural forms of the labels may be used with reference numerals to denote a single one and multiple ones respectively of the same or analogous type, species, or class of element.

Furthermore, in the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using, e.g., images of suitable characterization tools such as scanning electron microscopy (SEM) images, transmission electron microscope (TEM) images, or non-contact profilometer. In such images of real structures, possible processing and/or surface defects could also be visible, e.g., surface roughness, curvature or profile deviation, pit or scratches, not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication and/or packaging.

Note that in the figures, various components (e.g., interconnects) are shown as aligned (e.g., at respective interfaces) merely for ease of illustration; in actuality, some or all of them may be misaligned. In addition, there may be other components, such as bond-pads, landing pads, metallization, etc. present in the assembly that are not shown in the figures to prevent cluttering. Further, the figures are intended to show relative arrangements of the components within their assemblies, and, in general, such assemblies may include other components that are not illustrated (e.g., various interfacial layers or various other components related to optical functionality, electrical connectivity, or thermal mitigation). For example, in some further embodiments, the assembly as shown in the figures may include more dies along with other electrical components. Additionally, although some components of the assemblies are illustrated in the figures as being planar rectangles or formed of rectangular solids, this is simply for ease of illustration, and embodiments of these assemblies may be curved, rounded, or otherwise irregularly shaped as dictated by and sometimes inevitable due to the manufacturing processes used to fabricate various components.

In the drawings, a particular number and arrangement of structures and components are presented for illustrative purposes and any desired number or arrangement of such structures and components may be present in various embodiments.

Further, unless otherwise specified, the structures shown in the figures may take any suitable form or shape according to material properties, fabrication processes, and operating conditions.

Figure 10A:
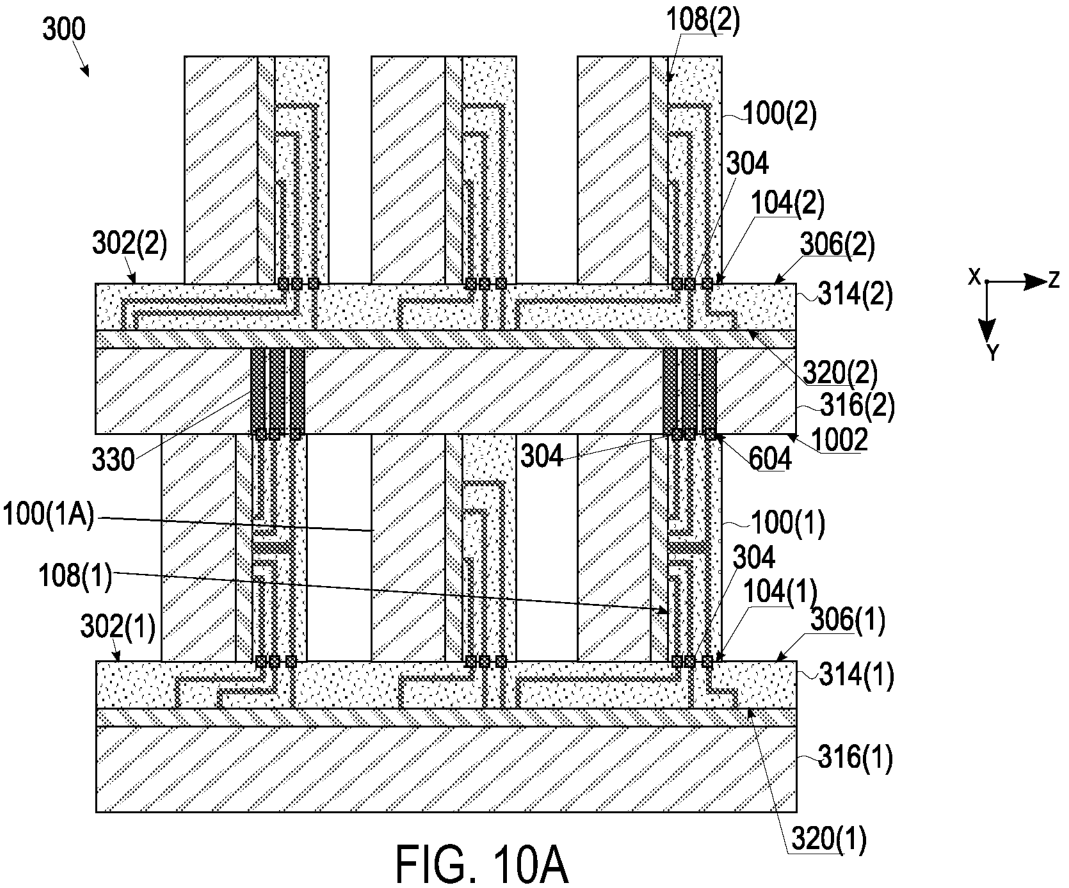
FIG. 10A is a schematic cross-sectional view of yet another example microelectronic assembly according to some embodiments of the present disclosure.
Figure 10B:
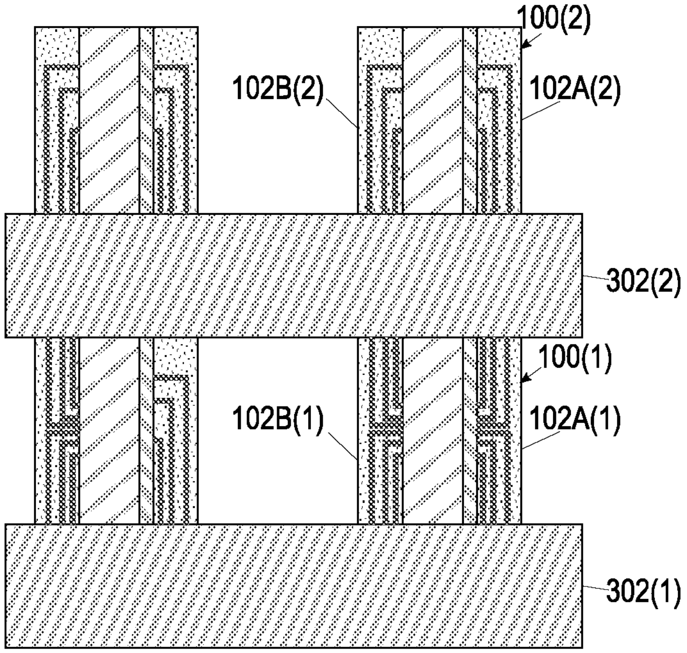
FIG. 10B is a schematic cross-sectional view of the example microelectronic assembly of FIG. 10A according to some other embodiments of the present disclosure.

For convenience, if a collection of drawings designated with different letters are present (e.g., FIGS. 10A-10C), such a collection may be referred to herein without the letters (e.g., as "FIG. 10"). Similarly, if a collection of reference numerals designated with different letters are present (e.g., 112*a*-112*e*), such a collection may be referred to herein without the letters (e.g., as "112").

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

EXAMPLE EMBODIMENTS

FIG. 1 is a schematic cross-sectional view of an example IC die 100 (plural "IC dies 100") according to some embodiments of the present disclosure. IC die 100 comprises, in the embodiment shown, a metallization stack 102 having a surface 104 orthogonal to another surface 106. In various embodiments, surfaces 104 and 106, as also their respective edges are planarized. In a typical IC die that is different from IC die 100, at least in that it does not have planarized edges along the thickness, the vertical surfaces corresponding to surface 104 would be rough, having undergone a dicing operation when the IC die is singulated from a wafer. In contrast, surface 104 of IC die 100 may be flat and planar with surface roughness less than 10 Angstroms and total thickness variation (TTV) across surface 104 of less than 3 micrometers.

Metallization stack 102 may be attached along a planar interface 108 to a substrate 110 having an active region 112. Planar interface 108 may be orthogonal to surface 104 and parallel to surface 106. In some embodiments, active region 112 including transistors, diodes, and other active circuitry may be proximate to planar interface 108. In some other embodiments, active region 112 may be absent, or alternatively, transistors, diodes, and other active circuitry may be absent in active region 112. Substrate 110 may have yet another surface 114 coplanar with surface 104. In some embodiments, substrate 110 comprises a semiconductor material as listed in the previous subsection. In other embodiments, substrate 110 may comprise glass, ceramic, or other materials that may be suitable for creating functional elements of an IC.

In various embodiments, metallization stack 102 comprises a dielectric material 116, a plurality of layers 118 of conductive traces 120 in dielectric material 116, each layer 118 of conductive traces 120 being parallel to surface 106 such that conductive traces 120 are orthogonal to surface 104. In some embodiments, dielectric material 116 may comprise silicon oxide; in other embodiments, dielectric material 116 may comprise any suitable dielectric material used as interlayer dielectrics (ILD) in a typical semiconductor IC die and as described in the previous subsection. Conductive traces 120 may comprise copper in many embodiments. In some embodiments, there may be between 2 and 6 layers of conductive traces 120 in plurality of layers 118. In various embodiments, thickness of each layer 118 may vary between 3 micrometers and 5 micrometers. Conductive vias 122 through dielectric material 116 may conductively connect conductive traces 120 in various layers 118 and to active circuitry in active region 112. Conductive vias 122 are orthogonal to conductive traces 120. Conductive traces 120 may extend up to surface 104 such that portions of conductive traces 120 are exposed on surface 104; such exposed portions may form bond-pads 124. In various embodiments, there may be several layers 118 of conductive traces 120 between planar interface 108 and surface 106, among which 2 to 6 layers closest to surface 106 may have conductive traces 120 that are exposed on surface 104 as bond-pads 124.

In various embodiments, IC die 100 may be less than 100 micrometers along a first axis through the thickness of IC die 100, less than 35 millimeters along a second axis orthogonal to the first axis, for example, along a length of IC die 100, and less than 5 millimeters along a third axis orthogonal to the first axis and the second axis, for example, along a width of IC die 100. In other words, in various embodiments, IC die 100 may be approximately 5 times longer than it is wide.

Figure 1B:
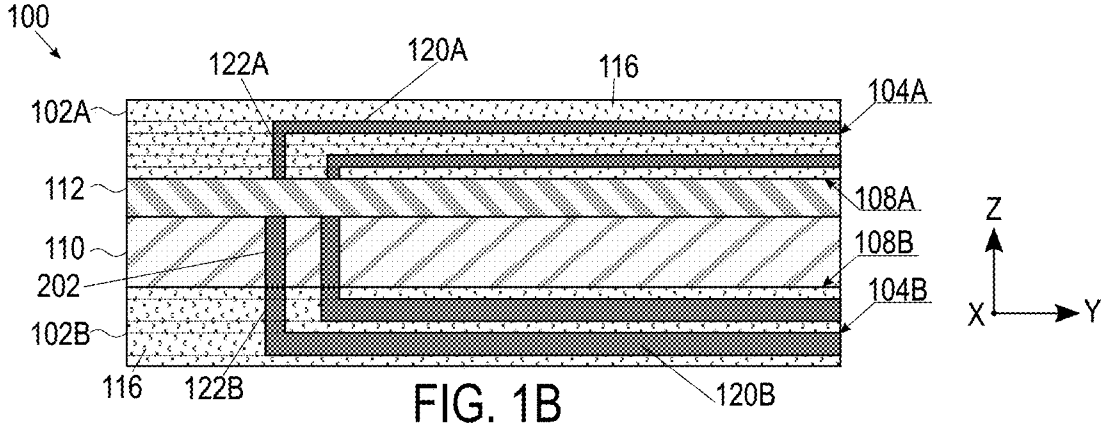
FIG. 1B is a schematic cross-sectional view of the example IC die of FIG. 1A according to some other embodiments of the present disclosure.

FIG. 1B is a schematic cross-sectional view of the example microelectronic assembly of FIG. 1A according to some other embodiments of the present disclosure. In some embodiments, IC die 100 may comprise metallization stacks 102A and 102B on either side of substrate 110. Metallization stack 102A may share planar interface 108A with substrate 110, and metallization stack 102B may share planar interface 108B with substrate 110. In some embodiments (as shown), active region 112 may be proximate to planar interface 108A; in other embodiments active region 112 may be proximate to planar interface 108B. Conductive traces 120A and conductive vias 122A may be in metallization stack 102A. Conductive traces 120B and conductive vias 122B may be in metallization stack 102B. In some embodiments, conductive traces 120A may be configured to route signals, whereas conductive traces 120B may be configured to route power and ground to active region 112. In such embodiments, conductive traces 120B may be thicker than conductive traces 120A (i.e., conductive traces 120A may be thinner than conductive traces 120B). In other embodiments, conductive traces 120A and conductive traces 120B may be configured to route signals, power, and ground without any differentiation between them. In such embodiments, conductive traces 120A and 120B may be of similar thickness. TSVs 202 through substrate 110 may enable conductive pathways between conductive traces 120A and 120B and/or active region 112 and conductive traces 120B.

Figure 2:
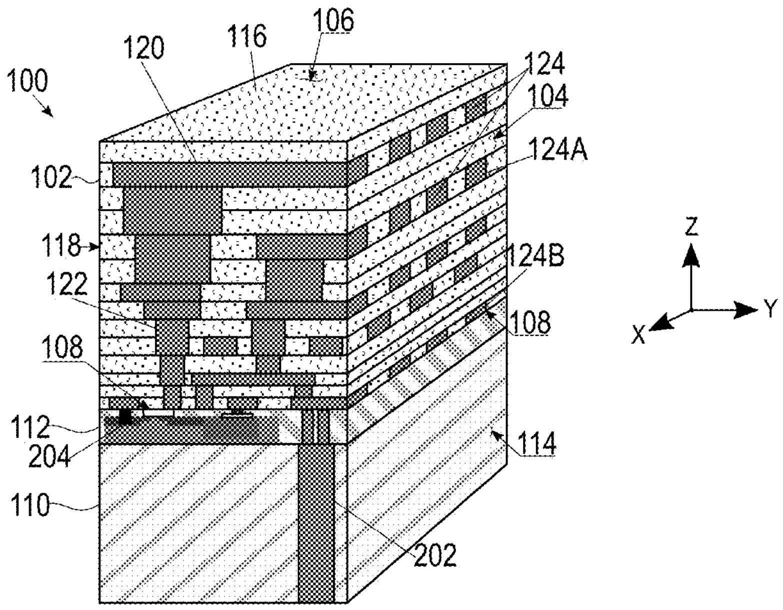
FIG. 2 is a schematic cut-section perspective view of a portion of the example IC die of FIG. 1.

FIG. 2 is a simplified perspective view of a portion of IC die 100. Substrate 110 may include one or more through-substrate vias (TSV) 202. Active circuitry 204 may be in active region 112 proximate to planar interface 108 between metallization stack 102 and substrate 110. Each layer 118 may have a different thickness than other layers. In some embodiments, thickness of layers 118 increase with distance from planar interface 108 toward surface 106. Thus, conductive traces 120 in such layers 118 may have different thickness, and correspondingly, bond-pads 124 may also have different sizes depending on which layers they are in. For example, bond-pad 124A, being closer to surface 106, may be larger (e.g., thicker, wider, longer) than bond-pad 124B, which is closer to planar interface 108. In some embodiments, bond-pads 124 may extend through 2 to 6 layers closest to surface 106. In some embodiments, a linear dimension (e.g., length, width, or diagonal) of the largest bond-pad 124 may be less than 5 micrometers. In some embodiments, bond-pads 124 may be spaced apart with a pitch of less than 9 micrometers.

Figure 3A:
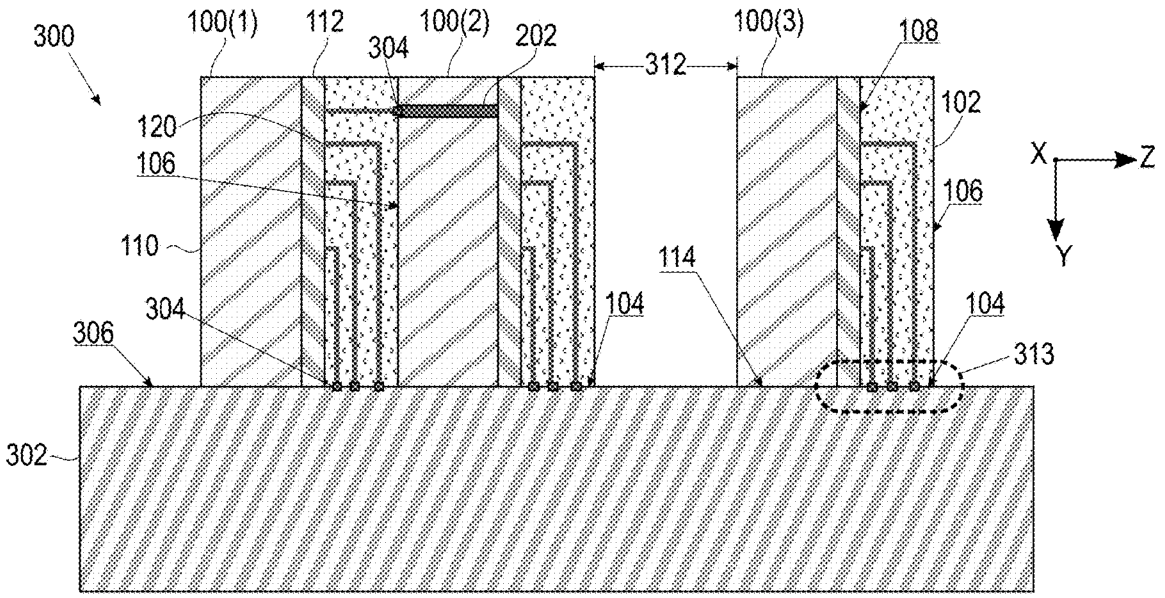
FIG. 3A is a schematic cross-sectional view of an example microelectronic assembly according to some embodiments of the present disclosure.

FIGS. 3A-3E show simplified schematic cross-sections of various configurations of a microelectronic assembly 300 according embodiments of the present disclosure. FIG. 3A shows microelectronic assembly 300 comprising a plurality of IC dies 100, for example, 100(1), 100(2) and 100(3) coupled to another IC die 302 by interconnects 304 such that surface 104 of any one of IC dies 100 is in direct contact with a surface 306 of IC die 302. As described in relation to FIGS. 1-2, surface 104 is orthogonal to planar interface 108 between active region 112 and metallization stack 102 of any one of IC dies 100. In some embodiments, IC dies 100 may comprise active circuitry (e.g., transistors, diodes) in active region 112. In other embodiments, one or more IC dies 100 may not comprise active circuitry in active region 112; in such embodiments, active region 112 may be merged with substrate 110 (e.g., absent).

In various embodiments, IC die 302 may comprise an interposer with conductive traces to enable conductive coupling of IC die 100 with other IC dies and/or package substrates, and IC die 302 may not have any active circuitry therein. In other embodiments, IC die 302 may comprise active circuitry. In many embodiments, IC dies 100 may be conductively coupled by conductive pathways in IC die 302. For example, IC die 302 may comprise a network on chip, interconnecting compute circuitry of IC dies 100 together. In various embodiments, IC die 100 may be conductively coupled to IC die 302 by interconnects 304, which may comprise hybrid bonds. In such configuration, surface 114 of substrate 110 of IC dies 100 may be in direct contact with surface 306 of IC die 302.

Figure 3B:
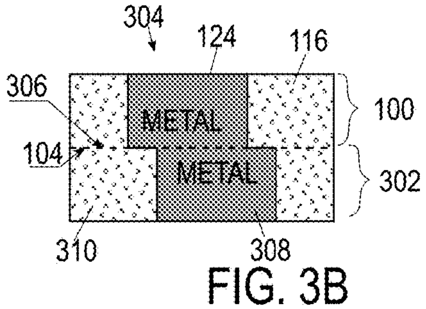
FIG. 3B is a schematic cross-sectional view of a portion of the example microelectronic assembly of FIG. 3A.

FIG. 3B is a schematic cross-sectional view of a detail of a particular one of interconnects 304 in microelectronic assembly 300. Note that although only interconnect 304 is shown, the same structure and description may apply to any other such interconnects comprising hybrid bonds in microelectronic assembly 300. In a general sense, interconnect 304 may comprise, at an interface between surfaces 104 and 306 between IC die 100 and 302 respectively, metal-metal bonds between bond-pads 124 of IC die 100 and bond-pads 308 of IC die 302, and dielectric-dielectric bonds (e.g., oxide-oxide bonds) in dielectric materials 116 and 310 of IC dies 100 and 302 respectively. Bond-pads 124 belonging to IC die 100 may bond with bond-pads 308 of IC die 302. As noted in the description of FIGS. 1-2, bond-pads 124 may comprise portion of conductive traces 120 exposed on surface 104; bond-pads 308 may comprise conventional conductive structures electroplated on surface 306. Dielectric material 116 (e.g., silicon oxide, silicon nitride, silicon oxynitride, etc.) in IC die 100 may bond with a dielectric material 310 in IC die 302. In some embodiments, dielectric material 310 of IC die 302 is the same as dielectric material 116 of IC die 100. In various embodiments, dielectric material 310 comprises silicon oxide, silicon nitride, silicon carbonitride, and other such inorganic materials commonly used to fabricate semiconductor IC dies. The bonded metal and dielectric materials form interconnect 304, comprising hybrid bonds, providing electrical and mechanical coupling between IC die 100 and IC die 302. In various embodiments, interconnects 304 may have a linear dimension of less than 5 micrometers and a pitch of less than 10 micrometers between adjacent interconnects.

Turning back to FIG. 3A, IC dies 100 may be coupled to IC die 302 such that metallization stack 102 of one of IC dies 100, for example, 100(1), may be in direct contact with substrate 110 of adjacent IC die 100, for example, 100(2). In some such embodiments, IC dies 100(1) and 100(2) may be bonded to each other, at least by oxide-oxide bonds. In some embodiments, interconnects 304, comprising metal-metal bonds and oxide-oxide bonds as described in reference to FIG. 3B, may be present at the planar contact interface between IC dies 100(1) and 100(2) in contact. In some such embodiments, conductive contact between active region 112 of IC die 100(1) and 100(2) may be achieved through conductive traces 120 in IC die 100(1), interconnects 304 between planar interface between IC dies 100(1) and 100(2), and TSVs 202 in IC die 100(2); in such embodiments, TSVs 202 are in conductive contact with interconnects 304 between IC dies 100(1) and 100(2). In other embodiments (not shown), metallization stack 102 of IC dies 100(1) and 100(2) may be in contact in a front-to-front configuration. In yet other embodiments (not shown), substrate 110 of IC dies 100(1) and 100(2) may be in contact in a back-to-back configuration.

In various embodiments, IC dies 100 may be arranged in mutually parallel rows such that a gap 312 exists between adjacent IC dies 100. Gap 312 may be uniform across microelectronic assembly 300 in some embodiments and may range approximately in the order of a few millimeters (e.g., less than 5 millimeters); in other embodiments, gap 312 may be non-uniform, with some IC dies 100 being closer to other than other IC dies 100. In some such embodiments, IC dies 100 may comprise circuitry that consumes electrical power and generate heat during operation. For example, IC dies 100 may comprise compute circuitry of a microprocessor. Gap 312 may be configured for flow of a cooling fluid therethrough. The cooling fluid (not shown) may be air in some embodiments; in other embodiments, the cooling fluid may be a liquid coolant.

Figure 3C:
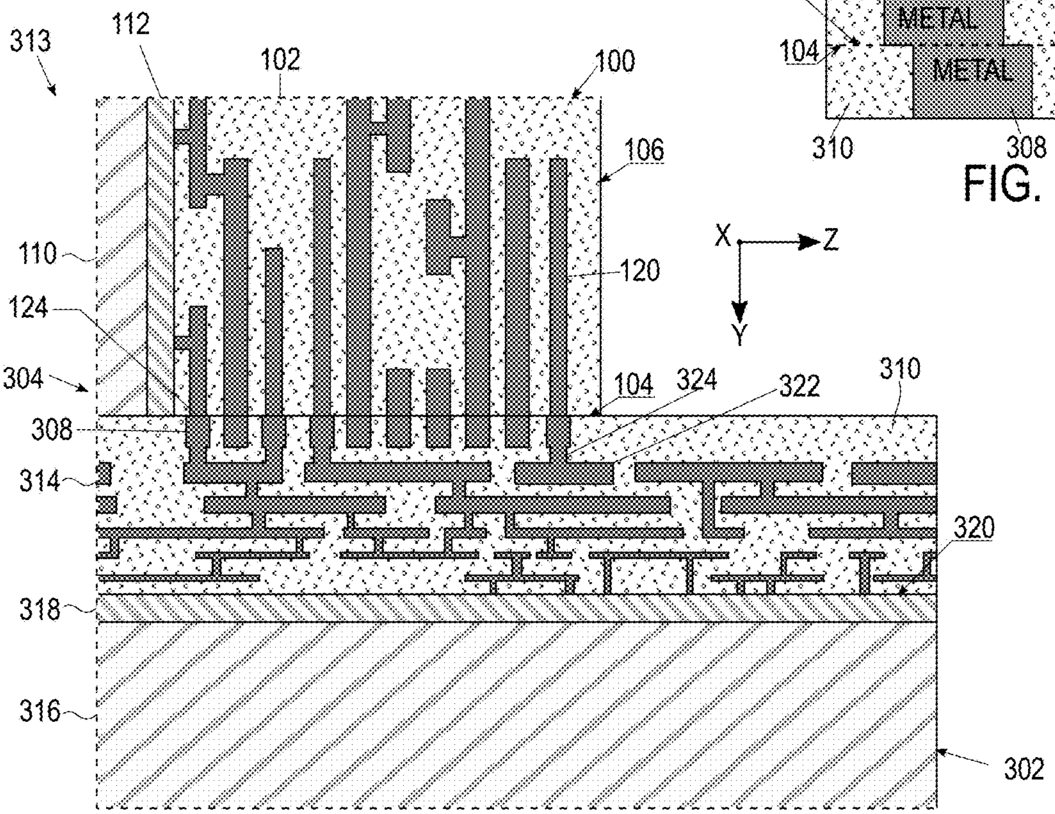
FIG. 3C is a schematic cross-sectional view of a portion of the example microelectronic assembly of FIG. 3A according to some embodiments of the present disclosure.

FIG. 3C is a schematic cross-sectional view of a portion 313 of microelectronic assembly 300 according to some embodiments of the present disclosure. IC die 302 may comprise a metallization stack 314 attached to a substrate 316 having an active region 318. Substrate 316 is attached to metallization stack 314 along another planar interface 320 that is parallel to surface 306. In some embodiments, active region 318 comprises active circuitry 204 (not shown), including transistors and diodes. Active region 318 may be proximate to planar interface 320 in such embodiments. In some embodiments, active region 318 may be absent. Metallization stack 314 comprises conductive traces 322 in dielectric material 310. Conductive traces 322 may be coupled by conductive vias 324 to bond-pads 308.

Figure 3D:
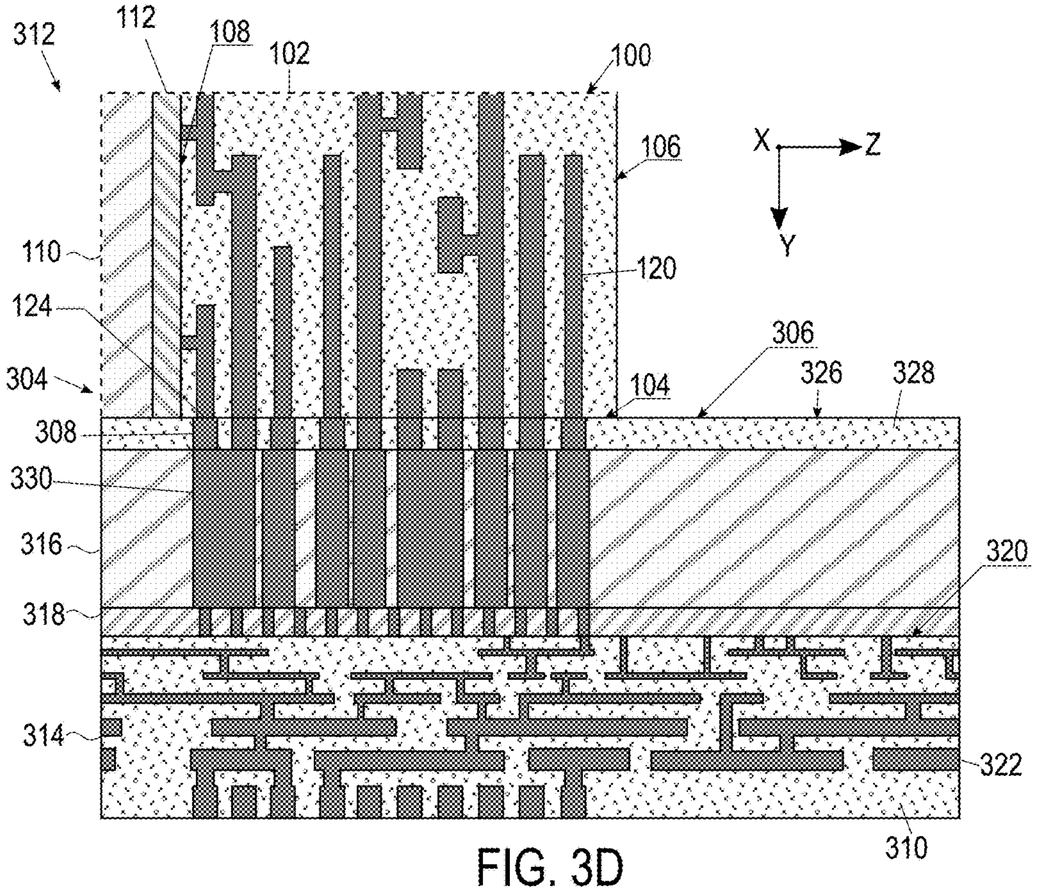
FIG. 3D is a schematic cross-sectional view of a portion of the example microelectronic assembly of FIG. 3A according to some embodiments of the present disclosure.

FIG. 3D is a schematic cross-sectional view of portion 313 of microelectronic assembly 300 of FIG. 3A according to some embodiments of the present disclosure. IC die 302 may be substantially similar to the embodiment of FIG. 3C, except that it is turned upside-down, so that substrate 316 is proximate to surface 104 of IC die 100. In such embodiments, IC die 302 may comprise an interface layer 326 (e.g., bonding layer) on a side of substrate 316 opposite to metallization stack 314. Interface layer 326 comprises bond-pads 308 and a dielectric material 328, such that interconnects 304 are formed from metal-metal bonds of bond-pads 124 and 308 and oxide-oxide bonds of dielectric materials 116 and 328. In some embodiments, dielectric material 328 is the same as dielectric material 310. In some embodiments, dielectric material 328 is the same as dielectric material 116 of IC die 100. In various embodiments, dielectric material 328 comprises silicon oxide, silicon nitride, silicon carbonitride, and other such inorganic materials commonly used to fabricate semiconductor IC dies. In such embodiments, IC die 302 may further comprise TSVs 330 in substrate 316 between interface layer 326 and metallization stack 314. TSVs 330 may enable electrical connectivity between interconnects 304 and active region 318 and/or conductive traces 322 in IC die 302.

Figure 3E:
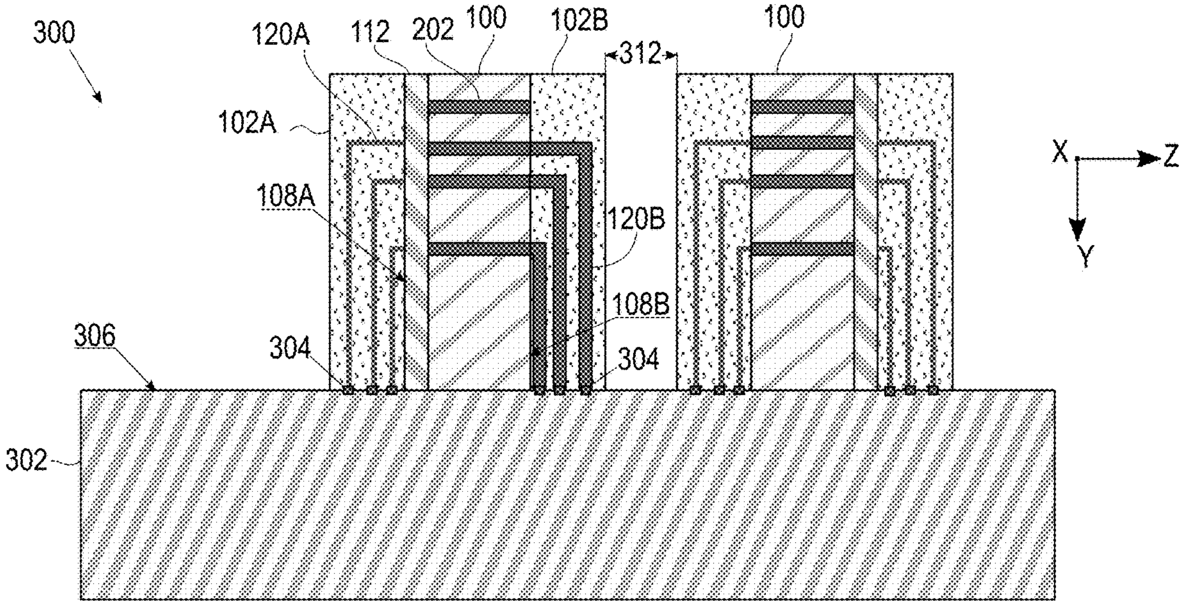
FIG. 3E is a schematic cross-sectional view of the example microelectronic assembly of FIG. 3A according to some other embodiments of the present disclosure.

FIG. 3E is a schematic cross-sectional view of the example microelectronic assembly of FIG. 3A according to some other embodiments of the present disclosure. The relative configuration of IC dies 100 on IC die 302 is substantially similar to the embodiment of FIG. 3A except that IC dies 100 are substantially similar to the embodiment of FIG. 1B, with metallization stacks 102A and 102B on either side of substrate 110. Interconnects 304 may conductively couple conductive traces 120A and 120B with conductive trace 322 (not shown) in IC die 302.

Figure 4:
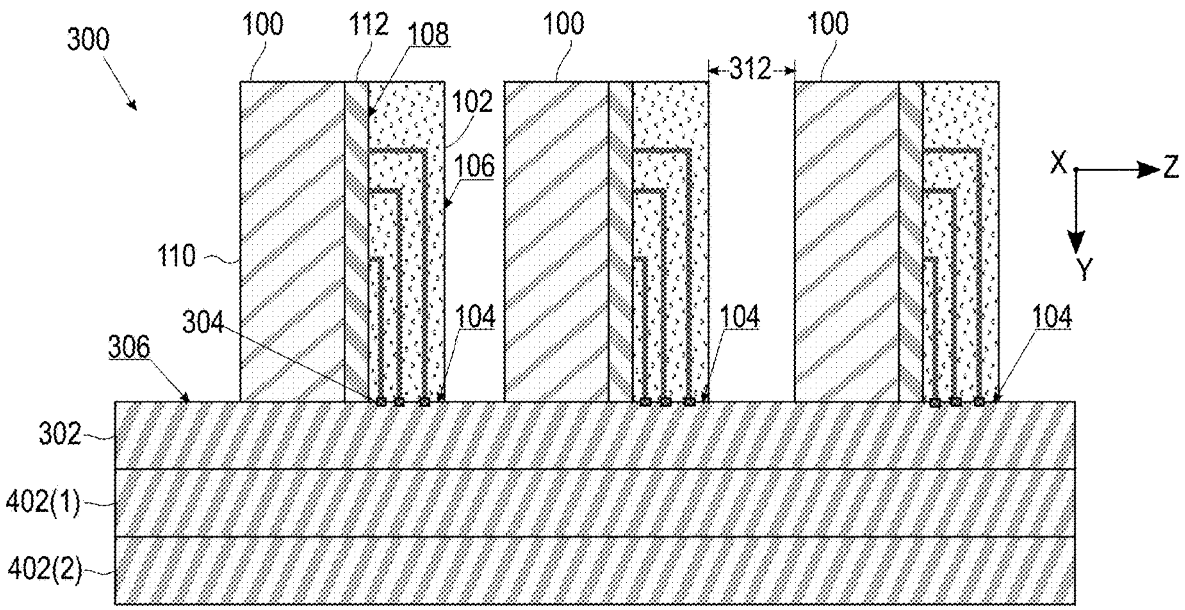
FIG. 4 is a schematic cross-sectional view of another example microelectronic assembly according to some embodiments of the present disclosure.

FIG. 4 is a schematic cross-sectional view of another example microelectronic assembly 300 according to some embodiments of the present disclosure. The embodiment shown in the figure is similar to that of FIG. 3A, except that IC die 302 may be coupled to a stack of other IC dies 402 (e.g., 402(1), 402(2), etc.) such that IC die 302 is a topmost one of the stack of IC dies 402. Stack of IC dies 402, including IC die 302 may comprise high-bandwidth memory (HBM) circuitry, in some embodiments, and vertically stacked IC dies 100 on IC die 302 may comprise compute circuitry that can interface directly with the HBM circuitry by way of interconnects 304 and TSVs (not shown) in IC die 302 and IC dies 402. Various other circuit configurations are also included in the broad scope of the embodiments disclosed herein.

Figure 5A:
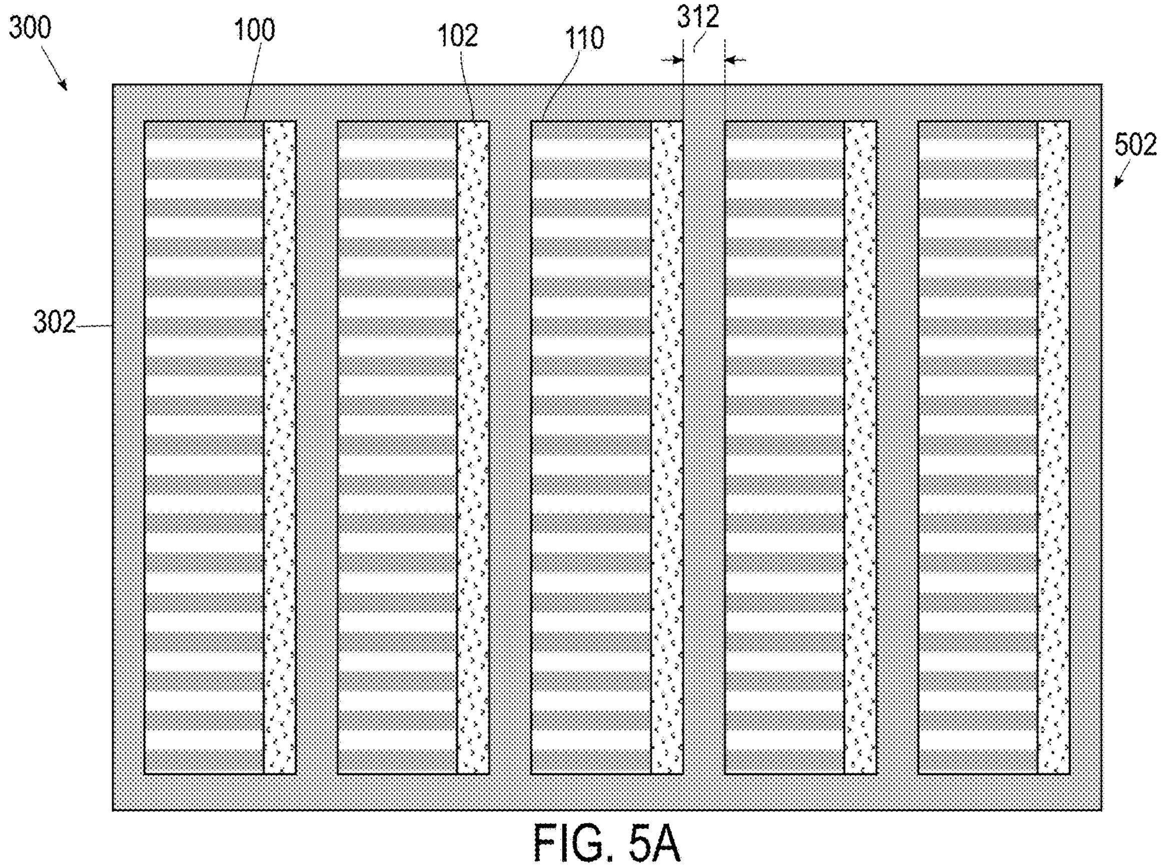
FIG. 5A is a simplified top-view of yet another example microelectronic assembly according to some embodiments of the present disclosure.

FIG. 5A is a simplified top-view of microelectronic assembly 300 according to some embodiments of the present disclosure. A plurality of IC dies 100 may be coupled on respective surfaces 104 with surface 306 of IC die 302. The embodiment shown in the figure comprises components substantially similar to those in the embodiment of FIG. 3A, except that IC dies 100 are arranged in a regular array 502 made up of rows (or columns) with a gap 312 between IC dies 100. Gap 312 may be uniform in some embodiments, and non-uniform in other embodiments. Gap 312 may be configured to permit flow of a cooling fluid around IC dies 100 over IC die 302. In the embodiment shown, each IC die 100 may span the width (or length) of IC die 302; for example, IC die 302 may be around 33-35 millimeters wide, and IC dies 100 may also be of similar dimensions along the mutual contact areas with IC die 302. In some embodiments, depending on area availability on surface 306 of IC die 302, IC dies 100 may be arranged in both rows and columns.

In some embodiments (as shown), metallization stack 102 of any one of IC dies 100 in any one row (or column) of array 502 is proximate to substrate 110 of an adjacent one of IC dies 100 in the same row (or column). In some other embodiments (not shown), metallization stacks 102 or substrates 110 of adjacent IC dies 100 in any one row (or column) of array 502 face each other. In yet other embodiments (not shown), in some rows (or columns), metallization stack 102 of any one of IC dies 100 in any one row (or column) of array 502 may be proximate to substrate 110 of an adjacent one of IC dies 100 in the same row (or column), and in other rows (or columns), metallization stacks 102 or substrates 110 of adjacent IC dies 100 in any one row (or column) may face each other.

In some embodiments, IC dies 100 may comprise compute circuitry, and IC die 302 may comprise a network on chip circuitry, conductively coupling the array of IC dies 100. In some other embodiments, some IC dies 100 may comprise graphics processing circuitry and other IC dies may comprise computer circuitry and IC die 302 may comprise memory circuitry. Any suitable configuration of circuitry may be provided in microelectronic assembly 3100 among IC dies 100 and IC die 302 as desired and based on particular needs.

Figure 5B:
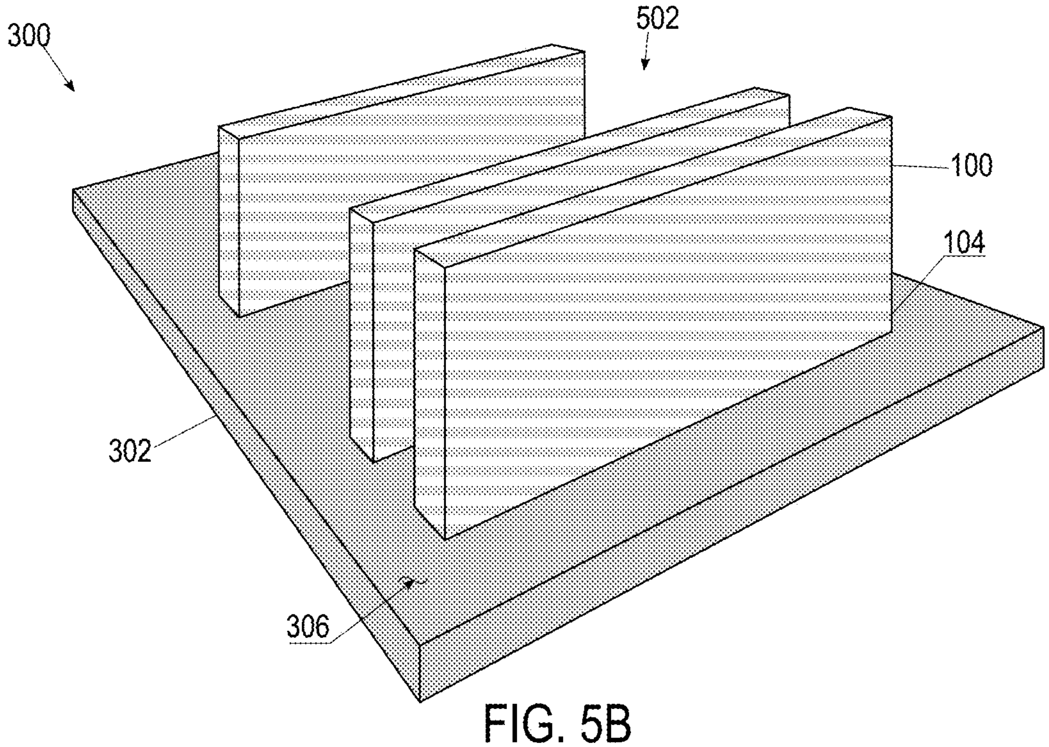
FIG. 5B is a simplified perspective view of a portion of the example microelectronic assembly of FIG. 5A.

FIG. 5B is a simplified perspective view of a portion of the example microelectronic assembly 300 of FIG. 5A. Note that for ease of illustration, and so as not to clutter the drawings, the figure is not drawn to scale, nor are detailed features shown. A plurality of IC dies 100 may be coupled on respective surfaces 104 with surface 306 of IC die 302. In many embodiments, IC die 302 may be large-sized, for example, as large as a conventional reticle, which can be approximately 850 square millimeters in footprint area. IC dies 100 may be uniformly sized, for example, with a contact area between IC die 100 and IC die 302 being approximately in a range between 25 millimeters by 100 micrometers and 33 millimeters by 100 micrometers, and a height of IC die 100 above surface 306 of IC die 302 being not more than 5 millimeters. In some other embodiments, the contact area between any one IC dies 100 and IC die 302 may be approximately 5 millimeters by 100 micrometers, and the height of IC dies 100 above surface 306 of IC die 302 may be not more than 35 millimeters.

Figure 5C:
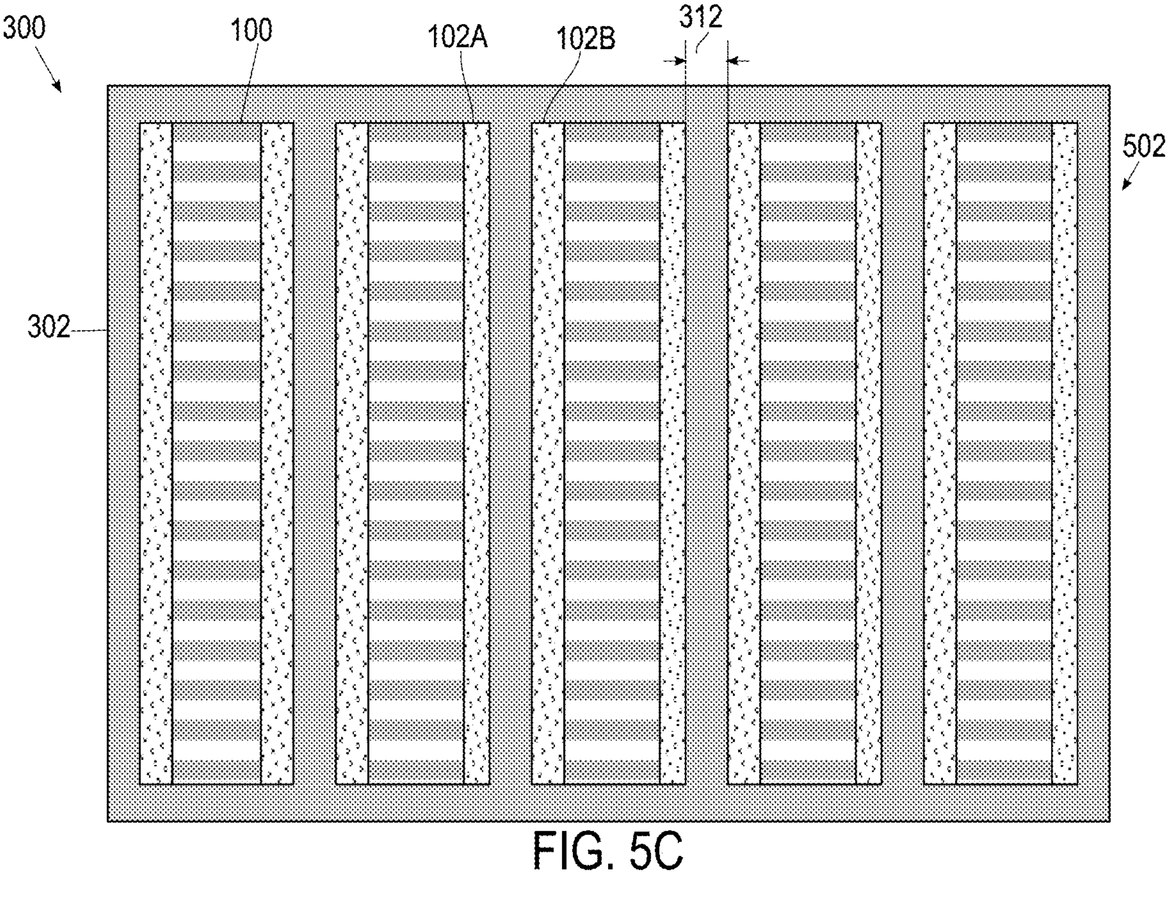
FIG. 5C is a simplified top-view of the example microelectronic assembly of FIG. 5A according to some other embodiments of the present disclosure.

FIG. 5C is a simplified top-view of the example microelectronic assembly of FIG. 5A according to some other embodiments of the present disclosure. The relative configuration of IC dies 100 on IC die 302 is substantially similar to the embodiment of FIG. 5A except that IC dies 100 are substantially similar to the embodiment of FIG. 1B, with metallization stacks 102A and 102B on either side of substrate 110. In some embodiments (e.g., as shown), metallization stack 102A of any one IC die 100 may be proximate and parallel to metallization stack 102B of the adjacent IC die 100. In some other embodiments (not shown), metallization stack 102A of any one IC die 100 may be proximate and parallel to metallization stack 102A of the adjacent IC die 100.

Figure 6:
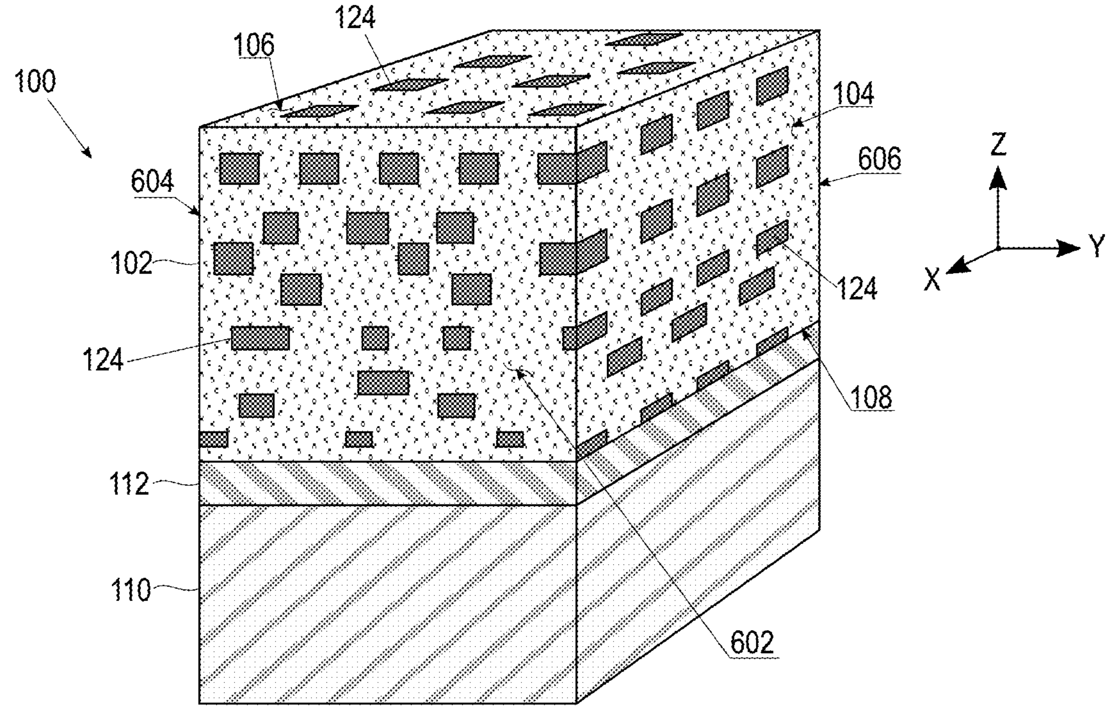
FIG. 6 is a schematic cut-section perspective view of a portion of another example IC die according to some embodiments of the present disclosure.

FIG. 6 is a simplified cut-section perspective view of a portion of example IC die 100 according to various embodiments. Metallization stack 102 of IC die 100 may have a surface 602 orthogonal to surfaces 104 and 106; a surface 604 parallel to surface 104 and orthogonal to surfaces 106 and 602; a surface 606 parallel to surface 602 and orthogonal to surfaces 104, 604, and 106. One or more of these surfaces, for example, surfaces 104, 106, 602, 604, and/or 606, may be flat and planar with surface roughness less than 10 Angstroms and TTV less than 3 micrometers. More than one of these surfaces 104, 106, 602, 604, and 606 may further comprise bond-pads 124. In various embodiments, bond-pads 124 on each surface 104, 106, 602, 604, and 606 may be of different sizes and pitches. In some embodiments bond-pads 124 on surface 106 may all be of uniform size, whereas bond-pads on surfaces 104, 602, 604 and 606 may have bond-pads 124 whose sizes increase with proximity toward surface 106.

Figure 7A:
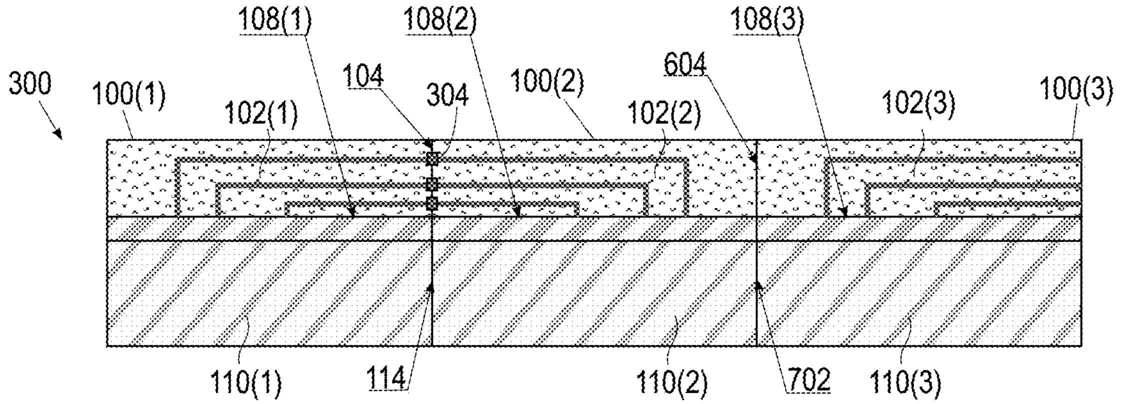
FIG. 7A is a schematic cross-sectional view of yet another example microelectronic assembly according to some embodiments of the present disclosure.

FIG. 7A is a schematic cross-sectional view of microelectronic assembly 300 according to some embodiments of the present disclosure. Microelectronic assembly 300 comprises IC dies 100 that are coupled to each other end-to-end along surfaces 104 and 114 that are orthogonal to respective planar interfaces 108 between respective metallization stacks 102 and substrates 110. Respective conductive traces 120 (not labeled so as not to clutter the drawing) are parallel to respective planar interfaces 108 and orthogonal to respective surfaces 104. For example, IC die 100(1) and 100(2) are coupled along common surface 104 orthogonal to respective planar interfaces 108(1) and 108(2). Metallization stack 102(1) of IC die 100(1) is in direct contact with metallization stack 102(2) and conductively coupled thereto by interconnects 304. Substrate 110(1) of IC die 100(1) is in direct contact along surface 114 with substrate 110(2) of IC die 100(2). In some embodiments, substrate 110(1) may be bonded to substrate 110(2) by oxide-oxide or other inorganic dielectric-inorganic dielectric bonds.

In some embodiments, IC dies 100 may be coupled along surface 604 parallel to surface 104. For example, IC die 100(2) and 100(3) are coupled along common surface 604 orthogonal to respective planar interfaces 108(2) and 108(3) and parallel to surface 104. Metallization stack 102(2) of IC die 100(2) is in direct contact with metallization stack 102(3) and conductively coupled thereto at least by oxide-oxide bonds (not labeled). In some embodiments (not shown) in which surface 604 comprises bond-pads, interconnects 304, comprising metal-metal bonds and oxide-oxide bonds may be present between IC dies 100(2) and 100(3). Substrate 110(2) of IC die 100(1) is in direct contact along surface 702 with substrate 110(3) of IC die 100(2). In some embodiments, substrate 110(2) may be bonded to substrate 110(3) by oxide-oxide or other inorganic dielectric-inorganic dielectric bonds.

Figure 7B:
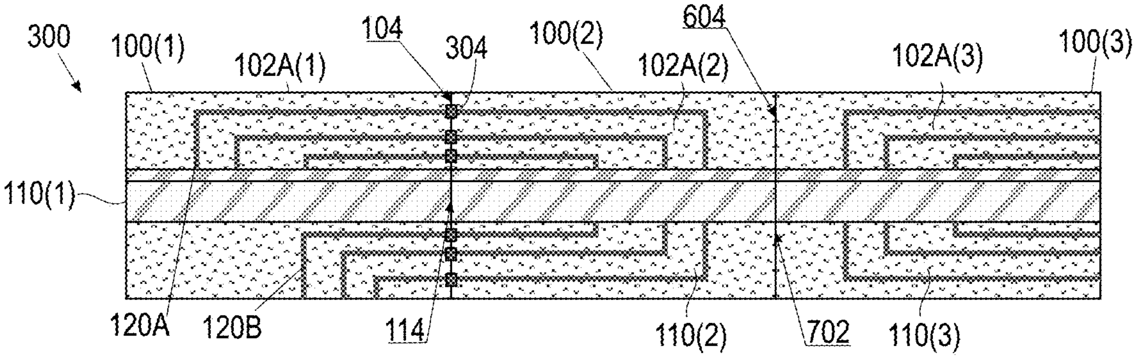
FIG. 7B is a schematic cross-sectional view of the example microelectronic assembly of FIG. 7A according to some other embodiments of the present disclosure.

FIG. 7B is a schematic cross-sectional view of the example microelectronic assembly of FIG. 7A according to some other embodiments of the present disclosure. The relative configuration of IC dies 100 is substantially similar to the embodiment of FIG. 7A except that IC dies 100 are substantially similar to the embodiment of FIG. 1B, with metallization stacks 102A and 102B on either side of substrate 110. In some embodiments (e.g., as shown), interconnects 304 may conductively couple conductive traces 120A of adjacent and conductively coupled IC dies 100(1) and 100(2); likewise, interconnects 304 may conductively couple conductive traces 120B of adjacent and conductively coupled IC dies 100(1) and 100(2). In some embodiments (not shown), metallization stack 102A may be conductively coupled with metallization stack 102B of adjacent IC die 100 such that interconnects 304 conductively couple conductive traces 120A of one IC die 100 with conductive traces 120B of another IC die 100.

Figure 8A:
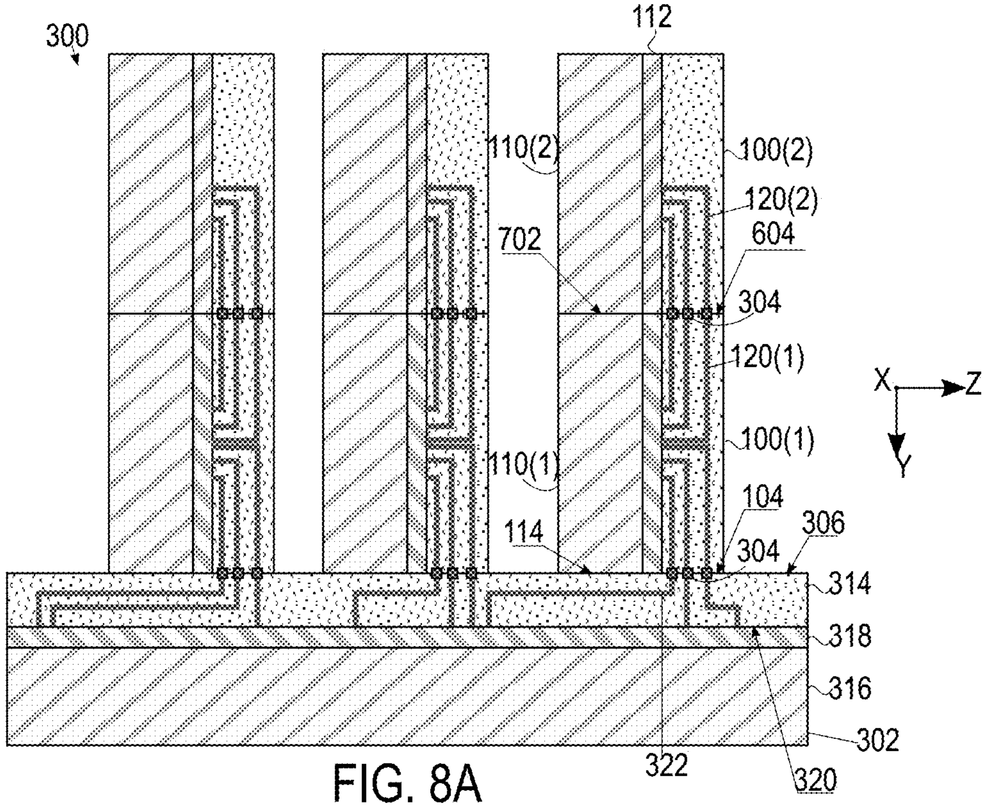
FIG. 8A is a schematic cross-sectional view of yet another example microelectronic assembly according to some embodiments of the present disclosure.

FIG. 8A is a schematic cross-sectional view of microelectronic assembly 300 according to some embodiments of the present disclosure. The embodiment shown in the figure is similar to that in FIG. 3A, except that IC die 100(1) is coupled end-to-end with IC die 100(2) to form a stack of IC dies. Thus, any single IC die 100 of FIG. 3A is replaced in the embodiment shown in FIG. 8 by corresponding stacks of IC dies 100 coupled end-to-end as described further. IC dies 100(1) and 100(2) may be in direct contact end-to-end along surface 604, opposite to surface 104 of IC die 100(1). Conductive traces 120(1) of IC die 100(1) may be conductively coupled to conductive traces 120(2) of IC die 100(2) through interconnects 304 on surface 604. Substrates 110(1) and 110(2) may be in direct contact on surface 702. In some embodiments, substrates 110(1) and 110(2(surface 114 may be bonded by oxide-oxide bonds along common surface 702.

As described in reference to FIG. 3A, IC die 100(1) may be in contact with surface 306 of IC die 302 along surface 104. Conductive traces 120(1) of IC die 100(1) may be conductively coupled to conductive traces 322 of IC die 302 through interconnects 304 on surface 306. Surface 114 of substrate 110(1) of IC die 100(1) may be in contact with surface 306 of IC die 302. In some embodiments, surface 114 may be bonded with surface 306 by oxide-oxide bonds. In some embodiments, IC die 302 comprises metallization stack 314 attached to substrate 316 having active region 318. Substrate 316 is attached to metallization stack 314 along planar interface 320 that is parallel to surface 306. In some embodiments, active region 318 comprises active circuitry 204 (not shown), including transistors and diodes. Active region 318 may be proximate to planar interface 320 in such embodiments. In some embodiments, active region 318 may be absent. Metallization stack 314 comprises conductive traces 322 in dielectric material 310. In some embodiments, microelectronic assembly 300 further comprises a plurality of the stack of IC dies 100 arranged in mutually parallel rows and columns, with the "bottom" IC die 100 coupled to surface 306 of IC die 302. Although only two IC dies 100 are shown in any one "vertical" stack, any number of IC dies 100 may be coupled together to form the stack as desired, based on particular needs and as permitted by mechanical integrity specifications of microelectronic assembly 300.

Figure 8B:
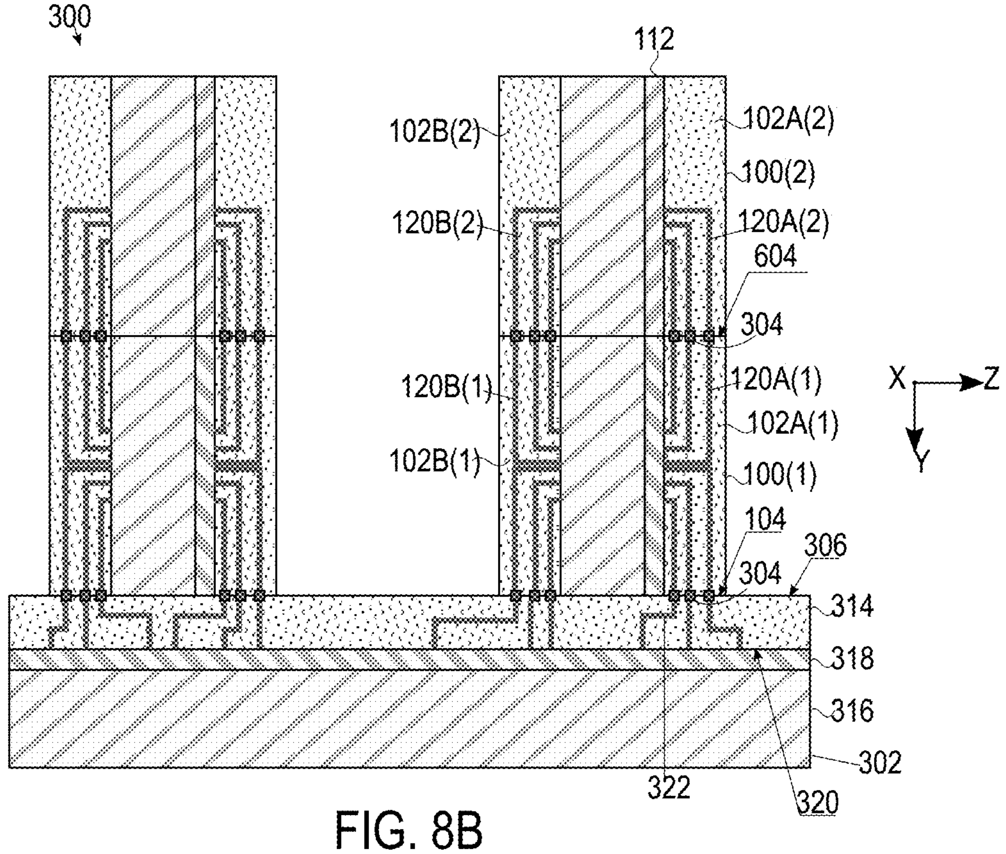
FIG. 8B is a schematic cross-sectional view of the example microelectronic assembly of FIG. 8A according to some other embodiments of the present disclosure.

FIG. 8B is a schematic cross-sectional view of the example microelectronic assembly of FIG. 8A according to some other embodiments of the present disclosure. The relative configuration of IC dies 100 on IC die 302 is substantially similar to the embodiment of FIG. 8A except that IC dies 100 are substantially similar to the embodiment of FIG. 1B, with metallization stacks 102A and 102B on either side of substrate 110. Thus, in addition to the coupling shown in FIG. 8A, interconnects 304 may further conductively couple conductive traces 120B of IC die 100(1) with conductive trace 322 in IC die 302. Likewise, interconnects 304 on surface 604 may further conductively couple conductive traces 120B(1) of IC die 100(1) with conductive traces 120B(2) of IC die 100(2).

Figure 9A:
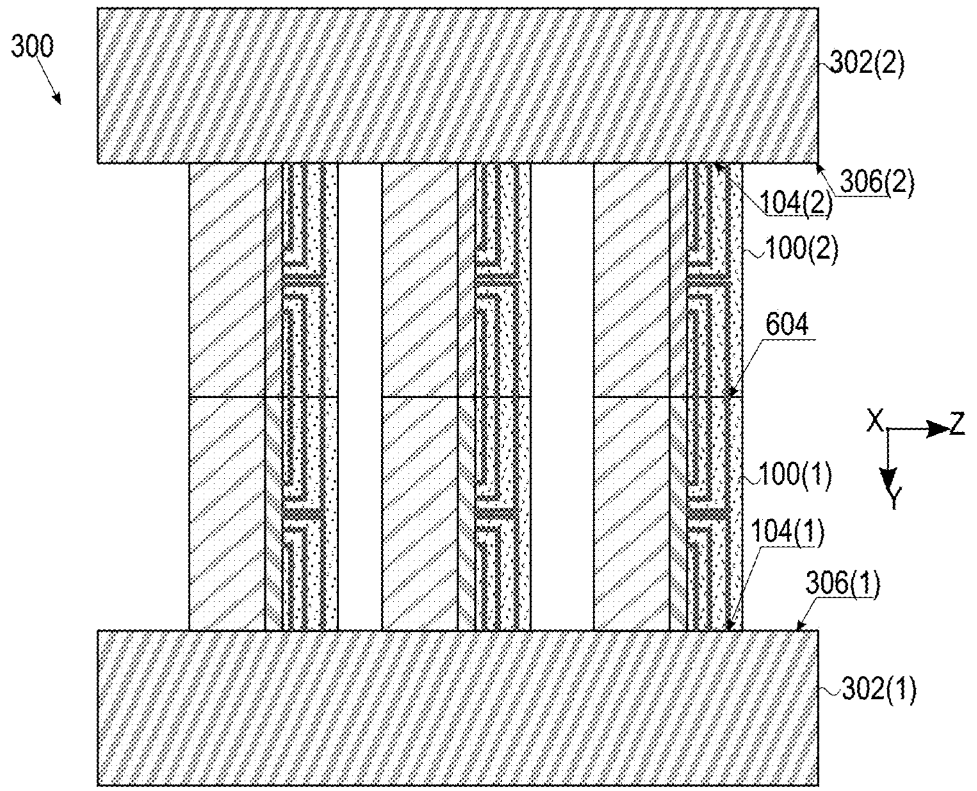
FIG. 9A is a schematic cross-sectional view of yet another example microelectronic assembly according to some embodiments of the present disclosure.

FIG. 9A is a schematic cross-sectional view of microelectronic assembly 300 according to some embodiments of the present disclosure. The embodiment shown in the figure is substantially similar to that of FIG. 8, except that surface 104(2) of IC die 100(2) is coupled to another IC die 302(2). The configuration thus presents two parallel IC dies 302(1) and 302(2) with a plurality of a stack of IC dies 100 coupled orthogonally between them. Respective surfaces 104(1) and 104(2) of IC dies 100(1) and 100(2) may be coupled by interconnects (not shown) to respective surfaces 306(1) and 306(2) of IC dies 302(1) and 302(2). Any number of IC dies 100 may be included in each stack as would be permitted by mechanical integrity and other design conditions of microelectronic assembly 300. Power delivery to IC die 302 may be through one or more IC dies 100(1) and 100(2).

Figure 9B:
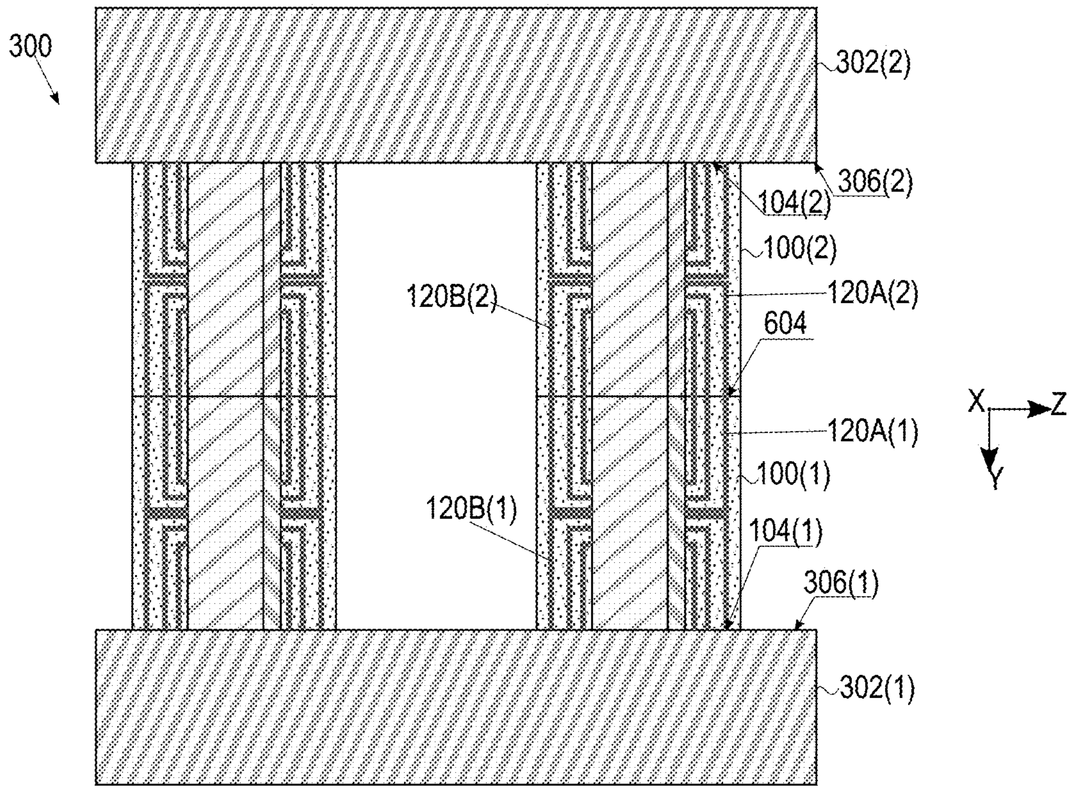
FIG. 9B is a schematic cross-sectional view of the example microelectronic assembly of FIG. 9A according to some other embodiments of the present disclosure.

FIG. 9B is a schematic cross-sectional view of the example microelectronic assembly of FIG. 9A according to some other embodiments of the present disclosure. The relative configuration of IC dies 100 on IC die 302 is substantially similar to the embodiment of FIG. 9A except that IC dies 100 are substantially similar to the embodiment of FIG. 1B, with metallization stacks 102A and 102B on either side of substrate 110. Thus, in addition to the coupling shown in FIG. 9A, interconnects 304 may further conductively couple conductive traces 120B of IC die 100(1) with conductive trace 322 in IC die 302(1) and 302(2). Likewise, interconnects 304 on surface 604 may further conductively couple conductive traces 1206(1) of IC die 100(1) with conductive traces 1206(2) of IC die 100(2).

FIG. 10A is a schematic cross-sectional view of microelectronic assembly 300 according to some embodiments of the present disclosure. The embodiment shown in the figure is comparable to a vertical stack of a plurality of the embodiments shown in FIG. 3A. IC dies 302(1) and 302(2) are parallel to each other and orthogonal to IC dies 100. A plurality of IC dies 100(1) and 100(2) may be arranged in arrays of rows and columns on respective IC dies 302(1) and 302(2) as desired based on particular needs as described in reference to FIG. 5.

Further, surface 104(1) of IC die 100(1) is coupled to surface 306(1) of IC die 302(1) by interconnects 304. Surface 604 of IC die 100(1) is coupled to surface 1002 of IC die 302(2) by other interconnects 304. Surface 306(2) of IC die 302(2) is coupled to surface 104(2) of IC die 100(2) by yet other interconnects 304. Metallization stack 314(2) of IC die 302(2) may be conductively coupled to interconnects 304 on surface 1002 by TSVs 330 through substrate 316(2) of IC die 302(2). As in other embodiments described in reference to other figures herein, bonding surfaces 104(1) and 104(2) are orthogonal to planar interfaces 108(1) and 108(2) and parallel to surfaces 306(1) and 306(2) and to planar interfaces 320(1) and 320(2). In some embodiments, not all IC dies 100(1) may be coupled to IC die 302(2) by interconnects 304. In such embodiments, IC dies 100(1), for example, IC die 100(1A), not coupled by interconnects 304 to IC die 302(2) may nevertheless be bonded to substrate 316(2) by oxide-oxide bonds (not shown). Power delivery to IC die 302(2) may be through one or more IC dies 100(1).

Note that although only two IC dies 302 are shown stacked in parallel with IC dies 100 between them, any number of IC dies 302 may be stacked as may be permitted by mechanical integrity specifications and other requirements of microelectronic assembly 300 as desired and based on particular needs.

FIG. 10B is a schematic cross-sectional view of the example microelectronic assembly of FIG. 10A according to some other embodiments of the present disclosure. The relative configuration of IC dies 100 on IC die 302 is substantially similar to the embodiment of FIG. 10A except that IC dies 100 are substantially similar to the embodiment of FIG. 1B, with metallization stacks 102A and 102B on either side of substrate 110. Thus, in addition to the coupling shown in FIG. 10A, interconnects 304 may further conductively couple conductive traces 120B of IC dies 100(1) and 100(2) with respective conductive trace 322 in IC die 302(1) and 302(2).

Figure 11A:
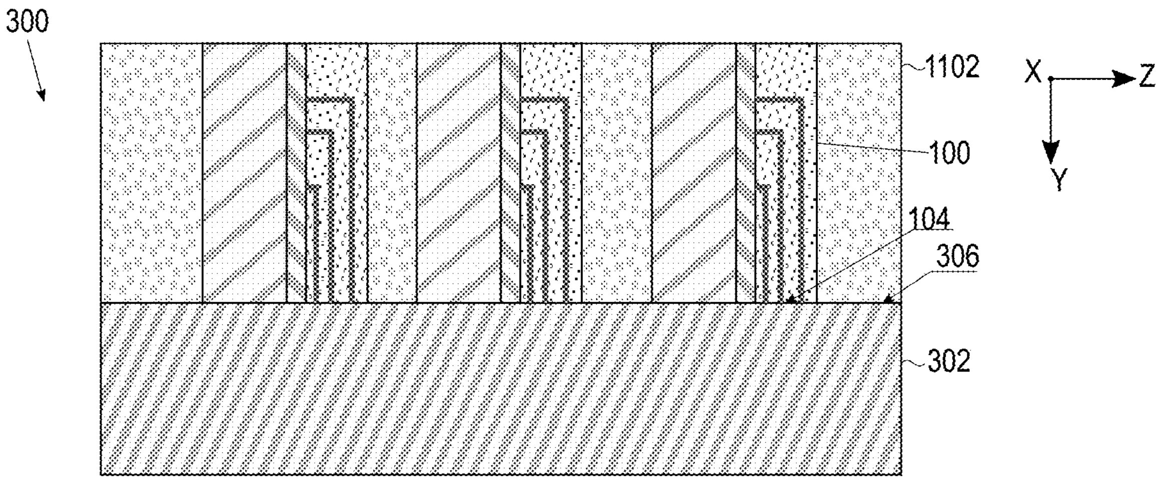
FIG. 11A is a schematic cross-sectional view of yet another example microelectronic assembly according to some embodiments of the present disclosure.

FIG. 11A is a simplified cross-sectional view of an embodiment of microelectronic assembly 300. Microelectronic assembly 300 shown in the figure is substantially similar to the embodiment of FIG. 3A, except that a dielectric material 1102 may encapsulate various components of microelectronic assembly 300. For example, dielectric material 1102 may be around IC dies 100 (e.g., in gap 312) and in contact with surface 306 of IC die 302. In various embodiments, dielectric material 1102 comprises an inorganic dielectric material such as silicon oxide, silicon nitride, etc. In some embodiments, dielectric material 1102 comprises an organic polymer with thermally conductive fillers. In other embodiments, dielectric material 1102 comprises an organic polymer without thermally conductive fillers. Dielectric material 1102 may provide mechanical stability to IC dies 100 in some embodiments, for example, depending on the particular dimensions of IC die 100 (e.g., height of IC dies 100 above IC die 302 is large relative to contact areas between IC dies 100 and IC die 302). In other embodiments, dielectric material 1102 may provide heat transfer capabilities, serving to conduct heat away from IC dies 100.

Figure 11B:
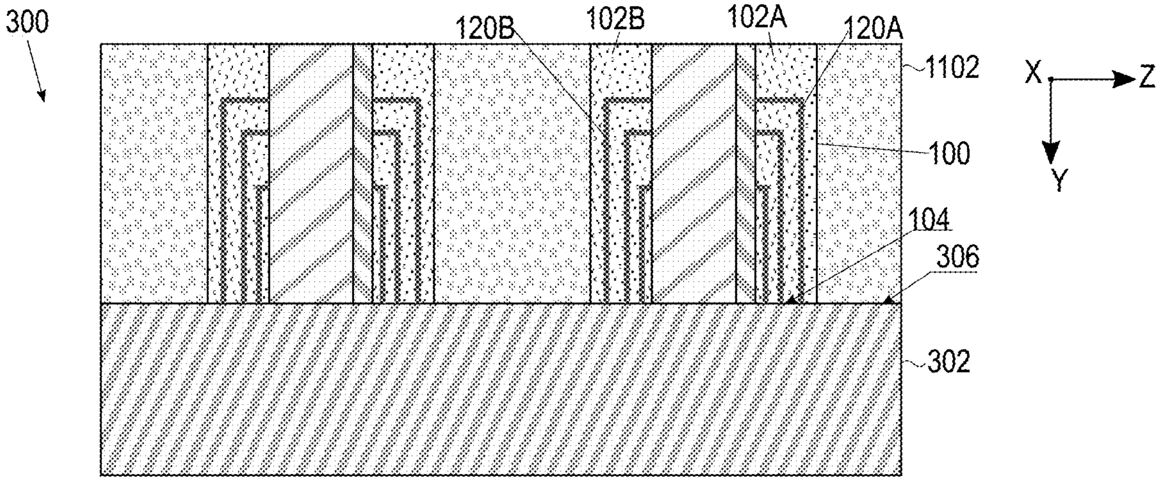
FIG. 11B is a schematic cross-sectional view of the example microelectronic assembly of FIG. 11A according to some other embodiments of the present disclosure.

FIG. 11B is a schematic cross-sectional view of the example microelectronic assembly of FIG. 11A according to some other embodiments of the present disclosure. The relative configuration of IC dies 100 on IC die 302 is substantially similar to the embodiment of FIG. 11A except that IC dies 100 are substantially similar to the embodiment of FIG. 1B, with metallization stacks 102A and 102B on either side of substrate 110. Thus, in addition to the coupling shown in FIG. 11A, interconnects 304 may further conductively couple conductive traces 120B of IC die 100 with conductive trace 322 in IC die 302. Dielectric material 1102 may be in direct contact with metallization stacks 102A and 102B between adjacent IC dies 100.

Figure 12A:
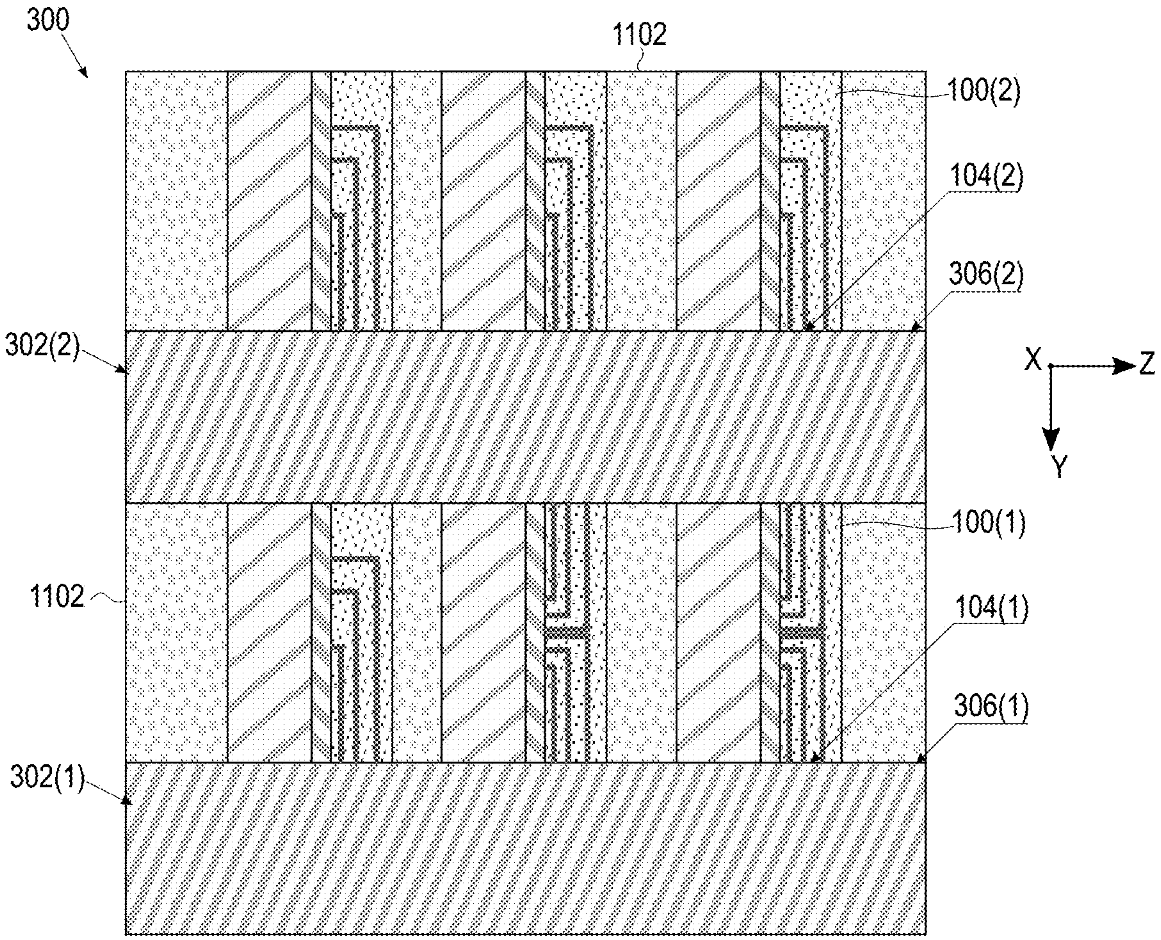
FIG. 12A is a schematic cross-sectional view of yet another example microelectronic assembly according to some embodiments of the present disclosure.

FIG. 12A is a schematic cross-sectional view of microelectronic assembly 300 according to some embodiments of the present disclosure. Microelectronic assembly 300 shown in the figure is substantially similar to the embodiment of FIG. 10, except that dielectric material 1102 may encapsulate various components of microelectronic assembly 300. For example, dielectric material 1102 may be around IC dies 100(1) and 100(2) (e.g., in gaps 312) and in contact with surfaces 306(1) and 306(2) of IC dies 302(1) and 302(2) respectively. Dielectric material 1102 may provide mechanical stability to IC dies 100(1) and 100(2) in some embodiments, for example, depending on the particular dimensions of IC die 100 (e.g., number of IC dies 100(1) between IC dies 302(1) and 302(2)). In other embodiments, dielectric material 1102 may provide heat transfer capabilities, serving to conduct heat away from IC dies 100(1) and/or 100(2).

In some embodiments (not shown) the material of dielectric material 1102 disposed above IC die 302(2) may be different from the material disposed below IC die 302(2). For example, an inorganic material may be around IC dies 100(1) and an organic thermally conductive material may be around IC dies 100(2). In some embodiments (not shown) dielectric material 1102 may be present between IC dies 302(1) and 302(2), but not around IC dies 100(2), or vice versa.

Figure 12B:
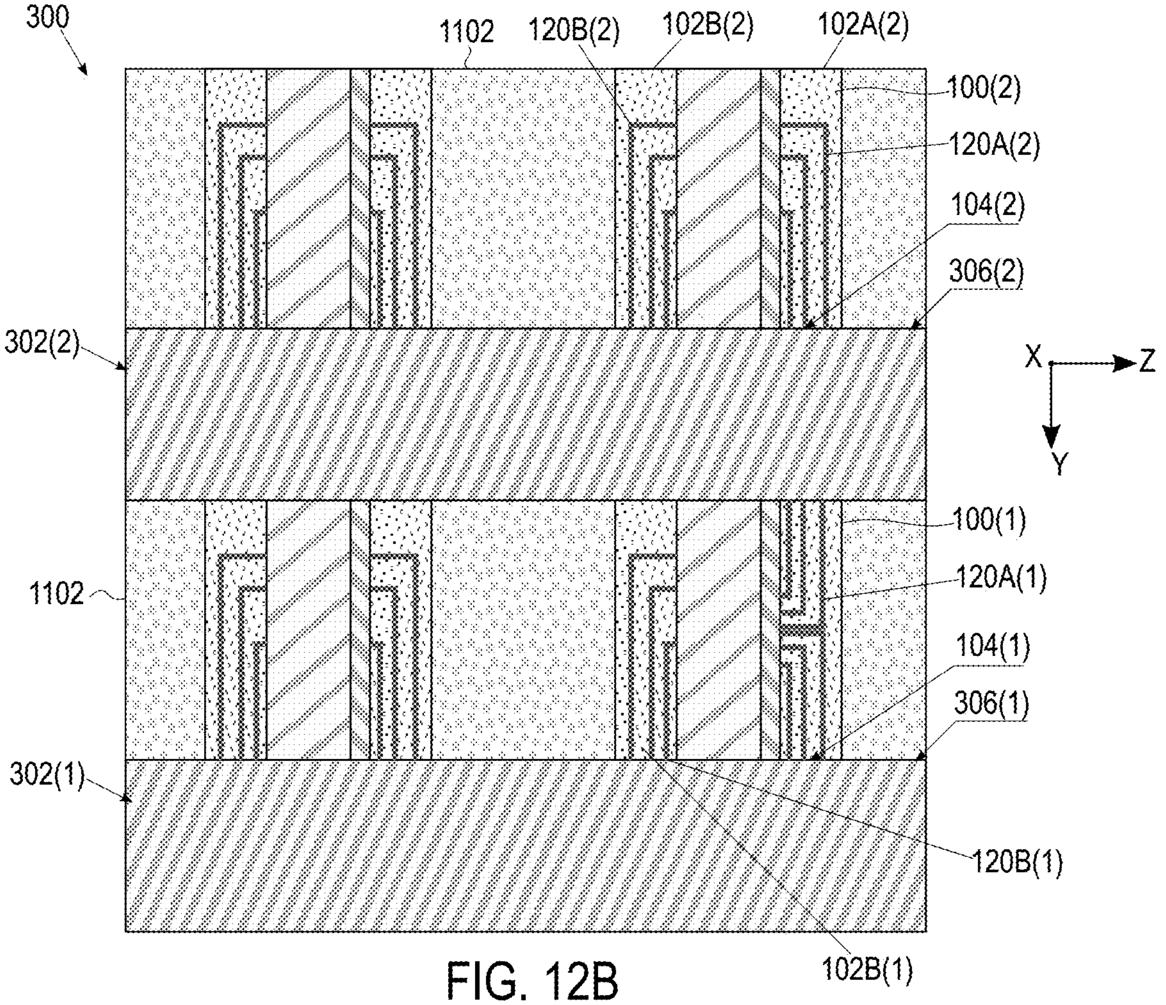
FIG. 12B is a schematic cross-sectional view of the example microelectronic assembly of FIG. 12A according to some other embodiments of the present disclosure.

FIG. 12B is a schematic cross-sectional view of the example microelectronic assembly of FIG. 12A according to some other embodiments of the present disclosure. The relative configuration of IC dies 100 on IC die 302 is substantially similar to the embodiment of FIG. 12A except that IC dies 100 are substantially similar to the embodiment of FIG. 1B, with metallization stacks 102A and 102B on either side of substrate 110. Thus, in addition to the coupling shown in FIG. 12A, interconnects 304 may further conductively couple conductive traces 120B of IC dies 100(1) and 100(2) with respective conductive trace 322 in IC die 302(1) and 302(2). Dielectric material 1102 may be in direct contact with metallization stacks 102A and 102B of IC dies 100.

Figure 13A:
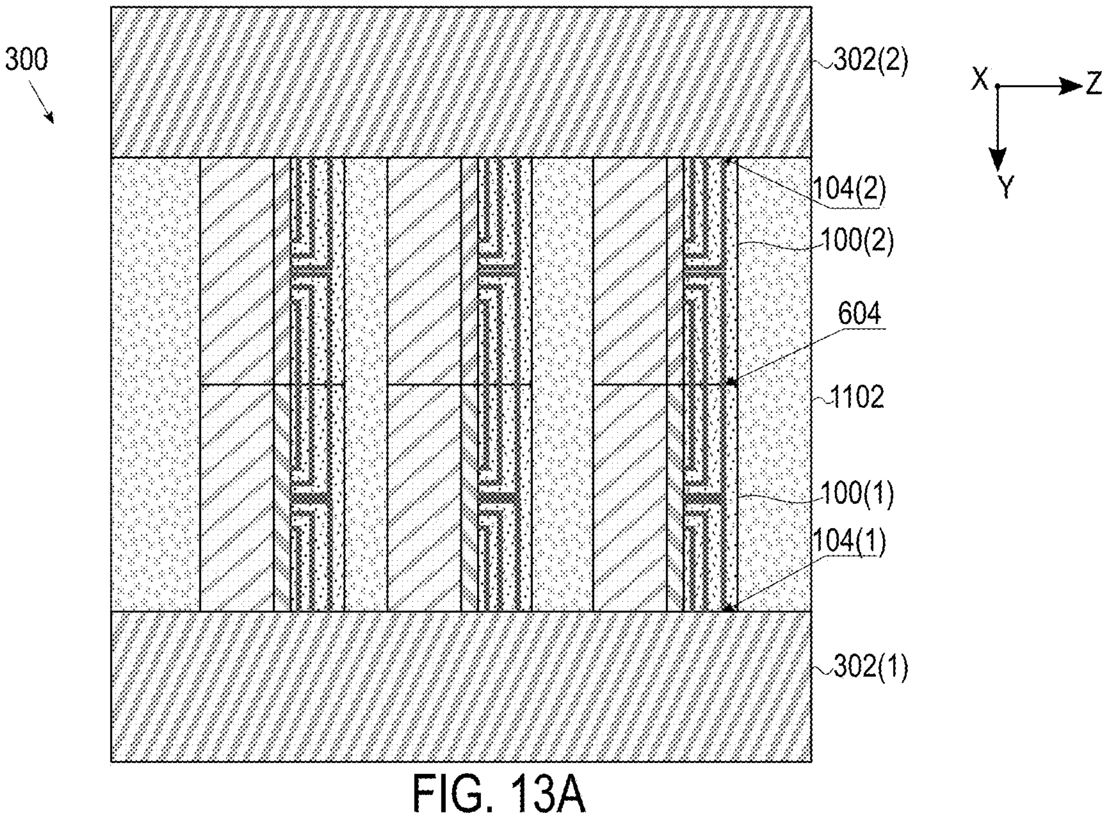
FIG. 13A is a schematic cross-sectional view of yet another example microelectronic assembly according to some embodiments of the present disclosure.

FIG. 13A is a schematic cross-sectional view of yet another example microelectronic assembly according to some embodiments of the present disclosure. Microelectronic assembly 300 shown in the figure is substantially similar to the embodiment of FIG. 9, except that dielectric material 1102 may encapsulate various components of microelectronic assembly 300. For example, dielectric material 1102 may be around IC dies 100(1) and 100(2) (e.g., in gaps 312) and in contact with surfaces 306(1) and 306(2) of IC dies 302(1) and 302(2) respectively. Dielectric material 1102 may provide mechanical stability to IC dies 100(1) and 100(2) in some embodiments, for example, depending on the particular dimensions of IC die 100 (e.g., number of IC dies 100(1) between IC dies 302(1) and 302(2)). In other embodiments, dielectric material 1102 may provide heat transfer capabilities, serving to conduct heat away from IC dies 100(1) and/or 100(2).

Figure 13B:
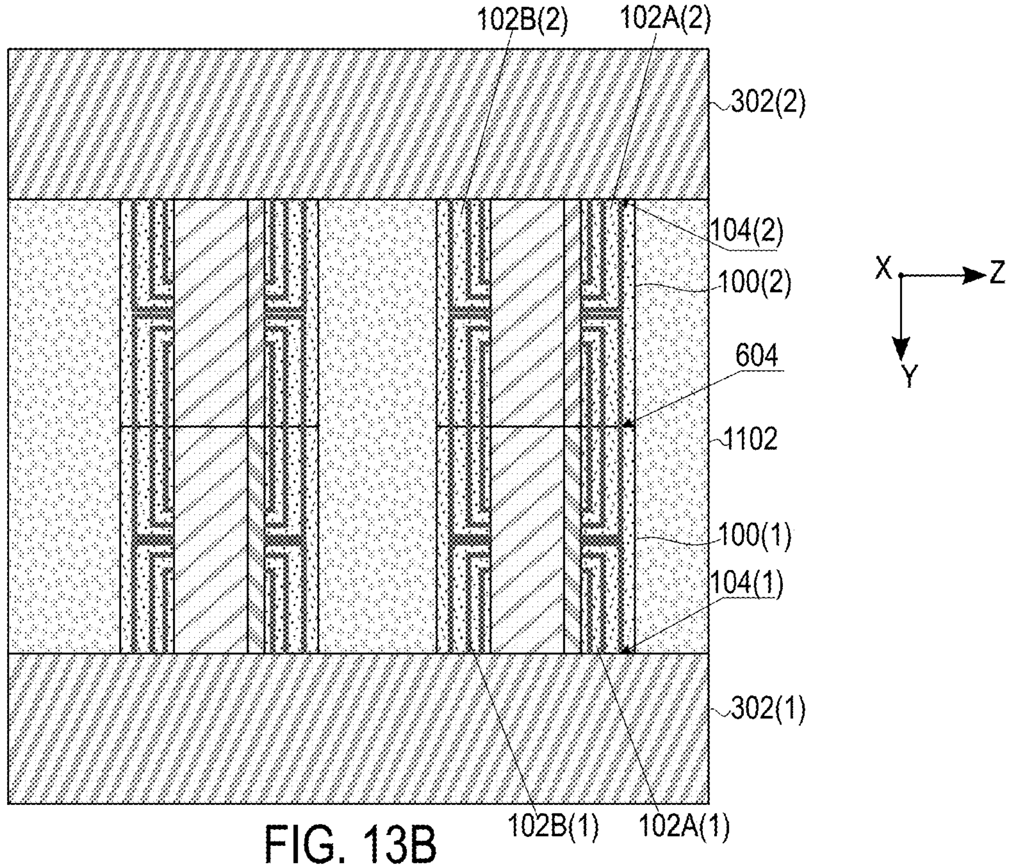
FIG. 13B is a schematic cross-sectional view of the example microelectronic assembly of FIG. 13A according to some other embodiments of the present disclosure.

FIG. 13B is a schematic cross-sectional view of the example microelectronic assembly of FIG. 13A according to some other embodiments of the present disclosure. The relative configuration of IC dies 100 on IC die 302 is substantially similar to the embodiment of FIG. 13A except that IC dies 100 are substantially similar to the embodiment of FIG. 1B, with metallization stacks 102A and 102B on either side of substrate 110. Thus, in addition to the coupling shown in FIG. 13A, interconnects 304 may further conductively couple conductive traces 120B of IC dies 100(1) and 100(2) with respective conductive trace 322 in IC die 302(1) and 302(2). Likewise, interconnects 304 on surface 604 may further conductively couple conductive traces 1206(1) of IC die 100(1) with conductive traces 1206(2) of IC die 100(2). Dielectric material 1102 may be in direct contact with metallization stacks 102A and 102B of adjacent IC dies.

In various embodiments, any of the features discussed with reference to any of FIGS. 1-13 herein may be combined with any other features to form a package with one or more IC dies as described herein, for example, to form a modified IC die 100 or a modified microelectronic assembly 300. Some such combinations are described above, but, in various embodiments, further combinations and modifications are possible. Further, the various embodiments described in any of FIGS. 1-13 herein may be combined suitably based on particular needs within the broad scope of the embodiments.

Example Methods

Figure 14A:
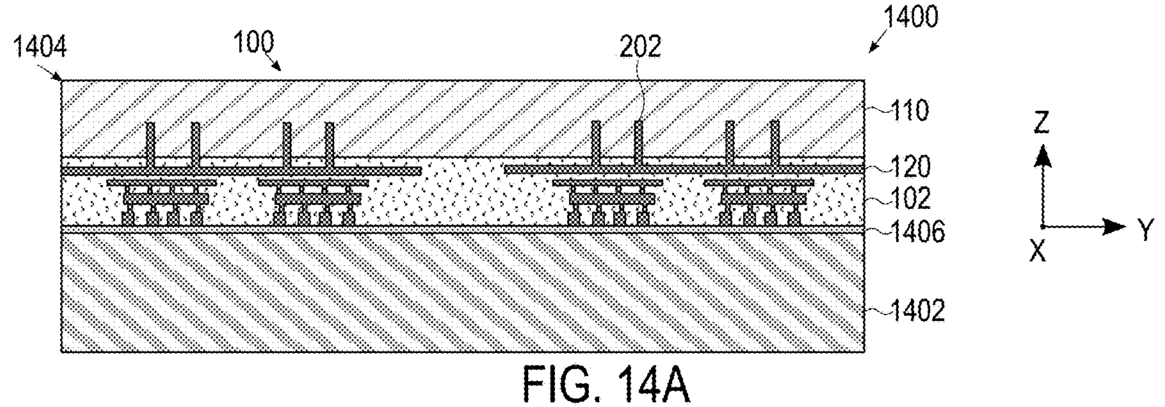
FIGS. 14A-14K are schematic cross-sectional views of various stages of manufacture of an example microelectronic assembly according to some embodiments of the present disclosure.

FIGS. 14A-14K are schematic cross-sectional views of various stages of manufacture of microelectronic assembly 300 according to some embodiments of the present disclosure. FIG. 14A is a simplified cross-sectional view of an assembly 1400 comprising a carrier 1402 to which a wafer 1404 is attached (e.g., fused, bonded) by a layer of attachment material 1406. In many embodiments, carrier 1402 comprises a wafer of any solid material that can withstand the temperatures, pressures, and chemicals used in semiconductor processes; examples of carrier 1402 include a semiconductor wafer, a glass wafer, a ceramic wafer, etc. In some embodiments, attachment material 1406 is silicon oxide. In the orientation shown in the figure (merely as an example), carrier 1402 is positioned relative to wafer 1404 such that wafer 1404 is horizontal, carrier 1402 is beneath wafer 1404 and a surface of wafer 1404 opposite to carrier 1402 is facing upwards.

Wafer 1404 may comprise a plurality of IC dies 100 (not shown with particularity), each IC die 100 as described in reference to FIG. 1 and other figures. For example, each IC die may comprise metallization stack 102 attached to substrate 110 with conductive traces 120 parallel to planar interface 108 (not labeled) between metallization stack 102 and substrate 110. Each IC die 100 may be as wide and as long as any other IC die in wafer 1404. Metallization stack 102 of IC dies 100 may be proximate to carrier 1402 and fused thereto by attachment material 1406. In some embodiments (as shown), substrate 110 may have a thickness of around 700 micrometers, such that TSVs 202 are buried inside substrate 110, and may not be exposed on the surface of substrate 110 opposite to carrier 1402.

Figure 14B:
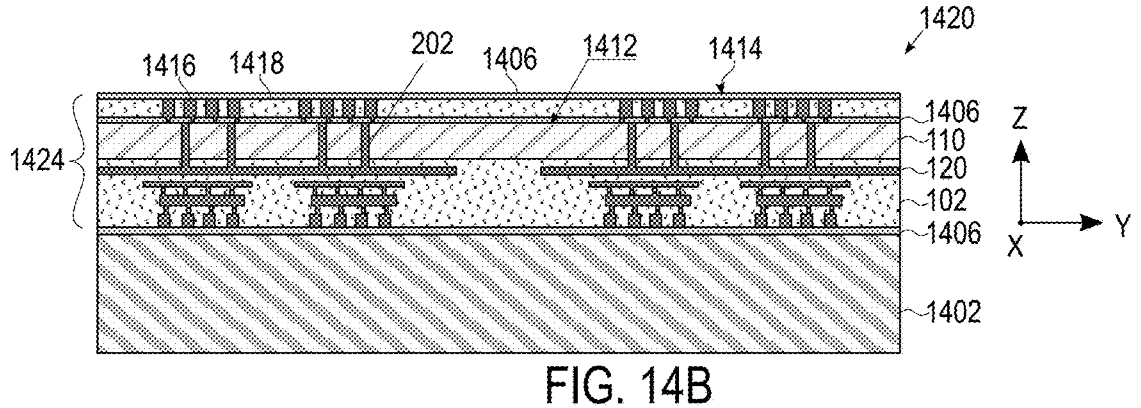

FIG. 14B is a simplified cross-sectional view of an assembly 1420 subsequent to further processing on assembly 1400. Wafer 1404 may be polished (e.g., thinned) such that TSVs 202 may be exposed on a surface 1412 of wafer 1404, surface 1412 being opposite carrier 1402. An interface layer 1414 may be formed on surface 1412. For example, wafer 1404 having a thickness ranging between 700 micrometers and 800 micrometers before planarizing, may be thinned to a thickness of approximately 50 micrometers to 100 micrometers after planarizing.

In some embodiments, interface layer 1414 may comprise metal bond-pads 1416 in a dielectric material 1418, such as silicon oxide. In many embodiments, interface layer 1414 may be sacrificial and destroyed in a subsequent operation. In some embodiments, a layer of attachment material 1406 may be formed on surface 1412 before forming interface layer 1414. Interface layer 1414 may be formed using any known process in the art, including semi-additive processes (SAP). For example, bond-pads 1416 may be deposited first, followed by deposition of dielectric material 1418 around bond-pads 1416. In other embodiments, dielectric material 1418 may be deposited and etched to create vias for forming bond-pads 1416. In some embodiments, bond-pads 14116 may not be formed at all. Interface layer 1414 may further comprise another layer of attachment material 1406. The operations as described may result in formation of a tier 1424, comprising components and materials between attachment material 1406 in contact with carrier wafer 1402 and attachment material 1406 on exposed surface of assembly 1420 opposite to carrier wafer 1402. Tier 1424 comprises thinned wafer 1404, interface layer 1414, and layers of attachment material 1406.

Figure 14C:
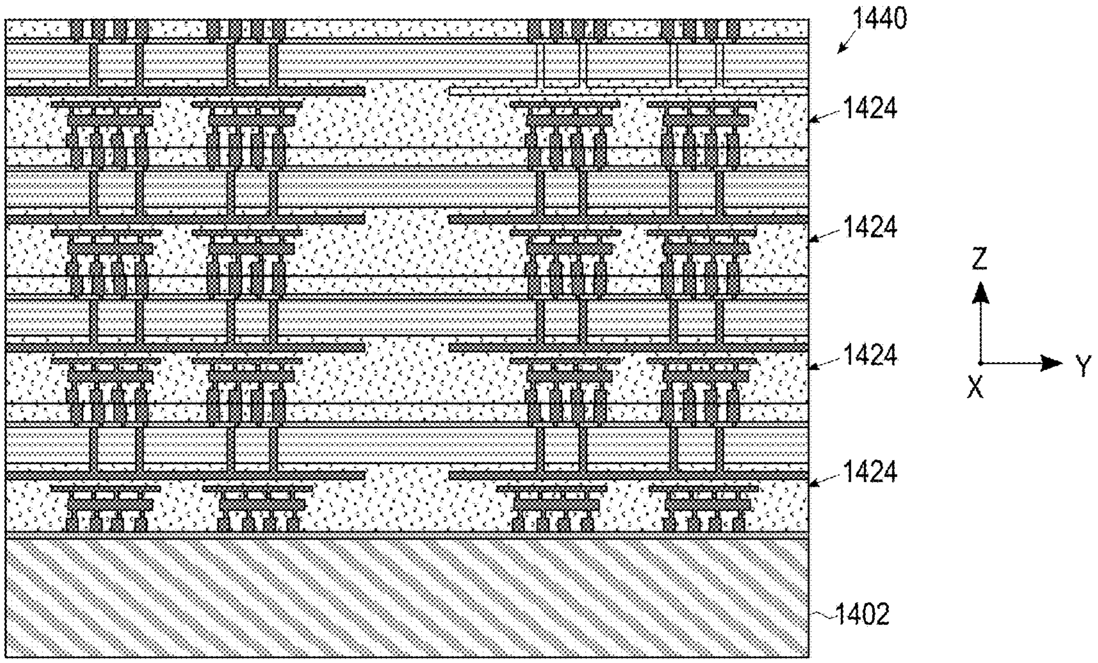

FIG. 14C is a simplified cross-sectional view of an assembly 1430 subsequent to further processing on assembly 1420. The operations as described in reference to FIG. 14B may be repeated multiple times, with a separate tier 1424 being formed each time, such that assembly 1430 comprises a stack of tiers 1424 over carrier 1402. In some embodiments, assembly 1420 may comprise a stack of 5 to 10 wafers. Any number of tiers 1424 may be formed over carrier 1402 as allowed by various manufacturing constraints beyond the scope of the present disclosure. In some embodiments, a number of tier 1424 may be determined by a desired thickness of assembly 1430. For example, the desired thickness may be not more than 2 millimeters. Adjacent wafers 1404 may be conductively coupled to each other depending on whether interface layer 1414 comprise metal bond-pads 1416. In embodiments where metal bond-pads 1416 are absent, adjacent wafer 1404 may not be conductively coupled.

Figure 14D:
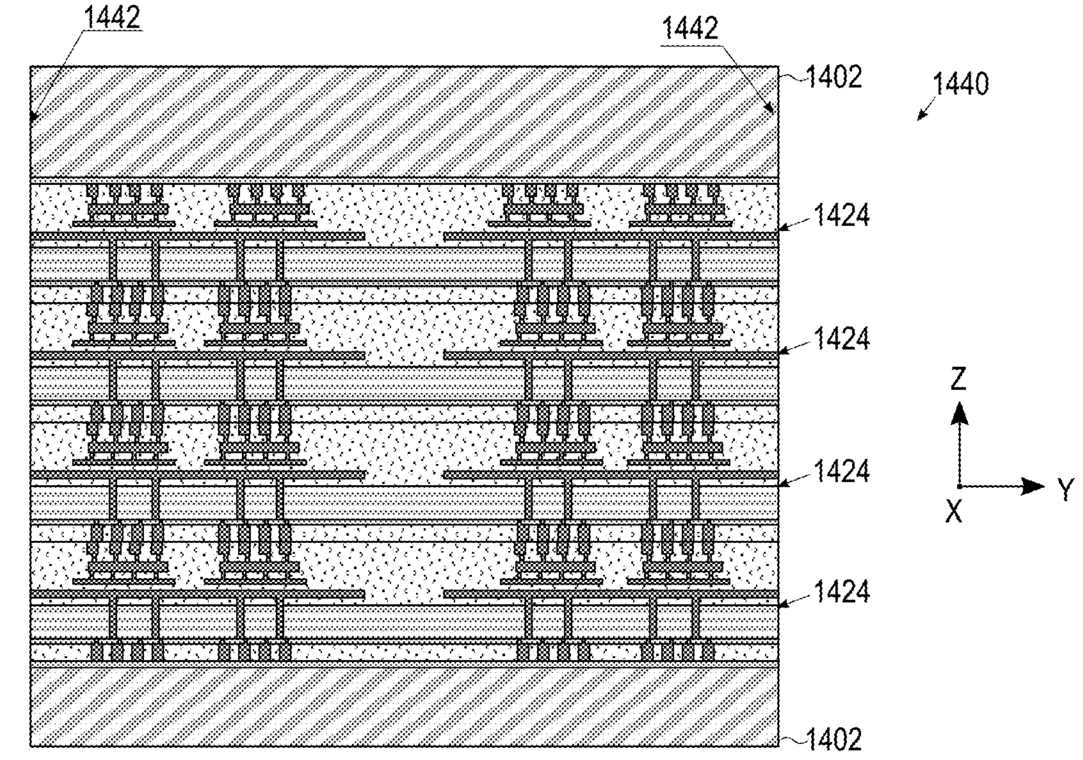

FIG. 14D is a simplified cross-sectional view subsequent to further processing on assembly 1430. A second carrier 1402 may be attached to the surface of the topmost wafer opposite to carrier 1402 in assembly 1430. The stack of tiers 1424 with carriers 1402 on the top and bottom may be singulated (e.g., sliced, cut) vertically into a plurality of stacks. The singulation may be along surfaces 104 (not labeled) of individual IC dies 100 configured to have bond-pads as described in reference to FIG. 1, resulting in cut surfaces 1442, each cut surface 1442 being orthogonal to interfaces between adjacent wafers 1404 (and/or tiers 1424). Each stack 1440 may be as wide (and/or as long) as any one IC die 100. For example, in some embodiments where singulation is performed such that each stack 1440 is as wide any one IC die 100, each stack may be not more than 5 millimeters wide and more than 25 millimeters long (e.g., 50 millimeters long, or 100 millimeters long). In some other embodiments where singulation is performed such that each stack 1440 is as long any one IC die 100, each stack may be more than 5 millimeters wide (e.g., 10 millimeters wide, 20 millimeter wide, etc.) and not more than 25 millimeters long. In yet other embodiments, singulation may be performed such that each stack 1440 is as wide and as long as any one IC die 100, for example, not more than 5 millimeters wide and not more than 25 millimeters long. The thickness of stack 1440 may not be more than 2 millimeters in some embodiments.

Figure 14E:
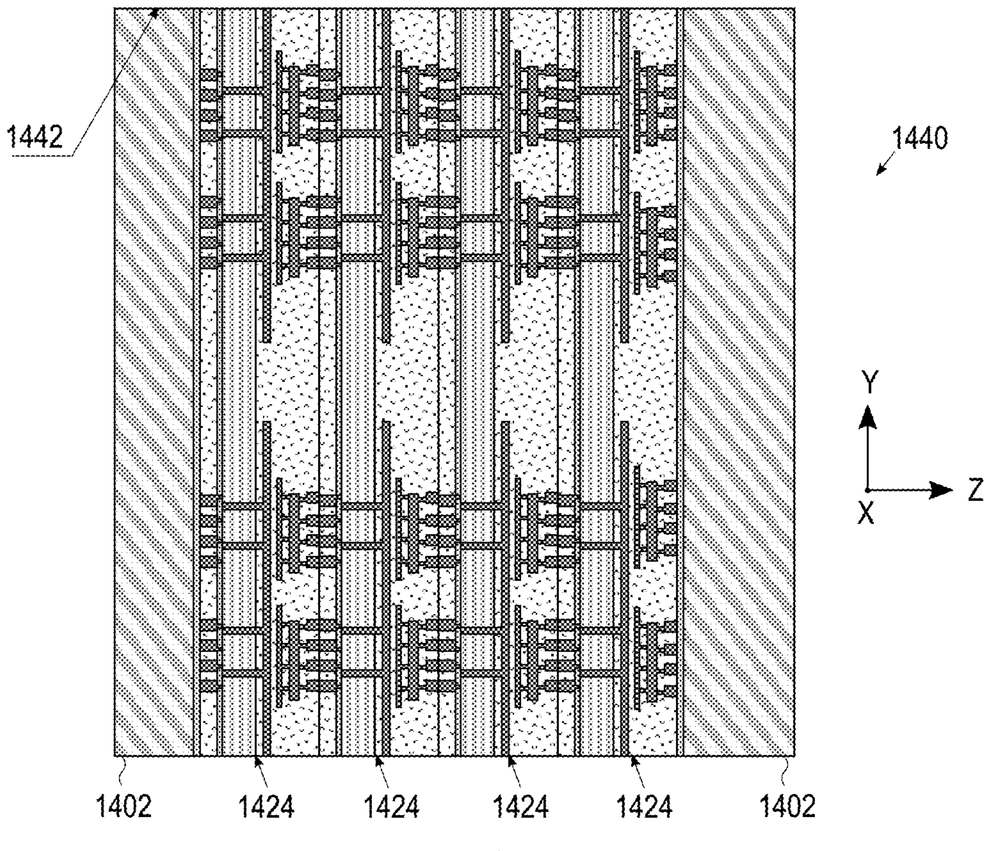

FIG. 14E is a simplified cross-sectional view of stack 1440 subsequent to rotating by ninety degrees such that cut surfaces 1442 are horizontal (e.g., on the top and bottom), and carriers 1402 are on the lateral sides, as also the planar interfaces between adjacent wafers 1404 (or tiers 1424).

Figure 14F:
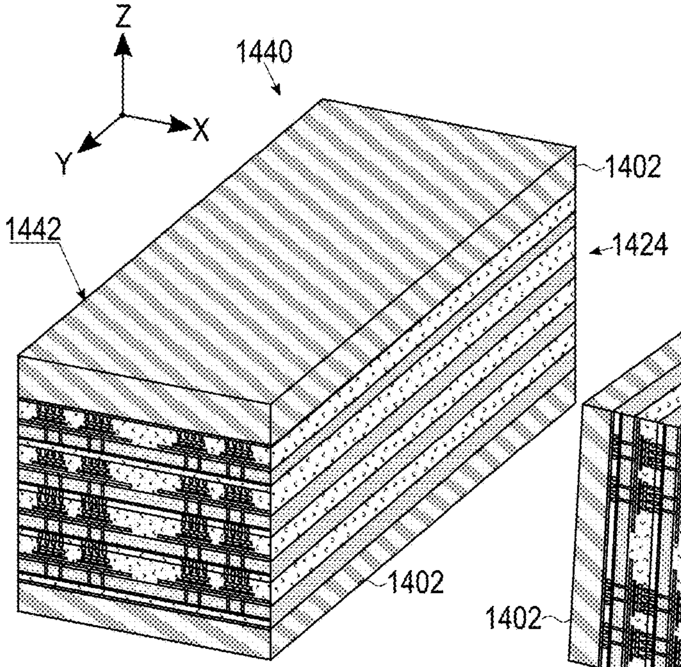
Figure 14G:
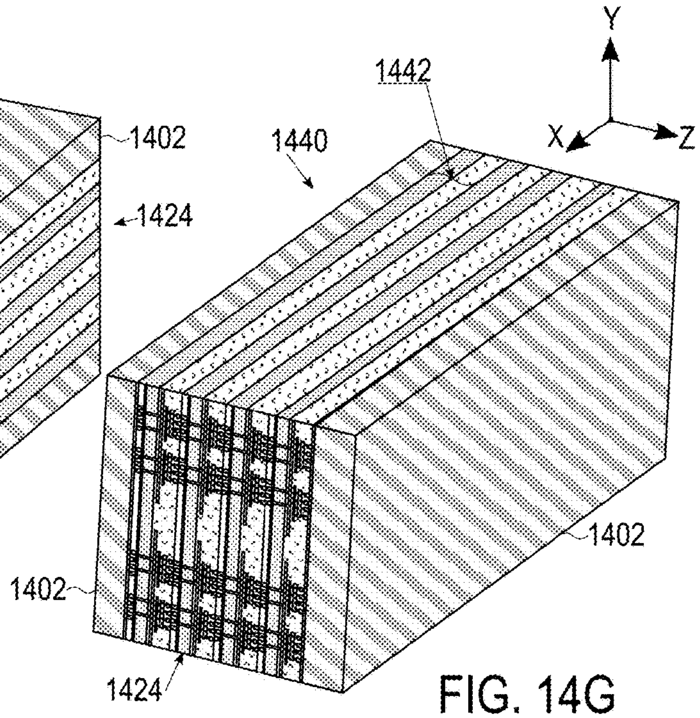

FIGS. 14F and 14G are simplified cut-section perspective views of stack 1440. FIG. 14F shows stack 1440 before rotating by ninety degrees (e.g., as in the orientation shown in FIG. 4D) and FIG. 14G shows stack 1440 after rotating by ninety degrees (e.g., as in the orientation shown in FIG. 4E).

FIG. 14H is a simplified cross-sectional view of an assembly 1450 subsequent to further processing of stack 1440. A plurality of stacks 1440 is attached to a horizontal bonding surface 1452 of another carrier 1402 such that the interfaces between adjacent wafers 1404 (or tiers 1424) are orthogonal to the bonding surface with carrier 1402. In some embodiments, a layer of attachment material 1406 on surface 1452 may facilitate bonding of stacks 1440 on carrier 1402. In such a configuration, cut surfaces 1442 of stacks 1440 are opposite to surface 1452 of carrier 1402.

FIG. 14I is a simplified cross-sectional view of an assembly 1460 subsequent to further processing of assembly 1450. A gap-fill material 1462 may be deposited around the plurality of stacks 1440 over surface 1452 of carrier 1402. Sufficient gap-fill material 1462 may be deposited as to extend across the height of stacks 1440 above surface 1452 such that a continuous horizontal surface, including surfaces 1442 of vertical stacks 1440 and gap-fill material 1462 is exposed opposite to surface 1452 of carrier 1402. The gap-fill material may comprise organic dielectric materials, suitable for a subsequent polishing operation, during which the continuous horizontal surface is planarized to expose bond-pads 124 of individual IC dies 100. As discussed in reference to FIG. 1, each bond-pad 124 is a portion of conductive trace 120 that is exposed on lateral surface 104 of IC die 100.

Figure 14:
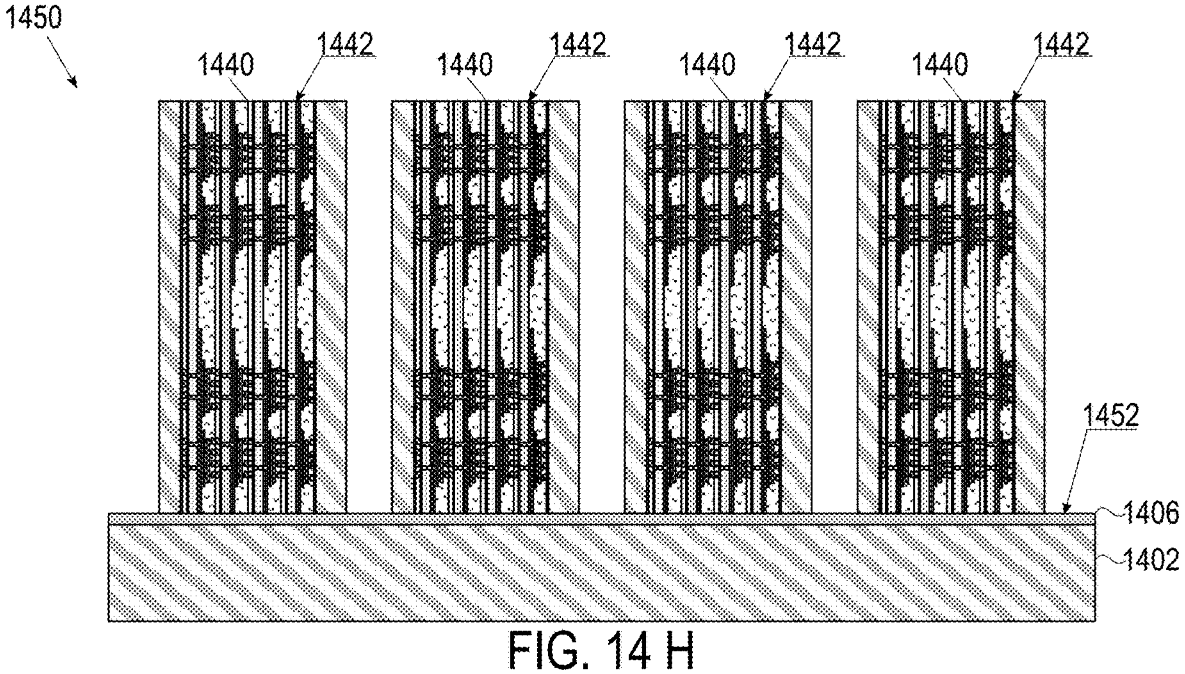
Figure 14:
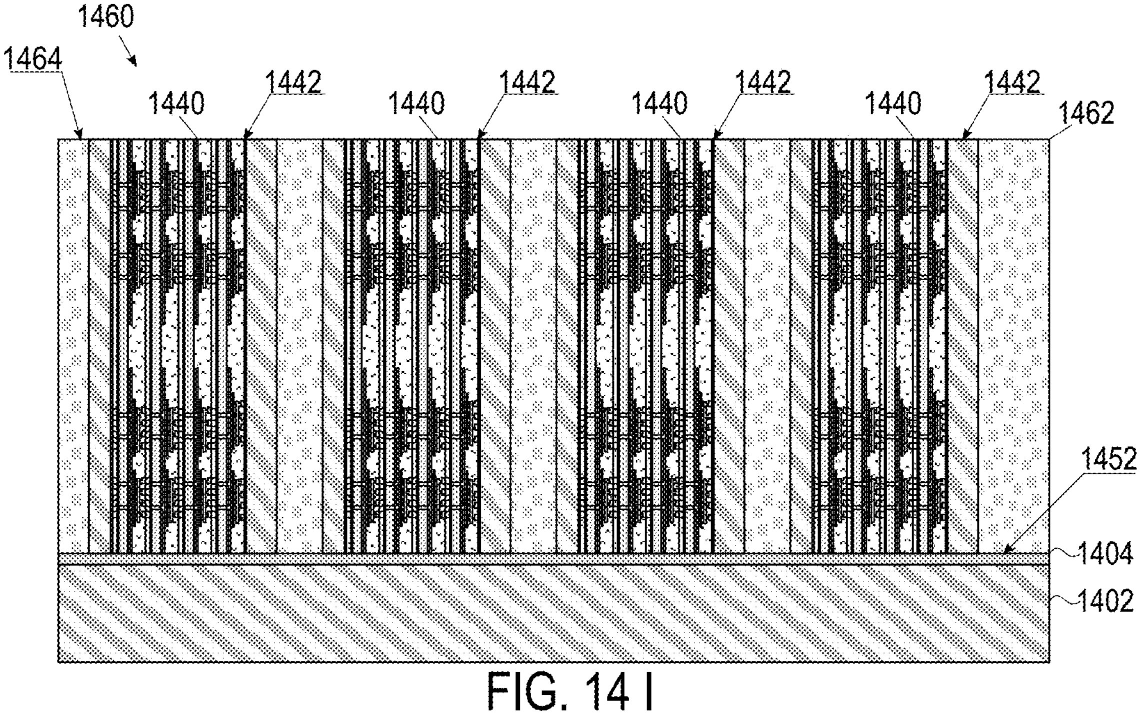
Figure 14J:
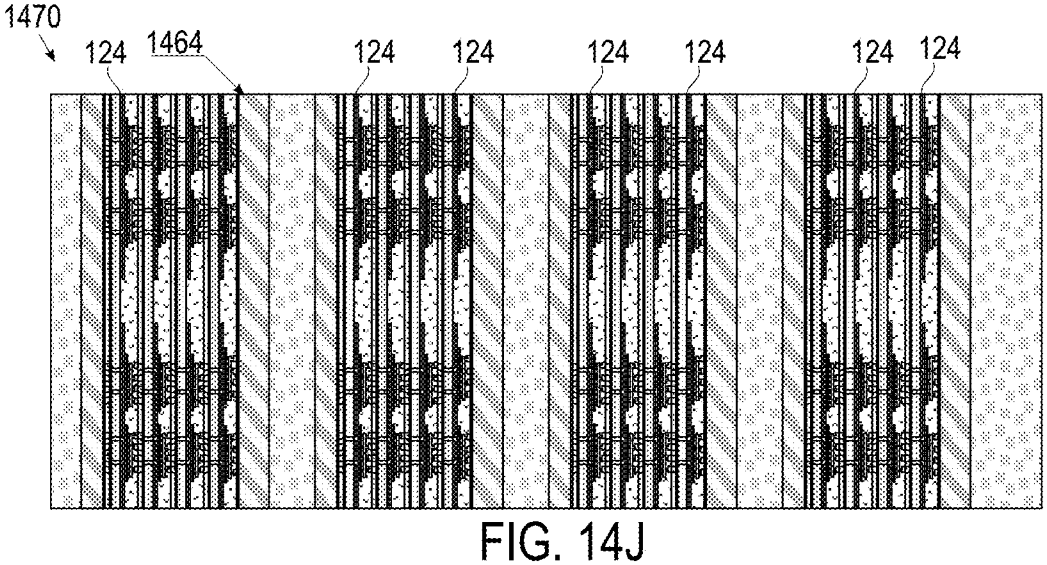

FIG. 14J is a simplified cross-sectional view of an assembly 1470 subsequent to further processing of assembly 1460, in which horizontal carrier 1402 is debonded by any means known in the art. In some embodiments, stacks 1440 may be rotated by 180 degrees so that the surface previously bonded to horizontal carrier 1402 is exposed on the top. Horizontal carrier 1402 may be attached to the planarized surface and the planarization of the top surface performed to expose bond-pads thereon. In some embodiments, this second planarization process may be dispensed with, depending on the final configuration of IC dies 100 in microelectronic assembly 300.

In some embodiments, assembly 1470 may be singulated further so that each stack is as wide and as long as individual IC dies. For example, in a previous operation, as described in reference to FIG. 14D, if stack 1440 was formed by singulating along the widths of IC dies 100, in the operation as described herein, the singulation is performed along the lengths of IC dies 100; on the other hand, in a previous operation, as described in reference to FIG. 14D, if stack 1440 was formed by singulating along the lengths of IC dies 100, in the operation as described herein, the singulation is performed along the widths of IC dies 100. In embodiments where assembly 1470 comprises stacks 1440 that are as wide and as long as IC dies 100 (e.g., not more than 5 millimeters wide and not more than 25 millimeters long in some embodiments), no further singulation may be performed at this stage of the operations.

In some embodiments, the stacks may be subjected to planarization of all the cut surfaces such that all four lateral surfaces and corresponding edges of any IC die 100 are planarized, and bond-pads 124 are exposed thereon, for example, as described in reference to FIG. 6. Subsequently, gap-fill material 1602 may be removed, for example, by etching with a cleansing agent, and carriers 1402 on individual stacks may be debonded.

Figure 14K:
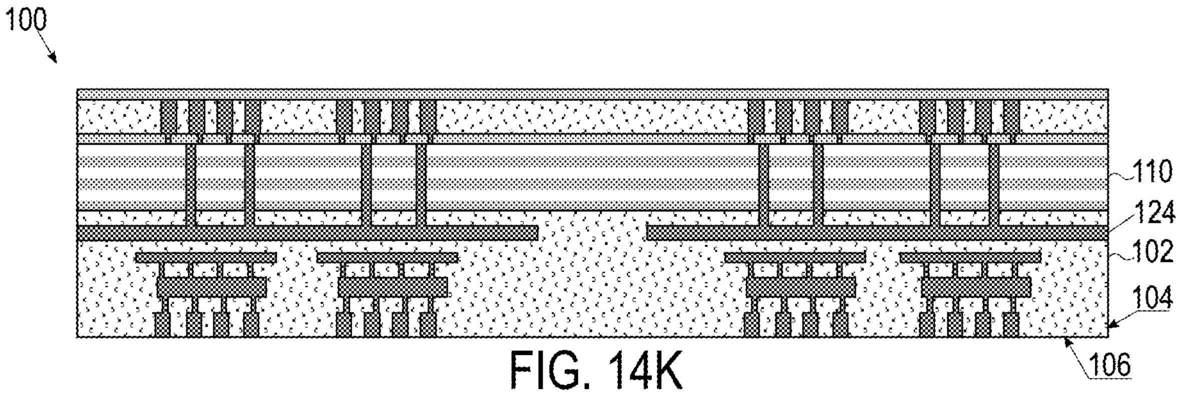

FIG. 14K shows an individual IC die 100 at the end of processing as described in reference to the previous figures FIGS. 1-13. Each individual IC die 100 may be separated from other IC dies within stack 1440 by suitable means known in the art. The separation may comprise destroying (e.g., sacrificing) interface layer 1414 while separating IC dies 100 from each other, for example, by chemical mechanical polishing (CMP) of interface layer 1414. In some embodiments, interface layer 1414 on an edge die (e.g., topmost or bottom-most) in stack 1440 may be retained, whereas interface layer 1414 may be removed from other dies in stack 1440. Interface layer 1414 is retained in some IC dies, for example, in scenarios where such IC dies are bonded to other components, carriers, bulk silicon, and the like, so that bond-pads may be desired on a top (or bottom) surface for further processing, as desired and based on particular needs.

Figure 15A:
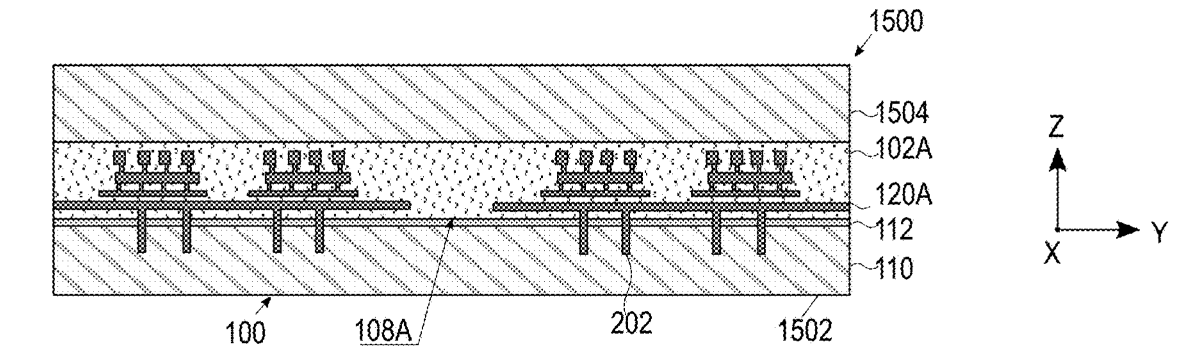
FIGS. 15A-15C are schematic cross-sectional views of various stages of manufacture of an example microelectronic assembly according to some embodiments of the present disclosure.
Figure 15B:
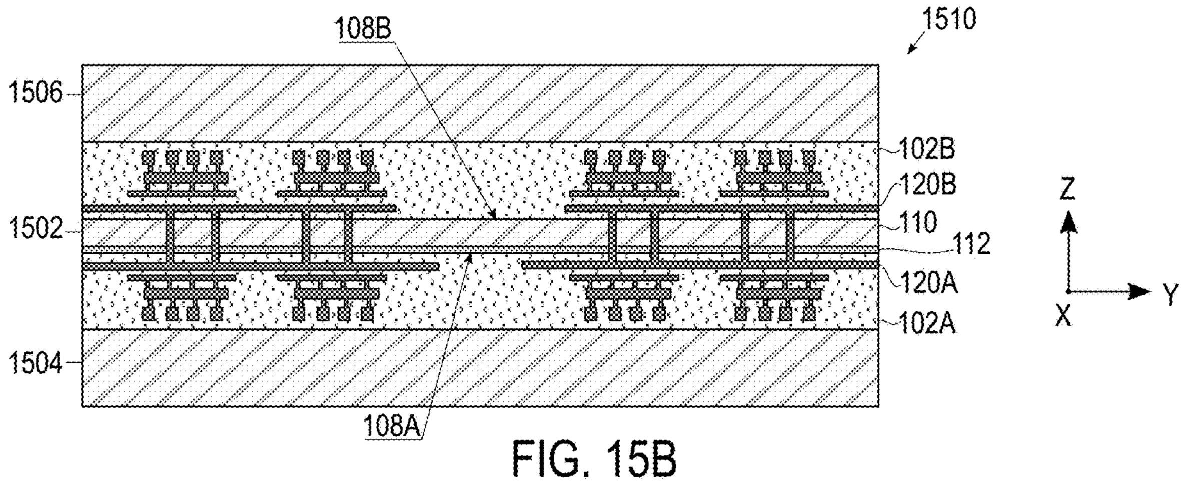
Figure 15C:
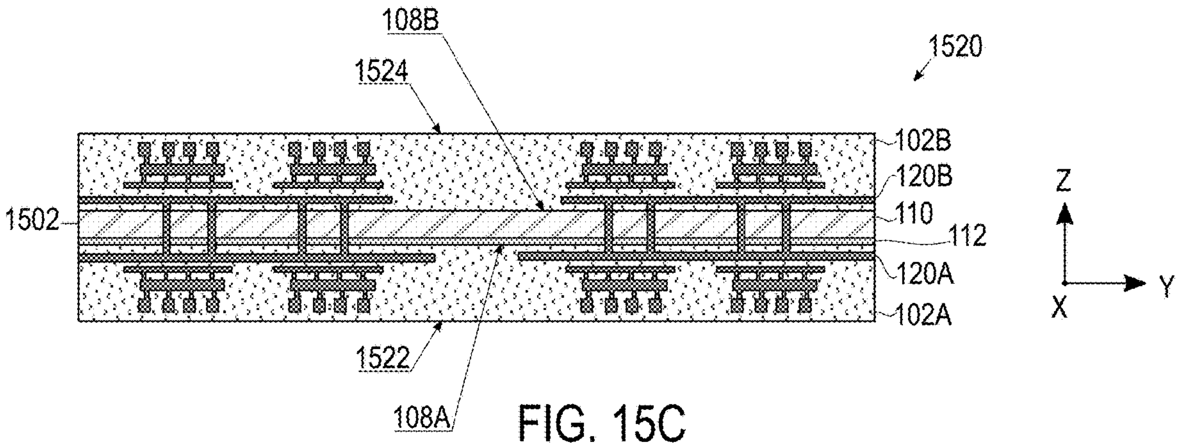

FIGS. 15A-15C are schematic cross-sectional views of various stages of manufacture of an example microelectronic assembly according to some embodiments of the present disclosure. FIG. shows an assembly 1500 comprising a wafer 1502 including a plurality of IC dies 100, each IC die 100 having substrate 110 with TSVs 202 in substrate 110. In some embodiments, such plurality of IC dies 100 may be fabricated on wafer 1502 directly. In other embodiments, known good IC dies 100 fabricated separately may be attached to wafer 1502 to create a reconstituted wafer thereof. In some embodiments, IC dies 100 may be fabricated with metallization stack 102A before attaching to wafer 1502. In some other embodiments, IC dies 100 may be fabricated on wafer 1502 and then metallization stack 102A may be fabricated thereon. In yet other embodiments (as shown), another wafer 1504 comprising metallization stack 102A may be coupled to wafer 1502, for example, by way of an interface layer (not shown) comprising conductive traces and/or vias in a layer of silicon oxide. In all such embodiments, metallization stack 102A may be coupled to substrate 110 along first planar interface 108A.

FIG. 15B shows an assembly 1510 subsequent to further processing on assembly 1500. Assembly 1500 may be turned over, and wafer 1502 may be planarized to expose surfaces of TSVs 202 in substrate 110. Second metallization stack 102B may be formed on the planarized surface, thereby coupling metallization stack 102B with substrate 110 along second planar surface 108B, parallel to first planar surface 108A. coupling a second metallization stack to the substrate along a second planar interface parallel to the first planar interface on an opposing side of the substrate. In some embodiments, second metallization stack 102B may be formed sequentially (e.g., layer by layer) on planarized surface of assembly 1500; in some other embodiments (as shown), second metallization stack 102B may be formed separately on yet another wafer 1506 and bonded to planarized surface of assembly 1500 along second planar interface 108B. Second metallization stack 102B may be coupled to substrate 110 such that conductive traces 120B in second metallization stack 102B are conductively coupled to conductive traces 120A in first metallization stack 102A by TSVs 202.

FIG. 15C shows an assembly 1520 subsequent to further processing on assembly 1510. Wafers 1504 and 1506 may be removed from assembly 1510, for example, by slicing followed by CMP to expose surfaces 1522 and 1524 of assembly 1520. Thereafter, the operations described in reference to FIG. 14 may be performed. For example, in some embodiments, assembly 1520 may be bonded to carrier 1402 on surface 1522, exposing surface 1524 for further processing. A plurality of wafers may be coupled together sequentially over surface 1524 to form a stack of wafers.

Another carrier 1402 may be coupled to a surface of the topmost wafer opposite to the first carrier as described in reference to FIG. 14D. The assembly may be singulated vertically to form plurality of stacks 1440 along surfaces 104 of IC dies 100 (e.g., configured to have bond-pads 124), such that each stack 1440 is as wide (or as long) as any one IC die 100. Thereafter, each stack 1440 may be rotated by ninety degrees such that carriers 1402 are oriented vertically and the interfaces between adjacent wafers are vertical, as described in reference to FIGS. 14E-14G. The plurality of stacks 1440 may be attached to a horizontal bonding surface of another carrier 1402 such that the interfaces between adjacent wafers are orthogonal to the bonding surface of carrier 1402, as described in reference to FIG. 14H. Dielectric material 1462 may be deposited around plurality of stacks 1440 over the bonding surface of carrier 1402 such that continuous horizontal surface 1464 is exposed opposite to carrier 1402, as described in reference to FIG. 14I. Continuous horizontal surface 1464 may be planarized (e.g., by CMP), to expose bond-pads 124 of IC dies 100, as described in reference to FIG. 14J. Thereafter, dielectric material 1462 may be removed, and individual IC dies 100 may be separated from each stack 1440, as described in reference to FIG. 14K.

Although FIGS. 14-15 illustrates various operations performed in a particular order, this is simply illustrative and the operations discussed herein may be reordered and/or repeated as suitable. Further, additional processes which are not illustrated may also be performed without departing from the scope of the present disclosure. Also, various ones of the operations discussed herein with respect to FIGS. 14-15 may be modified in accordance with the present disclosure to fabricate others of microelectronic package 300 disclosed herein. Although various operations are illustrated in FIGS. 14-15 once each, the operations may be repeated as often as desired. For example, one or more operations may be performed in parallel to manufacture and test multiple microelectronic packages substantially simultaneously. In another example, the operations may be performed in a different order to reflect the structure of a particular microelectronic package in which one or more substrates or other components as described herein may be included.

Furthermore, the operations illustrated in FIGS. 14-15 may be combined or may include more details than described. For example, the operations may be modified suitably without departing from the scope of the disclosure for IC dies 100 that do not have a semiconductor substrate, but rather, are fabricated on other materials, such as glass or ceramic materials. Still further, the various operations shown and described may further include other manufacturing operations related to fabrication of other components of the microelectronic assemblies described herein, or any devices that may include the microelectronic assemblies as described herein. For example, the operations not shown in FIGS. 14-15 may include various cleaning operations, additional surface planarization operations, operations for surface roughening, operations to include barrier and/or adhesion layers as desired, and/or operations for incorporating microelectronic packages as described herein in, or with, an IC component, a computing device, or any desired structure or device.

Example Devices and Components

Figure 16:
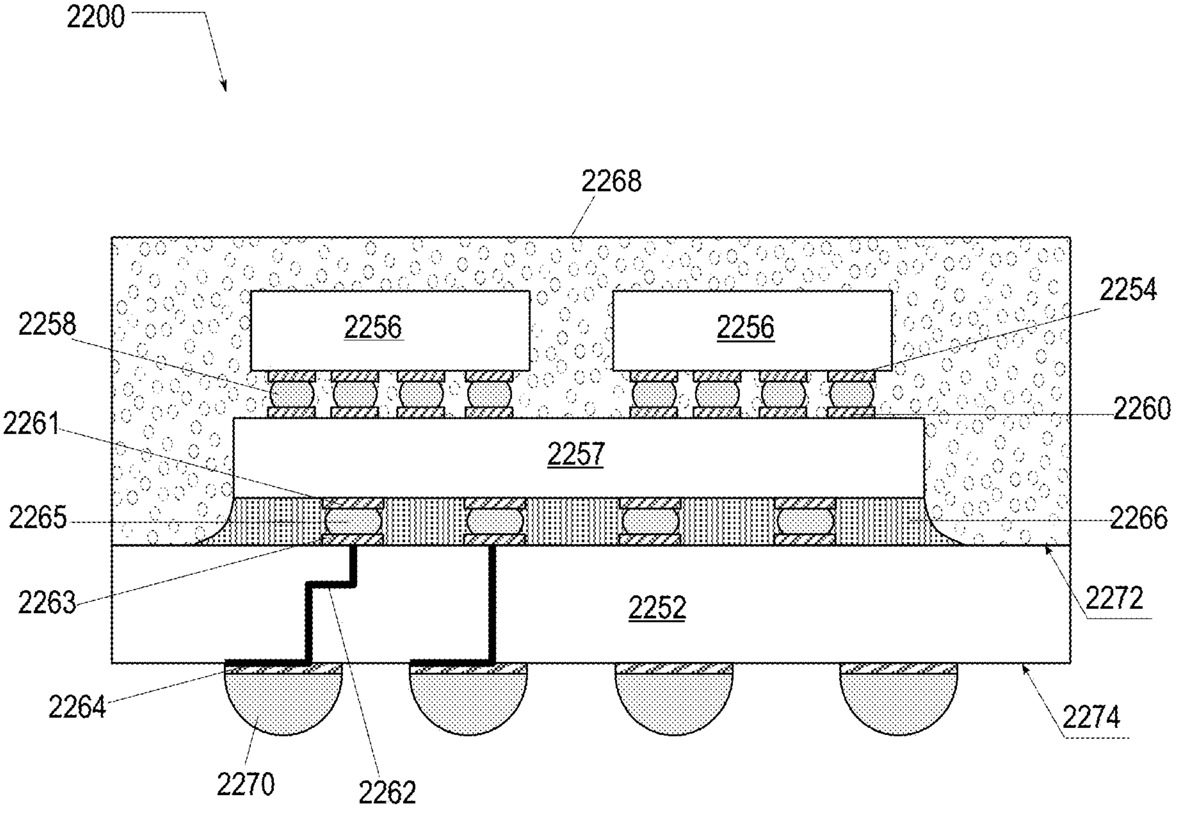
FIG. 16 is a cross-sectional view of a device package that includes one or more microelectronic assemblies in accordance with any of the embodiments disclosed herein.
Figure 17:
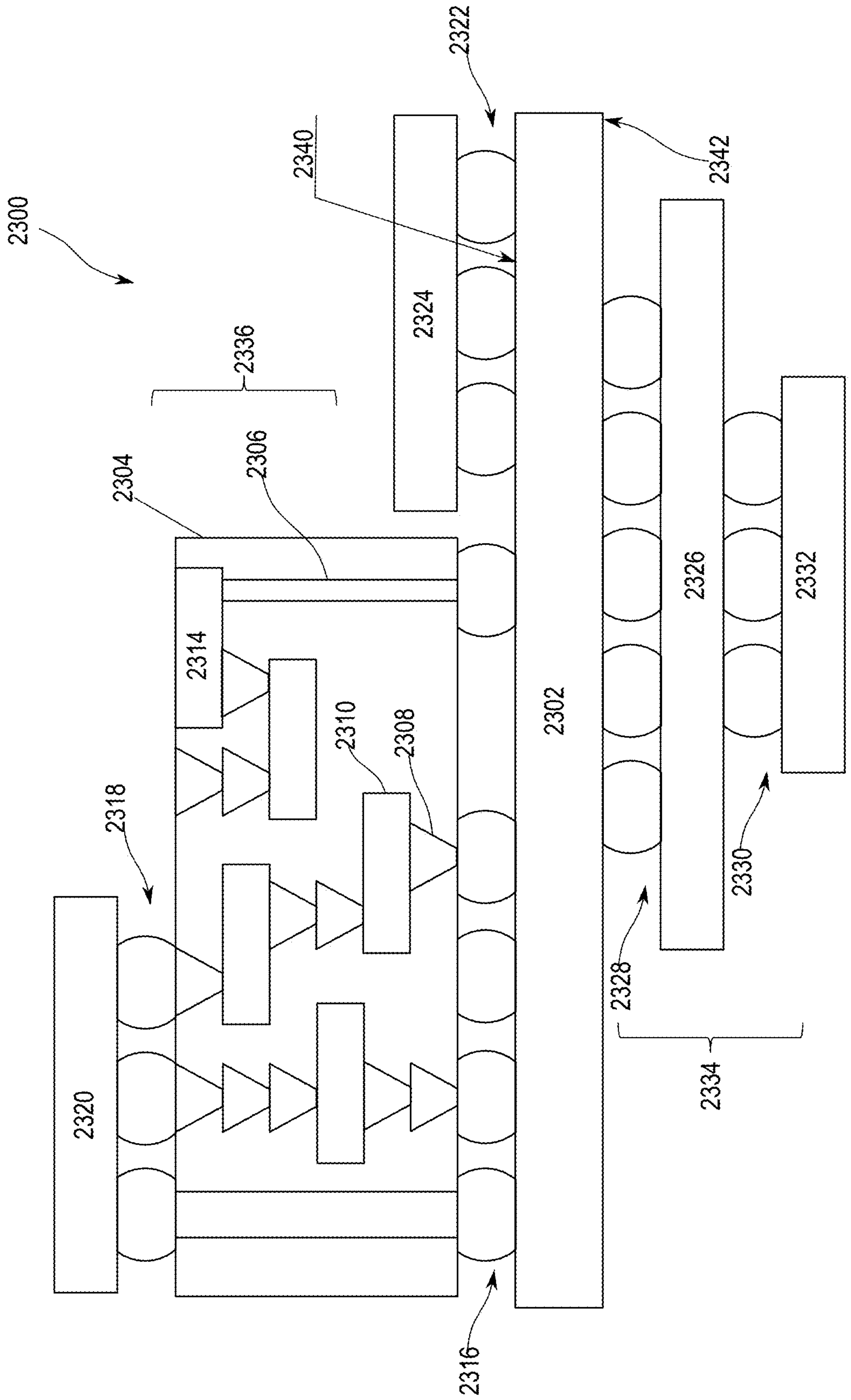
FIG. 17 is a cross-sectional side view of a device assembly that includes one or more microelectronic assemblies in accordance with any of the embodiments disclosed herein.
Figure 18:
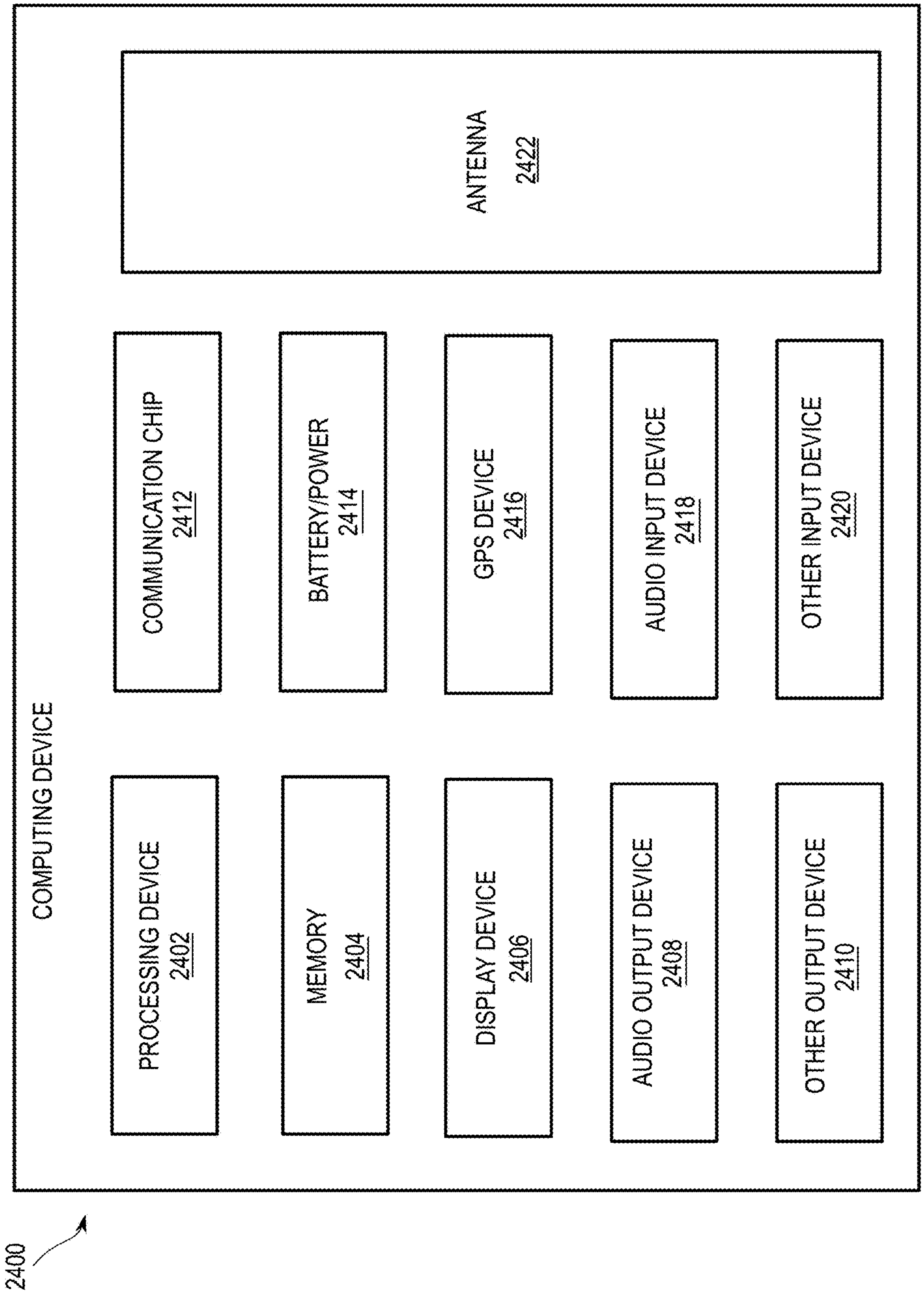
FIG. 18 is a block diagram of an example computing device that includes one or more microelectronic assemblies in accordance with any of the embodiments disclosed herein.

The packages disclosed herein, e.g., any of the embodiments shown in FIGS. 1-15 or any further embodiments described herein, may be included in any suitable electronic component. FIGS. 16-18 illustrate various examples of packages, assemblies, and devices that may be used with or include any of the IC packages as disclosed herein.

FIG. 16 is a side, cross-sectional view of an example IC package 2200 that may include IC packages in accordance with any of the embodiments disclosed herein. In some embodiments, the IC package 2200 may be a SiP.

As shown in the figure, package substrate 2252 may be formed of an insulator (e.g., a ceramic, a buildup film, an epoxy film having filler particles therein, etc.), and may have conductive pathways extending through the insulator between first face 2272 and second face 2274, or between different locations on first face 2272, and/or between different locations on second face 2274. These conductive pathways may take the form of any of the interconnect structures comprising lines and/or vias.

Package substrate 2252 may include conductive contacts 2263 that are coupled to conductive pathway 2262 through package substrate 2252, allowing circuitry within dies 2256 and/or interposer 2257 to electrically couple to various ones of conductive contacts 2264 (or to other devices included in package substrate 2252, not shown).

IC package 2200 may include interposer 2257 coupled to package substrate 2252 via conductive contacts 2261 of interposer 2257, first-level interconnects 2265, and conductive contacts 2263 of package substrate 2252. First-level interconnects 2265 illustrated in the figure are solder bumps, but any suitable first-level interconnects 2265 may be used, such as solder bumps, solder posts, or bond wires.

IC package 2200 may include one or more dies 2256 coupled to interposer 2257 via conductive contacts 2254 of dies 2256, first-level interconnects 2258, and conductive contacts 2260 of interposer 2257. Conductive contacts 2260 may be coupled to conductive pathways (not shown) through interposer 2257, allowing circuitry within dies 2256 to electrically couple to various ones of conductive contacts 2261 (or to other devices included in interposer 2257, not shown). First-level interconnects 2258 illustrated in the figure are solder bumps, but any suitable first-level interconnects 2258 may be used, such as solder bumps, solder posts, or bond wires. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, underfill material 2266 may be disposed between package substrate 2252 and interposer 2257 around first-level interconnects 2265, and mold 2268 may be disposed around dies 2256 and interposer 2257 and in contact with package substrate 2252. In some embodiments, underfill material 2266 may be the same as mold 2268. Example materials that may be used for underfill material 2266 and mold 2268 are epoxies as suitable. Second-level interconnects 2270 may be coupled to conductive contacts 2264. Second-level interconnects 2270 illustrated in the figure are solder balls (e.g., for a ball grid array (BGA) arrangement), but any suitable second-level interconnects 2270 may be used (e.g., pins in a pin grid array arrangement or lands in a land grid array arrangement). Second-level interconnects 2270 may be used to couple IC package 2200 to another component, such as a circuit board (e.g., a motherboard), an interposer, or another IC package, as known in the art and as discussed below with reference to FIG. 17.

In various embodiments, any of dies 2256 may be microelectronic assembly 300 as described herein. In embodiments in which IC package 2200 includes multiple dies 2256, IC package 2200 may be referred to as a multi-chip package (MCP). Dies 2256 may include circuitry to perform any desired functionality. For example, besides one or more of dies 2256 being microelectronic assembly 300 as described herein, one or more of dies 2256 may be logic dies (e.g., silicon-based dies), one or more of dies 2256 may be memory dies (e.g., HBM), etc. In some embodiments, any of dies 2256 may be implemented as discussed with reference to any of the previous figures. In some embodiments, at least some of dies 2256 may not include implementations as described herein.

Although IC package 2200 illustrated in the figure is a flip-chip package, other package architectures may be used. For example, IC package 2200 may be a BGA package, such as an embedded wafer-level ball grid array (eWLB) package. In another example, IC package 2200 may be a wafer-level chip scale package (WLCSP) or a panel fan-out (FO) package. Although two dies 2256 are illustrated in IC package 2200, IC package 2200 may include any desired number of dies 2256. IC package 2200 may include additional passive components, such as surface-mount resistors, capacitors, and inductors disposed over first face 2272 or second face 2274 of package substrate 2252, or on either face of interposer 2257. More generally, IC package 2200 may include any other active or passive components known in the art.

In some embodiments, no interposer 2257 may be included in IC package 2200; instead, dies 2256 may be coupled directly to conductive contacts 2263 at first face 2272 by first-level interconnects 2265.

FIG. 17 is a cross-sectional side view of an IC device assembly 2300 that may include components having one or more microelectronic assembly 300 in accordance with any of the embodiments disclosed herein. IC device assembly 2300 includes a number of components disposed over a circuit board 2302 (which may be, e.g., a motherboard). IC device assembly 2300 includes components disposed over a first face 2340 of circuit board 2302 and an opposing second face 2342 of circuit board 2302; generally, components may be disposed over one or both faces 2340 and 2342. In particular, any suitable ones of the components of IC device assembly 2300 may include any of the one or more microelectronic assembly 300 in accordance with any of the embodiments disclosed herein; e.g., any of the IC packages discussed below with reference to IC device assembly 2300 may take the form of any of the embodiments of IC package 2200 discussed above with reference to FIG. 16.

In some embodiments, circuit board 2302 may be a PCB including multiple metal layers separated from one another by layers of insulator and interconnected by electrically conductive vias. Any one or more of the metal layers may be formed in a desired circuit pattern to route electrical signals (optionally in conjunction with other metal layers) between the components coupled to circuit board 2302. In other embodiments, circuit board 2302 may be a non-PCB package substrate.

As illustrated in the figure, in some embodiments, IC device assembly 2300 may include a package-on-interposer structure 2336 coupled to first face 2340 of circuit board 2302 by coupling components 2316. Coupling components 2316 may electrically and mechanically couple package-on-interposer structure 2336 to circuit board 2302, and may include solder balls (as shown), male and female portions of a socket, an adhesive, an underfill material, and/or any other suitable electrical and/or mechanical coupling structure.

Package-on-interposer structure 2336 may include IC package 2320 coupled to interposer 2304 by coupling components 2318. Coupling components 2318 may take any suitable form depending on desired functionalities, such as the forms discussed above with reference to coupling components 2316. In some embodiments, IC package 2320 may be or include IC package 2200, e.g., as described above with reference to FIG. 16. In some embodiments, IC package 2320 may include at least one microelectronic assembly 300 as described herein. Microelectronic assembly 300 is not specifically shown in the figure in order to not clutter the drawing.

Although a single IC package 2320 is shown in the figure, multiple IC packages may be coupled to interposer 2304; indeed, additional interposers may be coupled to interposer 2304. Interposer 2304 may provide an intervening package substrate used to bridge circuit board 2302 and IC package 2320. Generally, interposer 2304 may redistribute a connection to a wider pitch or reroute a connection to a different connection. For example, interposer 2304 may couple IC package 2320 to a BGA of coupling components 2316 for coupling to circuit board 2302.

In the embodiment illustrated in the figure, IC package 2320 and circuit board 2302 are attached to opposing sides of interposer 2304. In other embodiments, IC package 2320 and circuit board 2302 may be attached to a same side of interposer 2304. In some embodiments, three or more components may be interconnected by way of interposer 2304.

Interposer 2304 may be formed of an epoxy resin, a fiberglass-reinforced epoxy resin, a ceramic material, or a polymer material such as polyimide. In some implementations, interposer 2304 may be formed of alternate rigid or flexible materials that may include the same materials described above for use in a semiconductor substrate, such as silicon, germanium, and other group III-V and group IV materials. Interposer 2304 may include metal interconnects 2308 and vias 2310, including but not limited to TSVs 2306. Interposer 2304 may further include embedded devices 2314, including both passive and active devices. Such devices may include, but are not limited to, capacitors, decoupling capacitors, resistors, inductors, fuses, diodes, transformers, sensors, ESD devices, and memory devices. More complex devices such as radio frequency (RF) devices, power amplifiers, power management devices, antennas, arrays, sensors, and microelectromechanical systems (MEMS) devices may also be formed on interposer 2304. Package-on-interposer structure 2336 may take the form of any of the package-on-interposer structures known in the art.

In some embodiments, IC device assembly 2300 may include an IC package 2324 coupled to first face 2340 of circuit board 2302 by coupling components 2322. Coupling components 2322 may take the form of any of the embodiments discussed above with reference to coupling components 2316, and IC package 2324 may take the form of any of the embodiments discussed above with reference to IC package 2320.

In some embodiments, IC device assembly 2300 may include a package-on-package structure 2334 coupled to second face 2342 of circuit board 2302 by coupling components 2328. Package-on-package structure 2334 may include an IC package 2326 and an IC package 2332 coupled together by coupling components 2330 such that IC package 2326 is disposed between circuit board 2302 and IC package 2332. Coupling components 2328 and 2330 may take the form of any of the embodiments of coupling components 2316 discussed above, and IC packages 2326 and/or 2332 may take the form of any of the embodiments of IC package 2320 discussed above. Package-on-package structure 2334 may be configured in accordance with any of the package-on-package structures known in the art.

FIG. 18 is a block diagram of an example computing device 2400 that may include one or more components having one or more IC packages in accordance with any of the embodiments disclosed herein. For example, any suitable ones of the components of computing device 2400 may include a microelectronic assembly (e.g., 100) in accordance with any of the embodiments disclosed herein. In another example, any one or more of the components of computing device 2400 may include any embodiments of IC package 2200 (e.g., as shown in FIG. 16). In yet another example, any one or more of the components of computing device 2400 may include an IC device assembly 2300 (e.g., as shown in FIG. 17).

A number of components are illustrated in the figure as included in computing device 2400, but any one or more of these components may be omitted or duplicated, as suitable for the application. In some embodiments, some or all of the components included in computing device 2400 may be attached to one or more motherboards. In some embodiments, some or all of these components are fabricated onto a single system-on-chip (SOC) die.

Additionally, in various embodiments, computing device 2400 may not include one or more of the components illustrated in the figure, but computing device 2400 may include interface circuitry for coupling to the one or more components. For example, computing device 2400 may not include a display device 2406, but may include display device interface circuitry (e.g., a connector and driver circuitry) to which display device 2406 may be coupled. In another set of examples, computing device 2400 may not include an audio input device 2418 or an audio output device 2408, but may include audio input or output device interface circuitry (e.g., connectors and supporting circuitry) to which audio input device 2418 or audio output device 2408 may be coupled.

Computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. Processing device 2402 may include one or more DSPs, ASICs, CPUs, GPUs, cryptoprocessors (specialized processors that execute cryptographic algorithms within hardware), server processors, or any other suitable processing devices. Computing device 2400 may include a memory 2404, which may itself include one or more memory devices such as volatile memory (e.g., dynamic random access memory (DRAM)), nonvolatile memory (e.g., read-only memory (ROM)), flash memory, solid-state memory, and/or a hard drive. In some embodiments, memory 2404 may include memory that shares a die with processing device 2402. This memory may be used as cache memory and may include embedded dynamic random access memory (eDRAM) or spin transfer torque magnetic random access memory (STT-MRAM).

In some embodiments, computing device 2400 may include a communication chip 2412 (e.g., one or more communication chips). For example, communication chip 2412 may be configured for managing wireless communications for the transfer of data to and from computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), LTE project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 2412 may operate in accordance with other wireless protocols in other embodiments. Computing device 2400 may include an antenna 2422 to facilitate wireless communications and/or to receive other wireless communications (such as AM or FM radio transmissions).

In some embodiments, communication chip 2412 may manage wired communications, such as electrical, optical, or any other suitable communication protocols (e.g., the Ethernet). As noted above, communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

Computing device 2400 may include battery/power circuitry 2414. Battery/power circuitry 2414 may include one or more energy storage devices (e.g., batteries or capacitors) and/or circuitry for coupling components of computing device 2400 to an energy source separate from computing device 2400 (e.g., AC line power).

Computing device 2400 may include a display device 2406 (or corresponding interface circuitry, as discussed above). Display device 2406 may include any visual indicators, such as a heads-up display, a computer monitor, a projector, a touchscreen display, a liquid crystal display (LCD), a light-emitting diode display, or a flat panel display, for example.

Computing device 2400 may include audio output device 2408 (or corresponding interface circuitry, as discussed above). Audio output device 2408 may include any device that generates an audible indicator, such as speakers, headsets, or earbuds, for example.

Computing device 2400 may include audio input device 2418 (or corresponding interface circuitry, as discussed above). Audio input device 2418 may include any device that generates a signal representative of a sound, such as microphones, microphone arrays, or digital instruments (e.g., instruments having a musical instrument digital interface (MIDI) output).

Computing device 2400 may include a GPS device 2416 (or corresponding interface circuitry, as discussed above). GPS device 2416 may be in communication with a satellite-based system and may receive a location of computing device 2400, as known in the art.

Computing device 2400 may include other output device 2410 (or corresponding interface circuitry, as discussed above). Examples of other output device 2410 may include an audio codec, a video codec, a printer, a wired or wireless transmitter for providing information to other devices, or an additional storage device.

Computing device 2400 may include other input device 2420 (or corresponding interface circuitry, as discussed above). Examples of other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, computing device 2400 may be any other electronic device that processes data.

Select Examples

The following paragraphs provide various examples of the embodiments disclosed herein.

Example 1 provides an IC die (e.g., 100), comprising (e.g., FIG. 1): a first region (e.g., 102) having a first surface (e.g., 104) and a second surface (e.g., 106), the first surface being orthogonal to the second surface; and a second region (e.g., 110, 112) attached to the first region along a planar interface (e.g., 108) that is orthogonal to the first surface and parallel to the second surface, the second region having a third surface (e.g., 114) coplanar with the first surface; in which: the first region comprises: a dielectric material (e.g., 116); a plurality of layers (e.g., 118) of conductive traces (e.g., 120) in the dielectric material, each layer of the conductive traces being parallel to the second surface such that the conductive traces are orthogonal to the first surface; conductive vias (e.g., 122) through the dielectric material, the conductive vias being orthogonal to the conductive traces; and bond-pads (e.g., 124) on the first surface, the bond-pads comprising portions of the conductive traces exposed on the first surface, and the second region comprises a material different from the dielectric material.

Example 2 provides the IC die of example 1, in which the second region comprises a semiconductor material.

Example 3 provides the IC die of any one of examples 1-2, further comprising (e.g., FIG. 2) a TSV (e.g., 202) in the second region.

Example 4 provides the IC die of any one of examples 1-3, in which the second region comprises at least one of a transistor and a diode (e.g., 204) proximate to the planar interface between the first region and the second region.

Example 5 provides the IC die of any one of examples 1-3, in which the second region does not comprise any transistors or diodes.

Example 6 provides the IC die of any one of examples 1-5, in which the first surface is flat and planar with surface roughness less than 10 Angstroms and TTV across the first surface of less than 3 micrometers.

Example 7 provides the IC die of example 6, in which a surface opposite to the first surface and orthogonal to the second surface, is flat and planar with surface roughness less than 10 Angstroms and TTV across the first surface of less than 3 micrometers.

Example 8 provides the IC die of any one of examples 1-7, in which the bond-pads have different sizes (e.g., 124A, 124B).

Example 9 provides the IC die of any one of examples 1-8, in which (e.g., FIG. 6) the bond-pads comprise first bond-pads, and the first region further comprises second bond-pads on the second surface.

Example 10 provides the IC die of any one of examples 1-9, in which the plurality of layers of conductive traces comprises between 2 layers and 6 layers.

Example 11 provides the IC die of any one of examples 1-10, in which each layer in the plurality of layers of conductive traces is between 3 micrometers and 5 micrometers thick.

Example 12 provides the IC die of any one of examples 1-11, in which: a linear dimension of a largest one of the bond-pads is less than 5 micrometers, and a pitch between adjacent bond-pads is less than 9 micrometers.

Example 13 provides the IC die of any one of examples 1-12, in which: the IC die is less than 100 micrometers along a first axis, less than 35 millimeters along a second axis orthogonal to the first axis, and less than 5 millimeters along a third axis orthogonal to the first axis and the second axis, and the first axis is parallel to the first surface and perpendicular to the second surface.

Example 14 provides the IC die of any one of examples 1-13, in which the dielectric material comprises a compound including silicon and oxygen.

Example 15 provides the IC die of any one of examples 1-14, in which the bond-pads comprise copper.

Example 16 provides the IC die of any one of examples 1-15, in which edges of the first surface and the second surface are planarized.

Example 17 provides the IC die of any one of examples 1-16, in which the first region further comprises (e.g., FIG. 6): bond-pads on the second surface (e.g., 108); bond-pads on a fourth surface (e.g., 602), the fourth surface orthogonal to the first surface (e.g., 104) and the second surface (e.g., 106); bond-pads on a fifth surface (e.g., 604), the fifth surface parallel to the first surface and orthogonal to the second surface and the fifth surface; and bond-pads on a sixth surface (e.g., 606), the sixth surface parallel to the fourth surface and orthogonal to the first surface, the second surface, and the fifth surface.

Example 18 provides the IC die of example 17, in which the first surface, the second surface, the fourth surface, the fifth surface and the sixth surface are flat and planar with surface roughness less than 10 Angstroms and TTV less than 3 micrometers.

Example 19 provides the IC die of any one of examples 17-18, in which the bond-pads on any one of the first surface, the second surface, the fourth surface, the fifth surface and the sixth surface are of different sizes and pitches.

Example 20 provides the IC die of any one of examples 17-18, in which bond-pads on the second surface are of uniform size, and sizes of the bond-pads on the first surface, the fourth surface, the fifth surface and the sixth surface increase with proximity to the second surface.

Example 21 provides a microelectronic assembly (e.g., 300), comprising (e.g., FIGS. 3A-3B): a first IC die (e.g., 100) coupled to a second IC die (e.g., 302) by interconnects (e.g., 304) on a first surface (e.g., 104) of the first IC die and a second surface (e.g., 306) of the second IC die such that the first surface is in contact with the second surface, in which: the interconnects comprise dielectric-dielectric bonds and metal-metal bonds, the metal-metal bonds include first bond-pads (e.g., 124) in the first IC die and second bond-pads (e.g., 308) in the second IC die (e.g., FIG. 3B), the first IC die comprises a substrate (e.g., 110, 112) attached to a metallization stack (e.g., 102) along a planar interface (e.g., 108) that is orthogonal to the first surface (e.g., 104), the metallization stack comprises a plurality of layers (e.g., 118) of conductive traces (e.g., 120) in a dielectric material (e.g., 116), and the first bond-pads comprise portions of the conductive traces exposed on the first surface.

Example 22 provides the microelectronic assembly of example 21, in which (e.g., FIG. 5) an area of the second surface of the second IC die is approximately 850 square millimeters.

Example 23 provides the microelectronic assembly of any one of examples 21-22, further comprising (e.g., FIG. 11): another dielectric material (e.g., 1102) around the first IC die, the another dielectric material in contact with the second surface of the second IC die.

Example 24 provides the microelectronic assembly of example 23, in which the another dielectric material comprises an organic polymer with thermally conductive fillers.

Example 25 provides the microelectronic assembly of any one of examples 21-24, in which the substrate of the first IC die is in contact with the second surface of the second IC die.

Example 26 provides the microelectronic assembly of any one of examples 21-25, in which the substrate of the first IC die comprises at least one of a transistor and a diode.

Example 27 provides the microelectronic assembly of any one of examples 21-26, in which the first bond-pads comprise portions of the conductive traces exposed on the first surface.

Example 28 provides the microelectronic assembly of any one of examples 21-27, in which the interconnects have a pitch of less than 10 micrometers between adjacent interconnects.

Example 29 provides the microelectronic assembly of any one of examples 21-28, in which (e.g., FIG. 3C): the substrate is a first substrate, the metallization stack is a first metallization stack, and the dielectric material is a first dielectric material, the second IC die comprises a second metallization stack (e.g., 314) and a second substrate (e.g., 316, 318), the second substrate is attached to the second metallization stack along another planar interface (e.g., 320) that is parallel to the second surface (e.g., 306), and the second metallization stack comprises conductive traces (e.g., 322) in a second dielectric material (e.g., 310), the conductive traces coupled by conductive vias (e.g., 324) to the second bond-pads (e.g., 308).

Example 30 provides the microelectronic assembly of example 29, in which the dielectric-dielectric bonds comprise the first dielectric material of the first IC die and the second dielectric material of the second IC die.

Example 31 provides the microelectronic assembly of any one of examples 29-30, in which the first dielectric material and the second dielectric material comprise a compound including silicon and oxygen.

Example 32 provides the microelectronic assembly of any one of examples 29-31, in which the second substrate comprises at least one of a transistor and a diode.

Example 33 provides the microelectronic assembly of any one of examples 29-31, in which the second substrate does not comprise any transistor or diode.

Example 34 provides the microelectronic assembly of any one of examples 21-33, in which (e.g., FIG. 3D): the substrate is a first substrate, the metallization stack is a first metallization stack, the conductive traces are first conductive traces, and the dielectric material is a first dielectric material, the second IC die comprises a second metallization stack (e.g., 314), a second substrate (e.g., 316, 318), the second substrate is attached to the second metallization stack along another planar interface (e.g., 320) that is parallel to the second surface (e.g., 306), the second IC die further comprises at least one interface layer (e.g., 326) on a side of the second substrate opposite to the second metallization stack, the interface layer comprising the second bond-pads in a layer of a second dielectric material (e.g., 328), and the second metallization stack comprises second conductive traces (e.g., 322) in a third dielectric material (e.g., 310), the second conductive traces coupled by conductive vias (e.g., 324).

Example 35 provides the microelectronic assembly of example 34, in which the second IC die further comprises TSVs (e.g., 330) in the second substrate between the interface layer and the second metallization stack.

Example 36 provides the microelectronic assembly of example 35, in which the TSVs conductively couple the second bond-pads with the second conductive traces in the second metallization stack.

Example 37 provides the microelectronic assembly of example 21, further comprising (e.g., FIG. 3A) a plurality of the first IC dies coupled to the second IC die along respective first surfaces of the first IC dies, in which: each first IC die comprises a respective substrate attached to a respective metallization stack along a respective planar interface, and the respective planar interface is orthogonal to the respective first surface.

Example 38 provides the microelectronic assembly of example 37, in which (e.g., FIG. 3A): the planar interface is a first planar interface, at least two first IC dies (e.g., 100(1), 100(2)) in the plurality of IC dies are in contact with each other along a second planar interface orthogonal to the first surface, the at least two first IC dies in contact are bonded at least by dielectric-dielectric bonds along the second planar interface.

Example 39 provides the microelectronic assembly of example 38, in which the at least two first IC dies are further bonded by metal-metal bonds along the second planar interface.

Example 40 provides the microelectronic assembly of example 39, in which: the respective metallization stack of one of the at least two first IC dies is in contact with the respective substrate of the other one of the at least two first IC dies along the second planar interface, the respective substrate of the other one of the at least two first IC dies comprises TSVs (e.g., 202), and the TSVs are in conductive contact with the metal-metal bonds along the second planar interface.

Example 41 provides the microelectronic assembly of example 39, in which: the respective metallization stack of one of the at least two first IC dies is in contact with the respective metallization stack of the other one of the at least two first IC dies along the second planar interface, and the respective conductive traces in the at least two IC dies are in conductive contact through the metal-metal bonds along the second planar interface.

Example 42 provides the microelectronic assembly of example 38, in which: the respective substrate of one of the at least two first IC dies is in contact with the respective substrate of the other one of the at least two first IC dies along the second planar interface.

Example 43 provides the microelectronic assembly of any one of examples 37-42, in which (e.g., FIG. 11): the first IC dies in the plurality of the first IC dies are mutually parallel and spaced apart from each other, the microelectronic assembly further comprises another dielectric material (e.g., 1102) encapsulating the plurality of the first IC dies, and the another dielectric material is in spaces between adjacent ones of the first IC dies.

Example 44 provides the microelectronic assembly of any one of examples 37-42, in which (e.g., FIG. 3A): the first IC dies in the plurality of the first IC dies are mutually parallel, and a gap (e.g., 312) is present between adjacent ones of the first IC dies.

Example 45 provides the microelectronic assembly of example 44, in which the gap is uniform across the microelectronic assembly.

Example 46 provides the microelectronic assembly of example 44, in which the gap is non-uniform across the microelectronic assembly with some of the first IC dies being closer together than others of the first IC dies.

Example 47 provides the microelectronic assembly of any one of examples 44-46, in which the gap is configured for flow of a cooling fluid through the gap.

Example 48 provides the microelectronic assembly of example 47, in which the cooling fluid is air.

Example 49 provides the microelectronic assembly of example 47, in which the cooling fluid is a liquid coolant.

Example 50 provides the microelectronic assembly of any one of examples 47-49, in which the plurality of first IC dies comprise circuitry configured to consume electrical power and generate heat during operation.

Example 51 provides the microelectronic assembly of any one of examples 21-50, further comprising (e.g., FIG. 4) a stack of the second IC dies, the first IC dies being attached to a topmost one of the stack of second IC dies.

Example 52 provides the microelectronic assembly of any one of examples 37-51, in which (e.g., FIG. 5) the plurality of the first IC dies is arranged in an array (e.g., 502) of rows and columns.

Example 53 provides the microelectronic assembly of example 52, in which the metallization stack of any one of the first IC dies in any one row or column of the array is proximate to the substrate of an adjacent one of the first IC dies in the same row or column.

Example 54 provides the microelectronic assembly of example 52, in which either the metallization stack or the substrate of adjacent first IC dies in any one row or column of the array face each other.

Example 55 provides the microelectronic assembly of any one of examples 37-54, in which the first IC dies are conductively coupled by conductive pathways in the second IC die.

Example 56 provides the microelectronic assembly of example 21, in which (e.g., FIG. 10): the planar interface is a first planar interface, the interconnects are first interconnects, the first IC die (e.g., 100(1)) has a third surface (e.g., 604) opposite to the first surface (e.g., 104(1)), the microelectronic assembly further comprises: a third IC die (e.g., 302(2)) parallel to the second IC die, the third IC die having a fourth surface (e.g., 1002) and a fifth surface (e.g., 306(2)), the fifth surface being opposite to the fourth surface, the fourth surface being coupled to the third surface of the first IC die by second interconnects; and a fourth IC die parallel to the first IC die, the fourth IC die having a sixth surface (e.g., 104(2)), the sixth surface being coupled to the fifth surface of the third IC die by third interconnects, the second IC die comprises a respective substrate (e.g., 318(1)) attached to a respective metallization stack (e.g., 314(1)) along a second planar interface (e.g., 320(1)) orthogonal to the first planar interface, the third IC die comprises a respective substrate (e.g., 318(2)) attached to a respective metallization stack (e.g., 314(2)) along a third planar interface (e.g., 320(2)) orthogonal to the first planar interface, and the fourth IC die comprises a respective substrate attached to a respective metallization stack along a fourth planar interface parallel to the first planar interface.

Example 57 provides the microelectronic assembly of example 56, in which the second interconnects and the third interconnects comprise dielectric-dielectric bonds.

Example 58 provides the microelectronic assembly of example 57, in which the second interconnects and the third interconnects further comprise metal-metal bonds.

Example 59 provides the microelectronic assembly of example 58, in which the metal-metal bonds of the second interconnects comprise portions of the conductive traces in the metallization stack of the first IC die that are exposed at the third surface.

Example 60 provides the microelectronic assembly of any one of examples 56-59, in which the third IC die further comprises TSVs (e.g., 330) through the respective substrate of the third IC die.

Example 61 provides the microelectronic assembly of any one of examples 56-60, further comprising (e.g., FIG. 10): a first plurality of the first IC dies coupled to the second surface of the second IC die along respective first surfaces of the first IC dies, the first plurality of the first IC dies also coupled to the fourth surface of the third IC die along respective third surfaces of the first IC dies; and a second plurality of the fourth IC dies coupled to the fifth surface of the third IC die along respective sixth surfaces of the fourth IC dies, in which: each first IC die comprises a respective substrate attached to a respective metallization stack along a respective planar interface orthogonal to the respective first surface, and each fourth IC die comprises a respective substrate attached to a respective metallization stack along a respective planar interface orthogonal to the respective sixth surface.

Example 62 provides the microelectronic assembly of any one of examples 56-61, in which: the first IC dies in the first plurality of the first IC dies are mutually parallel and spaced apart from each other, and the fourth IC dies in the second plurality of the fourth IC dies are mutually parallel and spaced apart from each other.

Example 63 provides the microelectronic assembly of example 62, further comprising (e.g., FIG. 12) another dielectric material (e.g., 1102) encapsulating the first plurality of the first IC dies and the second plurality of the second IC dies, in which the another dielectric material is in spaces between adjacent ones of the first IC dies and in spaces between adjacent ones of the fourth IC dies.

Example 64 provides a microelectronic assembly (e.g., FIG. 7, FIG. 8), comprising: a first IC die (e.g., 100(1)) having a surface (e.g., 104, 114), the first IC die comprising a first region (e.g., 102(1)) and a second region (e.g., 110(1)), the second region attached to the first region along a first planar interface orthogonal to the surface; and a second IC die (e.g., 100(2)) coupled to the first IC die on the surface, the second IC die comprising a third region and a fourth region, the fourth region attached to the third region along a second planar interface orthogonal to the surface, in which: the first region and the third region comprise respective metallization stacks with conductive traces orthogonal to the surface, and the second region and the fourth region comprise respective substrates having active circuitry proximate and parallel to the respective planar interfaces.

Example 65 provides the microelectronic assembly of example 64, in which: the second IC die is coupled to the first IC die on the surface by metal-metal bonds and dielectric-dielectric bonds (e.g., 104) the metal-metal bonds comprise portions of the respective conductive traces of the first IC die and the second IC die.

Example 66 provides the microelectronic assembly of example 64, in which the second IC die is coupled to the first IC die on the surface by dielectric-dielectric bonds (e.g., 604).

Example 67 provides the microelectronic assembly of any one of examples 64-66, in which (e.g., FIG. 8): the surface is a first surface (e.g., 604), the first IC die has a second surface (e.g., 104) opposite to the first surface, and the microelectronic assembly further comprises a third IC die (e.g., 302), a third surface (e.g., 306) of the third IC die being coupled to the second surface of the first IC die.

Example 68 provides the microelectronic assembly of example 67, in which the third IC die comprises a respective substrate (e.g., 318) attached to a respective metallization stack (e.g., 314) along a third planar interface (e.g., 320) parallel to the first surface and the second surface.

Example 69 provides the microelectronic assembly of any one of examples 67-68 (e.g., FIG. 8), in which the first IC die and the second IC die together is a stack of IC dies, and the microelectronic assembly further comprises a plurality of the stack of IC dies arranged in mutually parallel rows and columns and coupled to the third surface of the third IC die.

Example 70 provides the microelectronic assembly of example 67, in which (e.g., FIG. 9): the second IC die has a fourth surface (e.g., 104(2)) opposite to the first surface (e.g., 604), and the microelectronic assembly further comprises a fourth IC die (e.g., 302(2)) parallel to the third IC die (e.g., 302(1)), a fifth surface (e.g., 306(2)) of the fourth IC die being coupled to the fourth surface of the second IC die.

Example 71 provides the microelectronic assembly of example 70, in which (e.g., FIG. 9) the first IC die and the second IC die together is a stack of IC dies, and the microelectronic assembly further comprises a plurality of the stack of IC dies arranged in mutually parallel rows and columns, each stack of IC dies being coupled to the third surface of the third IC die and the fifth surface of the fourth IC die.

Example 72 provides the microelectronic assembly of example 71, in which (e.g., FIG. 13): the stack of IC dies in the plurality of the stack of IC dies are mutually parallel and spaced apart from each other, the microelectronic assembly further comprises another dielectric material (e.g., 1102) encapsulating the plurality of the stack of IC dies, and the another dielectric material is in spaces between adjacent ones of the stack of IC dies.

Example 73 provides a method of fabricating an IC die with planarized edges, comprising (e.g., FIG. 14): providing a first carrier (e.g., 1402) with a wafer (e.g., 1404) bonded thereto, the wafer comprising a plurality of IC dies fabricated thereon, each IC die comprising a substrate attached to a metallization stack along a planar interface, the metallization stack comprising conductive traces parallel to the planar interface, each IC die being as wide and as long as any other IC die in the wafer; positioning the first carrier with the wafer horizontally such that the first carrier is beneath the wafer and a surface (e.g., 1412) of the wafer opposite to the first carrier is facing upwards; forming an interface layer (e.g., 1414) on the surface of the wafer opposite to the first carrier, the interface layer comprising a material (e.g., 1418) including silicon and oxygen; attaching another wafer to the interface layer; repeating forming the interface layer and attaching another wafer until a desired height is obtained over the first carrier; attaching a second carrier on a surface of the topmost wafer opposite to the first carrier; singulating vertically to form a plurality of stacks along surfaces of the IC dies configured to have bond-pads, the surfaces configured to have bond-pads being orthogonal to interfaces between adjacent wafers in the stack, such that each stack is as wide or as long as any one IC die; rotating each stack by ninety degrees such that the first carrier and the second carrier are oriented vertically and the interfaces between adjacent wafers are vertical; attaching the plurality of the stacks to a horizontal bonding surface of a third carrier such that the interfaces between adjacent wafers are orthogonal to the bonding surface of the third carrier; depositing a dielectric material around the plurality of stacks over the bonding surface of the third carrier such that a continuous horizontal surface is exposed opposite to the third carrier; planarizing the continuous horizontal surface to expose bond-pads of the IC dies in the wafer, each bond-pad comprising a portion of respective conductive traces; removing the dielectric material; and separating IC dies from each stack.

Example 74 provides the method of example 73, in which the interface layer further comprises metal bond-pads (e.g., 1416).

Example 75 provides the method of any one of examples 73-74, in which: the stacks are first stacks, each first stack is as wide as any one IC die, each first stack is longer than any one IC die, and the method further comprises, after planarizing the continuous horizontal surface, singulating the first stacks into second stacks, each second stack being as long as any one IC die.

Example 76 provides the method of any one of examples 73-75, in which providing the first carrier with the wafer bonded thereto comprises: forming a layer (e.g., 1406) comprising silicon and oxygen on the first carrier; and bonding the wafer to the layer comprising silicon and oxygen.

Example 77 provides the method of any one of examples 73-76, further comprising, before forming the interface layer, planarizing the surface of the wafer opposite to the carrier.

Example 78 provides the method of example 77, in which at least one wafer has thickness ranging between 700 micrometers and 800 micrometers before planarizing, and between 50 micrometers and 100 micrometers after planarizing.

Example 79 provides the method of any one of examples 77-78, in which at least one of the IC dies comprises TSVs through the respective substrate, and the planarizing is performed until a surface of the TSVs is exposed on the wafer.

Example 80 provides the method of any one of examples 73-79, in which: the dielectric material comprises an organic polymer, and removing the dielectric material comprises etching with a cleansing agent.

Example 81 provides the method of any one of examples 73-80, in which separating IC dies from each stack comprises: releasing the wafers from the first carrier and the second carrier, and debonding each IC die from the interface layers between wafers by CMP of each interface layer.

Example 82 provides the method of any one of examples 73-81, in which the wafers are not conductively connected to each other.

Example 83 provides the method of any one of examples 73-82, in which a subset of the interface layers comprises metal bond-pads such that wafers adjacent to the subset of the interface layers are conductively connected to each other by the metal bond-pads.

Example 84 provides the method of any one of examples 73-83, in which a number of wafers in each stack ranges between 5 and 10.

Example 85 provides the method of any one of examples 73-84, in which planarizing the continuous horizontal surface comprises CMP.

Example 86 provides the method of any one of examples 73-85, in which any one IC die is not more than 5 millimeters wide and not more than 35 millimeters long.

Example 87 provides an IC die (e.g., 100, FIG. 1B), comprising: a first region (e.g., 102A) having a first surface (e.g., 104A) and a second surface (e.g., 106), the first surface being orthogonal to the second surface; a second region (e.g., 110) attached to the first region along a first planar interface (e.g., 108A) that is orthogonal to the first surface and parallel to the second surface, the second region having a third surface (e.g., 114) coplanar with the first surface; and a third region (e.g., 102B) attached to the second region along a second planar interface (e.g., 108B) that is parallel to the first planar interface, the third region having a fourth surface (e.g., 104B), the fourth surface being coplanar with the first surface and the third surface; in which: the first region and the third region comprise: a dielectric material (e.g., 116); a plurality of layers of conductive traces (e.g., 120A, 1206) in the dielectric material, each layer of the conductive traces being parallel to the second surface such that the conductive traces are orthogonal to the first surface; conductive vias (e.g., 122A, 122B) through the dielectric material, the conductive vias being orthogonal to the conductive traces; and bond-pads on the first surface and the fourth surface, the bond-pads comprising portions of the respective conductive traces exposed on the first surface and the fourth surface, and the second region comprises a material different from the dielectric material.

Example 88 provides the IC die of exaample 87, further comprising a TSV (e.g., 202) in the second region.

Example 89 provides the IC die of exaample 88, in which the TSV conductively couples the first plurality of conductive traces and the second plurality of conductive traces.

Example 90 provides the IC die of any one of examples 87-89 , in which: the plurality of conductive traces in the first region comprises a first plurality of conductive traces, the plurality of conductive traces in the second region comprises a second plurality of conductive traces, and at least one conductive trace in the first plurality of conductive traces is thinner than at least another conductive trace in the second plurality of conductive traces.

Example 91 provides the IC die of any one of examples 87-90, in which the second region comprises active circuitry proximate to the first planar interface.

Example 92 provides the IC die of any one of examples 87-90, in which the second region comprises active circuitry proximate to the second planar interface.

Example 93 provides the IC die of any one of examples 87-92, in which the first surface is flat and planar with surface roughness less than 10 Angstroms and TTV across the first surface of less than 3 micrometers.

Example 94 provides a microelectronic assembly (e.g., 300, FIG. 3E), comprising: a first IC die (e.g., 100) coupled to a second IC die (e.g., 302) by interconnects (e.g., 304) on a first surface (e.g., 104) of the first IC die and a second surface (e.g., 306) of the second IC die such that the first surface is in contact with the second surface, in which: the interconnects comprise dielectric-dielectric bonds and metal-metal bonds, the metal-metal bonds include first bond-pads in the first IC die and second bond-pads in the second IC die, the first IC die comprises a substrate (e.g., 110) between metallization stacks (e.g., 102A, 102B), the metallization stacks are attached to the substrate on opposing planar interfaces (e.g., 108A, 108B), the planar interfaces are orthogonal to the first surface, the metallization stacks comprise respective pluralities of layers of conductive traces (e.g., 120A, 120B) in a dielectric material, and the first bond-pads comprise portions of the conductive traces exposed on the first surface.

Example 95 provides the microelectronic assembly of example 94, in which: the plurality of conductive traces in one of the metallization stacks comprises a first plurality of conductive traces, the plurality of conductive traces in the other one of the metallization stacks comprises a second plurality of conductive traces, and at least one conductive trace in the first plurality of conductive traces is thinner than at least another conductive trace in the second plurality of conductive traces.

Example 96 provides the microelectronic assembly of example 94, further comprising: another dielectric material around the first IC die, the another dielectric material in contact with the second surface of the second IC die.

Example 97 provides the microelectronic assembly of exaample 96, in which the another dielectric material comprises an organic polymer with thermally conductive fillers.

Example 98 provides the microelectronic assembly of any one of exaamples 94-97, in which: the substrate of the first IC die is a first substrate, the metallization stacks of the first IC die are first metallization stacks, and the dielectric material is a first dielectric material, the second IC die comprises a second metallization stack and a second substrate, the second substrate is attached to the second metallization stack along another planar interface that is parallel to the second surface, and the second metallization stack comprises conductive traces in a second dielectric material, the conductive traces coupled by conductive vias to the second bond-pads.

Example 99 provides the microelectronic assembly of any one of examples 94-98, further comprising a plurality of the first IC dies coupled to the second IC die along respective first surfaces of the first IC dies, in which (e.g., FIG. 3E): each first IC die comprises a respective substrate attached to respective metallization stacks along respective planar interfaces on either side of the substrate, and the respective planar interfaces are orthogonal to the respective first surface.

Example 100 provides the microelectronic assembly of example 99, in which (e.g., FIG. 3E) the first IC dies in the plurality of the first IC dies are mutually parallel and spaced apart from each other (e.g., gap 312).

Example 101 provides the microelectronic assembly of example 100, further comprising (e.g., FIG. 11A) another dielectric material encapsulating the plurality of the first IC dies, and the another dielectric material is in spaces between adjacent ones of the first IC dies.

Example 102 provides the microelectronic assembly of any one of examples 99-101, in which (e.g., FIG. 5C) the plurality of the first IC dies is arranged in an array of rows and columns.

Example 103 provides the microelectronic assembly of any one of examples 99-102, in which the first IC dies are conductively coupled by conductive pathways in the second IC die.

Example 104 provides the microelectronic assembly of example 94, in which (e.g., FIG. 10B): the planar interfaces are first planar interfaces, the interconnects are first interconnects, the first IC die has a third surface opposite to the first surface, the microelectronic assembly further comprises: a third IC die parallel to the second IC die, the third IC die having a fourth surface and a fifth surface, the fifth surface being opposite to the fourth surface, the fourth surface being coupled to the third surface of the first IC die by second interconnects; and a fourth IC die parallel to the first IC die, the fourth IC die having a sixth surface, the sixth surface being coupled to the fifth surface of the third IC die by third interconnects, the second IC die comprises a respective substrate attached to a respective metallization stack along a second planar interface orthogonal to the first planar interfaces, the third IC die comprises a respective substrate attached to a respective metallization stack along a third planar interface orthogonal to the first planar interfaces, and the fourth IC die comprises a respective substrate attached to respective metallization stacks on either side of the substrate along fourth planar interfaces parallel to the first planar interfaces.

Example 105 provides the microelectronic assembly of example 104, further comprising (e.g., FIG. 12B) another dielectric material around the first IC die and the fourth IC die.

Example 106 provides a microelectronic assembly (e.g., 300, FIG. 7B), comprising: a first IC die having a surface, the first IC die comprising a first substrate attached to first metallization stacks on either side of the first substrate along respective planar interfaces orthogonal to the surface; and a second IC die coupled to the first IC die on the surface, the second IC die comprising a second substrate attached to second metallization stacks on either side of the second substrate along respective planar interfaces orthogonal to the surface, in which: the first metallization stacks and the second metallization stacks comprise respective conductive traces orthogonal to the surface, and the first substrate and the second substrate comprise respective active circuitries proximate and parallel to the respective planar interfaces.

Example 107 provides the microelectronic assembly of example 106, in which: the second IC die is coupled to the first IC die on the surface by metal-metal bonds and dielectric-dielectric bonds, and the metal-metal bonds comprise portions of the respective conductive traces of the first IC die and the second IC die.

Example 108 provides the microelectronic assembly of any one of examples 106-107, in which (e.g., FIG. 8B): the surface is a first surface, the first IC die has a second surface opposite to the first surface, and the microelectronic assembly further comprises a third IC die, a third surface of the third IC die being coupled to the second surface of the first IC die.

Example 109 provides the microelectronic assembly of example 108, in which (e.g., FIG. 8B): the first IC die and the second IC die together is a stack of IC dies, and the microelectronic assembly further comprises a plurality of the stack of IC dies arranged in mutually parallel rows and columns and coupled to the third surface of the third IC die.

Example 110 provides the microelectronic assembly of example 108, in which (e.g., FIG. 9B): the second IC die has a fourth surface opposite to the first surface, and the microelectronic assembly further comprises a fourth IC die, the fourth IC die being parallel to the third IC die, a fifth surface of the fourth IC die being coupled to the fourth surface of the second IC die.

Example 111 provides the microelectronic assembly of example 110, in which (e.g., FIG. 9B): the first IC die and the second IC die together is a stack of IC dies, and the microelectronic assembly further comprises a plurality of the stack of IC dies arranged in mutually parallel rows and columns, each stack of IC dies being coupled to the third surface of the third IC die and the fifth surface of the fourth IC die.

Example 112 provides the microelectronic assembly of example 111, in which (e.g., FIG. 13B): the stack of IC dies in the plurality of the stack of IC dies are mutually parallel and spaced apart from each other, the microelectronic assembly further comprises another dielectric material (e.g., 1102) encapsulating the plurality of the stack of IC dies, and the another dielectric material is in spaces between adjacent ones of the stack of IC dies.

Example 113 provides a method of fabricating an IC die with planarized edges, comprising (e.g., FIG. 15): providing a wafer comprising IC dies, each IC die having a substrate with TSVs in the substrate; coupling a first metallization stack to the substrate along a first planar interface; and coupling a second metallization stack to the substrate along a second planar interface parallel to the first planar interface on an opposing side of the substrate.

Example 114 provides the method of examples 113, in which before coupling at least one of the first metallization stack and the second metallization stack to the substrate, the wafer is planarized until a surface of the TSVs is exposed on the wafer.

Example 115 provides the method of any one of examples 113-114, further comprising stacking a plurality of the wafers on a carrier, each wafer coupled to an adjacent wafer by an interface layer, in which the interface layer comprises metal bond-pads and a compound comprising silicon and oxygen.

Example 116 provides the method of example 115, in which the carrier is a first carrier, the method further comprising: attaching a second carrier on a surface of the topmost wafer opposite to the first carrier; singulating vertically to form a plurality of stacks along surfaces of the IC dies configured to have bond-pads, the surfaces configured to have bond-pads being orthogonal to interfaces between adjacent wafers in the stack, such that each stack is as wide or as long as any one IC die; rotating each stack by ninety degrees such that the first carrier and the second carrier are oriented vertically and the interfaces between adjacent wafers are vertical; attaching the plurality of the stacks to a horizontal bonding surface of a third carrier such that the interfaces between adjacent wafers are orthogonal to the bonding surface of the third carrier; depositing a dielectric material around the plurality of stacks over the bonding surface of the third carrier such that a continuous horizontal surface is exposed opposite to the third carrier; planarizing the continuous horizontal surface to expose bond-pads of the IC dies in the wafer, each bond-pad comprising a portion of respective conductive traces; removing the dielectric material; and separating IC dies from each stack.

Example 117 provides the method of example 116, in which: the stacks are first stacks, each first stack is as wide as any one IC die, each first stack is longer than any one IC die, and the method further comprises, after planarizing the continuous horizontal surface, singulating the first stacks into second stacks, each second stack being as long as any one IC die.

The above description of illustrated implementations of the disclosure, including what is described in the abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. An integrated circuit (IC) die, comprising:

a first region having a first surface and a second surface, the first surface being orthogonal to the second surface;

a second region attached to the first region along a first planar interface that is orthogonal to the first surface and parallel to the second surface, the second region having a third surface coplanar with the first surface; and a third region attached to the second region along a second planar interface that is parallel to the first planar interface, the third region having a fourth surface, the fourth surface being coplanar with the first surface and the third surface;

wherein:

the first region and the third region comprise:

a dielectric material;

a plurality of layers of conductive traces in the dielectric material, each layer of the conductive traces being parallel to the second surface such that the conductive traces are orthogonal to the first surface;

conductive vias through the dielectric material, the conductive vias being orthogonal to the conductive traces; and bond-pads on the first surface and the fourth surface, the bond-pads comprising portions of respective conductive traces exposed on the first surface and the fourth surface, and the second region comprises a material different from the dielectric material.

2. The IC die of claim 1, further comprising a through-substrate via (TSV) in the second region.

3. The IC die of claim 2, wherein the TSV conductively couples the first plurality of conductive traces and the second plurality of conductive traces.

4. The IC die of claim 1, wherein:

the plurality of conductive traces in the first region comprises a first plurality of conductive traces, the plurality of conductive traces in the second region comprises a second plurality of conductive traces, and at least one conductive trace in the first plurality of conductive traces is thinner than at least another conductive trace in the second plurality of conductive traces.

5. The IC die of claim 1, wherein the second region comprises active circuitry proximate to the first planar interface.

6. The IC die of claim 1, wherein the first surface is flat and planar with surface roughness less than 10 Angstroms and total thickness variation (TTV) across the first surface of less than 3 micrometers.

7. The IC die of claim 1, wherein the second region comprises active circuitry proximate to the second planar interface.

8. A microelectronic assembly, comprising:

a first IC die coupled to a second IC die by interconnects on a first surface of the first IC die and a second surface of the second IC die such that the first surface is in contact with the second surface, wherein:

the interconnects comprise dielectric-dielectric bonds and metal-metal bonds, the metal-metal bonds include first bond-pads in the first IC die and second bond-pads in the second IC die, the first IC die comprises a substrate between metallization stacks, the metallization stacks are attached to the substrate on opposing planar interf1aces, the planar interfaces are orthogonal to the first surface, the metallization stacks comprise respective pluralities of layers of conductive traces in a dielectric material, and the first bond-pads comprise portions of the conductive traces exposed on the first surface.

9. The microelectronic assembly of claim 8, further comprising:

another dielectric material around the first IC die, the another dielectric material in contact with the second surface of the second IC die.

10. The microelectronic assembly of claim 9, wherein the another dielectric material comprises an organic polymer with thermally conductive fillers.

11. The microelectronic assembly of claim 8, wherein:

the substrate of the first IC die is a first substrate, the metallization stacks of the first IC die are first metallization stacks, and the dielectric material is a first dielectric material, the second IC die comprises a second metallization stack and a second substrate, the second substrate is attached to the second metallization stack along another planar interface that is parallel to the second surface, and the second metallization stack comprises conductive traces in a second dielectric material, the conductive traces coupled by conductive vias to the second bond-pads.

12. The microelectronic assembly of claim 8, further comprising a plurality of the first IC dies coupled to the second IC die along respective first surfaces of the first IC dies, wherein:

each first IC die comprises a respective substrate attached to respective metallization stacks along respective planar interfaces on either side of the substrate, and the respective planar interfaces are orthogonal to the respective first surface.

13. The microelectronic assembly of claim 12, wherein the first IC dies in the plurality of the first IC dies are mutually parallel and spaced apart from each other.

14. The microelectronic assembly of claim 13, further comprising another dielectric material encapsulating the plurality of the first IC dies, wherein the another dielectric material is in spaces between adjacent ones of the first IC dies.

15. The microelectronic assembly of claim 12, wherein the plurality of the first IC dies is arranged in an array of rows and columns.

16. The microelectronic assembly of claim 12, wherein the first IC dies are conductively coupled by conductive pathways in the second IC die.

17. The microelectronic assembly of claim 8, wherein:

the planar interfaces are first planar interfaces, the interconnects are first interconnects, the first IC die has a third surface opposite to the first surface, the microelectronic assembly further comprises:

a third IC die parallel to the second IC die, the third IC die having a fourth surface and a fifth surface, the fifth surface being opposite to the fourth surface, the fourth surface being coupled to the third surface of the first IC die by second interconnects; and a fourth IC die parallel to the first IC die, the fourth IC die having a sixth surface, the sixth surface being coupled to the fifth surface of the third IC die by third interconnects, the second IC die comprises a respective substrate attached to a respective metallization stack along a second planar interface orthogonal to the first planar interfaces, the third IC die comprises a respective substrate attached to a respective metallization stack along a third planar interface orthogonal to the first planar interfaces, and the fourth IC die comprises a respective substrate attached to respective metallization stacks on either side of the substrate along fourth planar interfaces parallel to the first planar interfaces.

18. The microelectronic assembly of claim 17, further comprising another dielectric material around the first IC die and the fourth IC die.

19. A microelectronic assembly, comprising:

a first IC die coupled to a second IC die by interconnects on a first surface of the first IC die and a second surface of the second IC die such that the first surface is in contact with the second surface, wherein:

the interconnects comprise dielectric-dielectric bonds and metal-metal bonds, the metal-metal bonds include first bond-pads in the first IC die and second bond-pads in the second IC die, the first IC die comprises a substrate between metallization stacks, the metallization stacks are attached to the substrate on opposing planar interfaces, the planar interfaces are orthogonal to the first surface, the metallization stacks comprise respective pluralities of layers of conductive traces in a dielectric material, the first bond-pads comprise portions of the conductive traces exposed on the first surface, the plurality of conductive traces in one of the metallization stacks comprises a first plurality of conductive traces, the plurality of conductive traces in an other one of the metallization stacks comprises a second plurality of conductive traces, and at least one conductive trace in the first plurality of conductive traces is thinner than at least another conductive trace in the second plurality of conductive traces.

* * * * *